US009923001B2

(12) United States Patent
Yamazaki

(10) Patent No.: US 9,923,001 B2
(45) Date of Patent: Mar. 20, 2018

(54) SEMICONDUCTOR DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 0 days.

(21) Appl. No.: 15/403,259

(22) Filed: Jan. 11, 2017

(65) Prior Publication Data

US 2017/0207242 A1 Jul. 20, 2017

(30) Foreign Application Priority Data

Jan. 15, 2016 (JP) ................................. 2016-005965

(51) Int. Cl.
*H01L 29/10* (2006.01)
*H01L 27/12* (2006.01)
(Continued)

(52) U.S. Cl.
CPC ........ *H01L 27/127* (2013.01); *H01L 21/0228* (2013.01); *H01L 21/02178* (2013.01);
(Continued)

(58) Field of Classification Search
CPC .......... H01L 27/1207; H01L 21/76852; H01L 23/5329; H01L 23/5223; H01L 21/84; H01L 21/0228; H01L 27/13; H01L 21/28568; H01L 21/02178; H01L 21/28556; H01L 21/8221; H01L 29/7869
USPC .......................................................... 257/43
See application file for complete search history.

(56) References Cited

U.S. PATENT DOCUMENTS 8,183,630 B2 * 5/2012 Batude .................... H01L 27/11
257/296
8,547,771 B2 10/2013 Koyama
(Continued)

FOREIGN PATENT DOCUMENTS

JP 2012-257187 12/2012

*Primary Examiner* — Vu A Vu
(74) *Attorney, Agent, or Firm* — Nixon Peabody LLP; Jeffrey L. Costellia

(57) ABSTRACT

A highly reliable semiconductor device suitable for miniaturization and high integration is provided. The semiconductor device includes a first transistor, a first insulator over the first transistor, a second transistor over the first insulator, a second insulator over the second transistor, and a capacitor over the second insulator. The first insulator has a barrier property against oxygen and hydrogen. The second transistor includes an oxide semiconductor. The second insulator includes an oxygen-excess region. The capacitor includes a first electrode, a second electrode, and a dielectric between the first electrode and the second electrode. The dielectric includes a third insulator having a barrier property against oxygen and hydrogen. The first insulator and the third insulator are in contact with each other on an outer edge of a region where the second transistor is located so that the second transistor and the second insulator are enclosed by the first insulator and the third insulator.

7 Claims, 61 Drawing Sheets

(51) Int. Cl.

| | | |
|---|---|---|
| *H01L 27/13* | (2006.01) | |
| *H01L 23/532* | (2006.01) | |
| *H01L 23/522* | (2006.01) | |
| *H01L 21/84* | (2006.01) | |
| *H01L 21/768* | (2006.01) | |
| *H01L 21/285* | (2006.01) | |
| *H01L 21/02* | (2006.01) | |
| H01L 29/786 | (2006.01) | |
| H01L 21/822 | (2006.01) | |

(52) U.S. Cl.
CPC .. *H01L 21/28556* (2013.01); *H01L 21/28568* (2013.01); *H01L 21/76852* (2013.01); *H01L 21/84* (2013.01); *H01L 23/5223* (2013.01); *H01L 23/5329* (2013.01); *H01L 27/13* (2013.01); *H01L 21/8221* (2013.01); *H01L 29/7869* (2013.01)

(56) References Cited

U.S. PATENT DOCUMENTS

| | | |
|---|---|---|
| 8,995,174 B2 | 3/2015 | Koyama |
| 9,496,376 B2 | 11/2016 | Yamazaki et al. |
| 2013/0161607 A1* | 6/2013 | Yoneda ............... H01L 27/0688 257/43 |
| 2014/0269063 A1* | 9/2014 | Nagatsuka ............ G11C 16/24 365/185.05 |
| 2015/0280691 A1 | 10/2015 | Koyama |
| 2015/0372009 A1 | 12/2015 | Yamazaki |
| 2016/0086792 A1 | 3/2016 | Shimomura et al. |
| 2016/0307777 A1 | 10/2016 | Kurata et al. |
| 2017/0186875 A1 | 6/2017 | Yamazaki |

\* cited by examiner

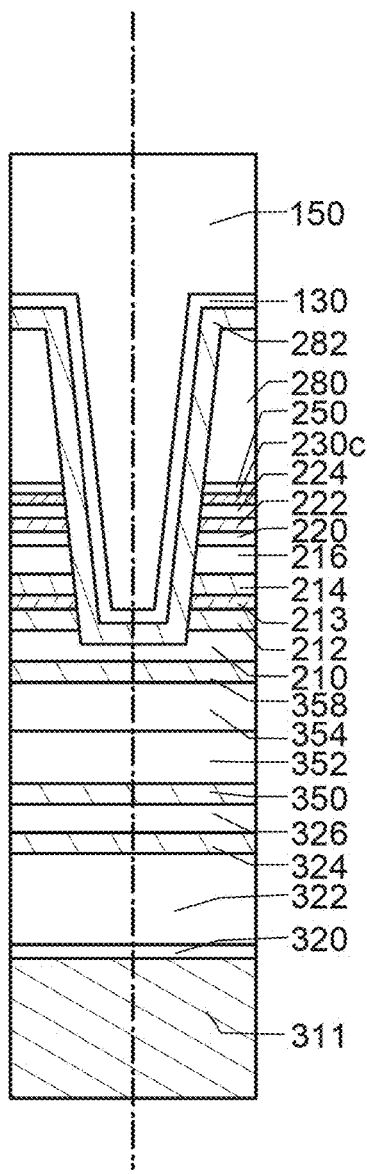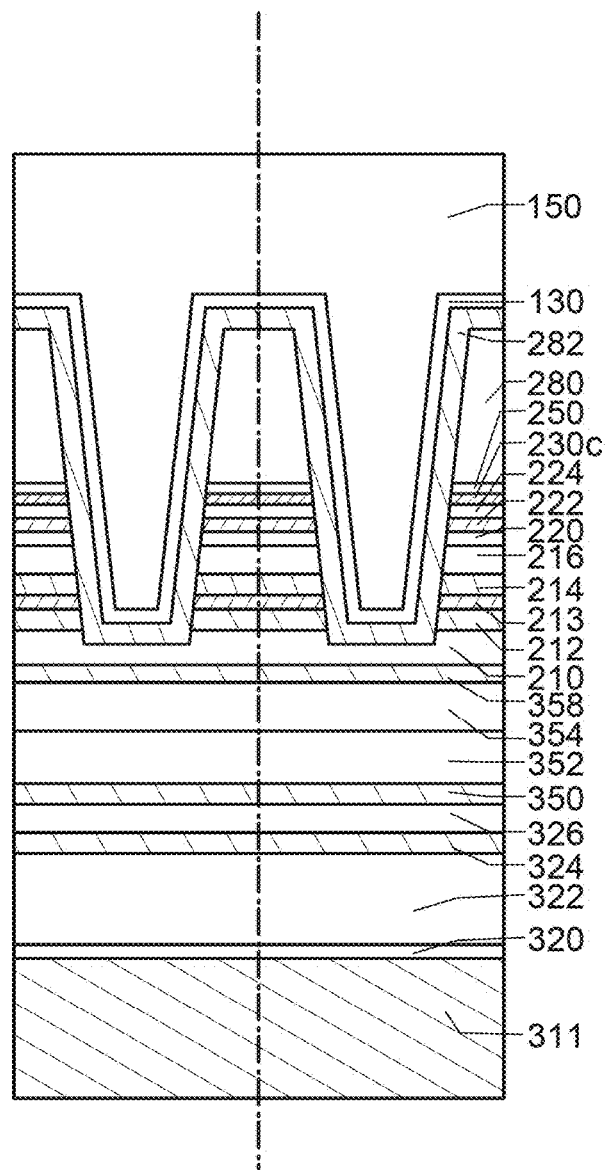

322
320
300
311

318a  316 314  318b
      312

328a       328c    328b

328

244B
244A

FIG. 21A
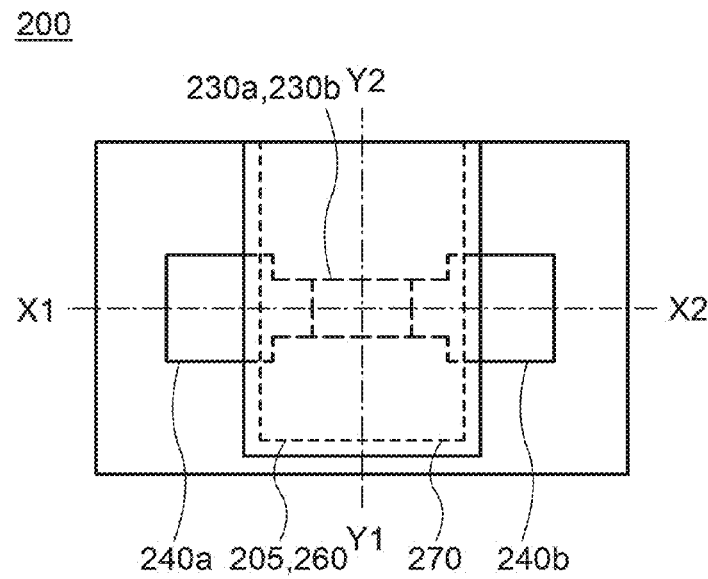
FIG. 21B
FIG. 21C
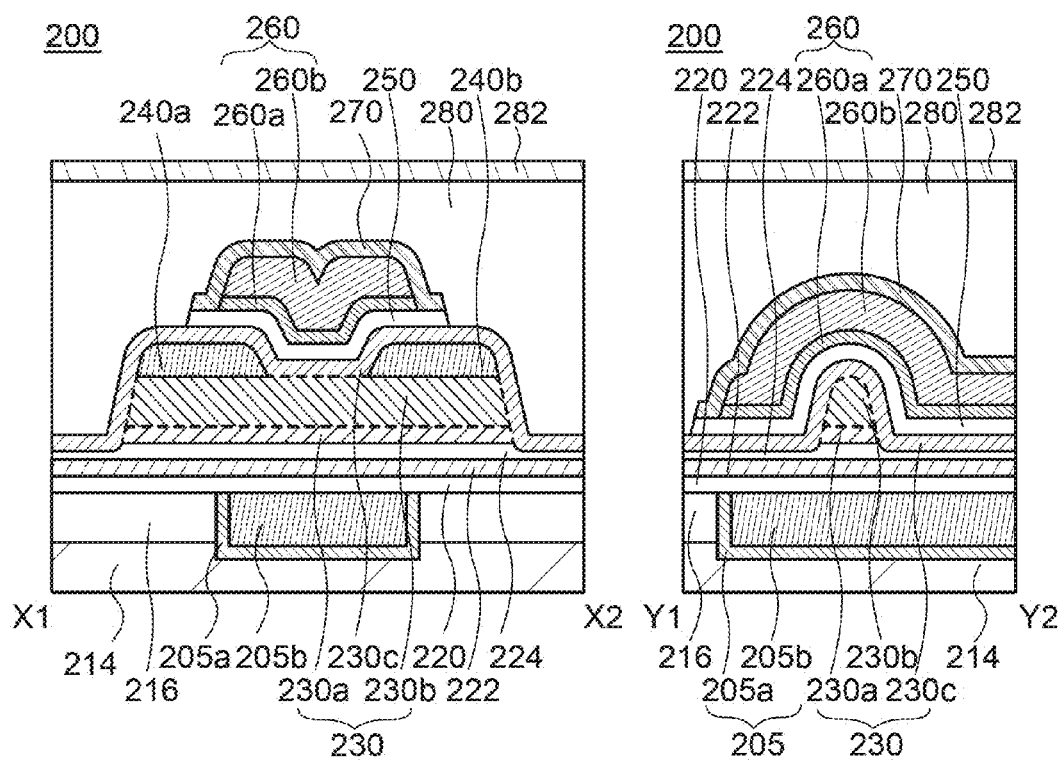

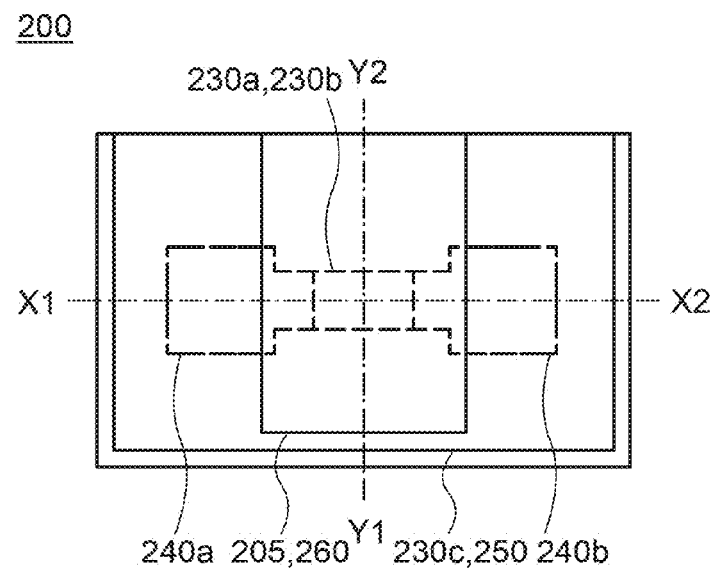
FIG. 22A
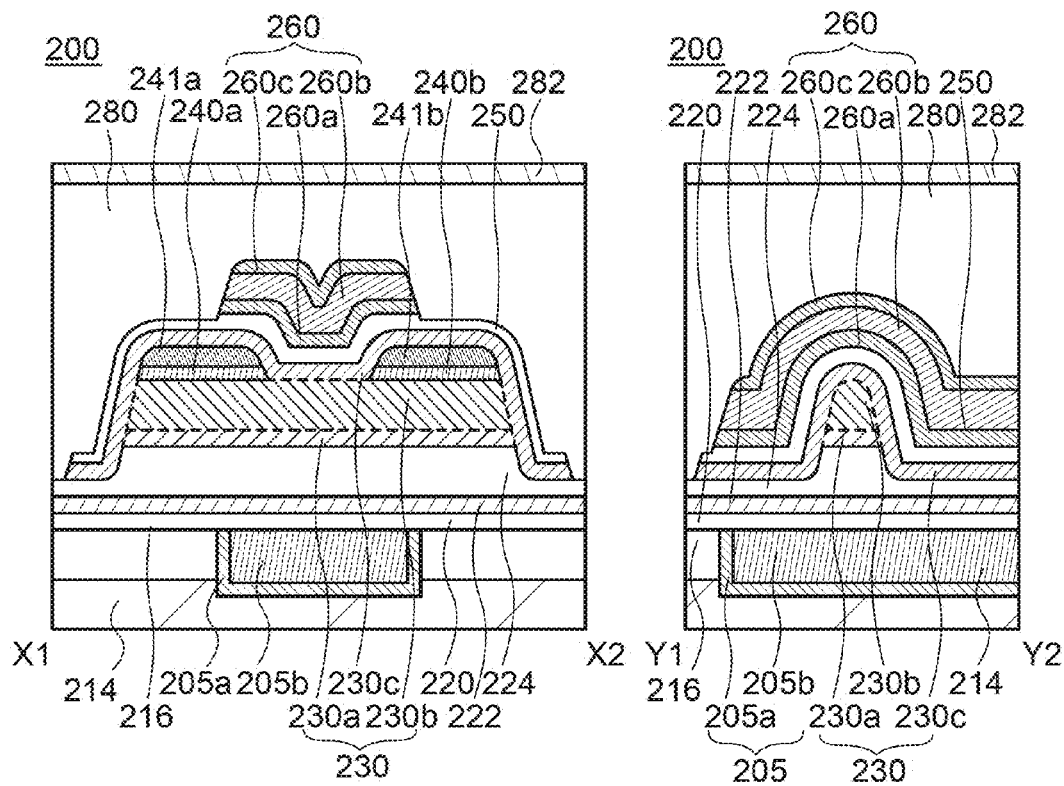
FIG. 22B
FIG. 22C

FIG. 23A
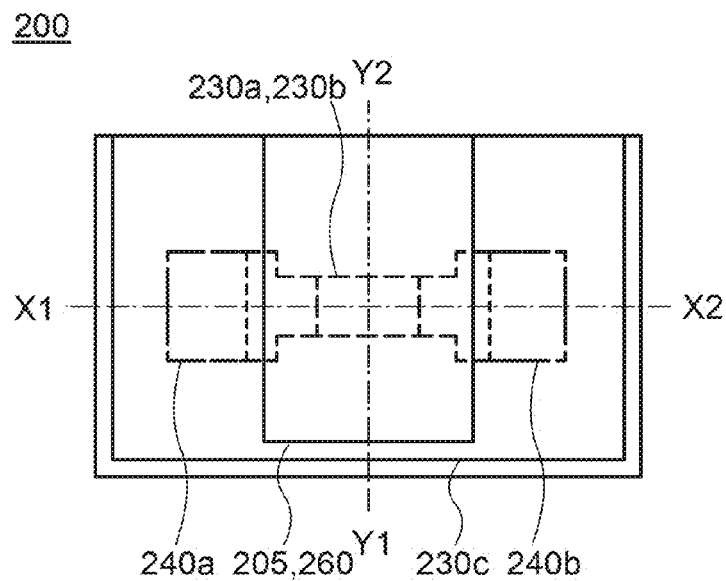
FIG. 23B
FIG. 23C
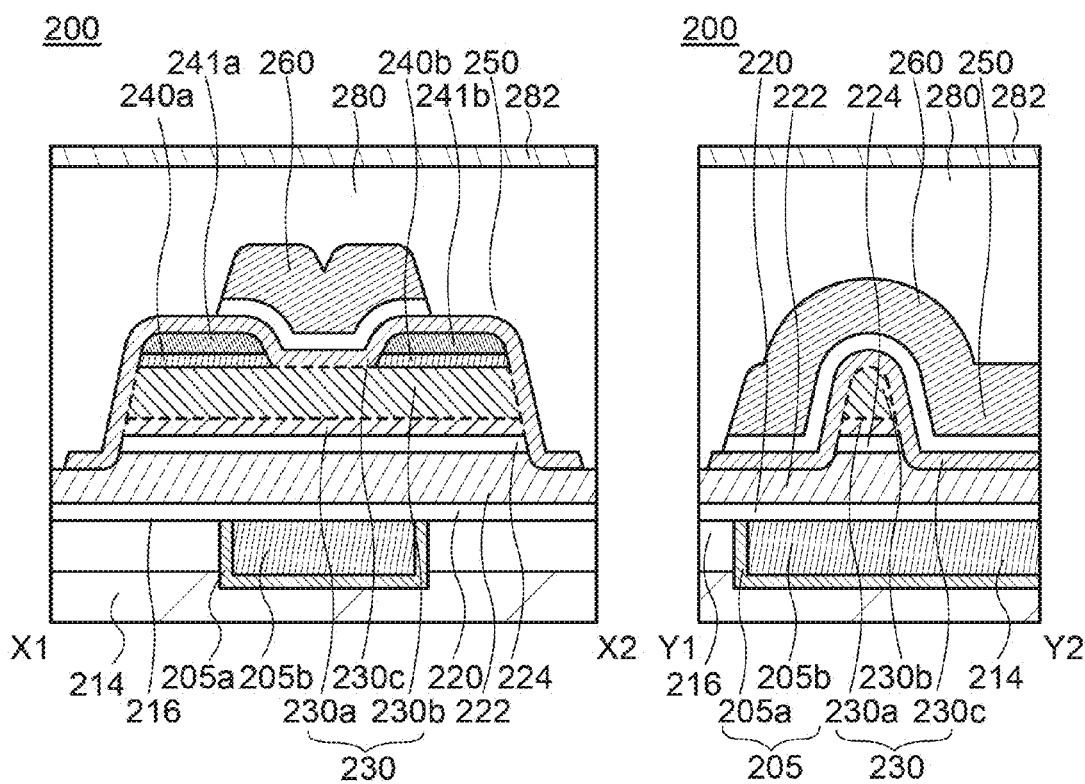

FIG. 24A
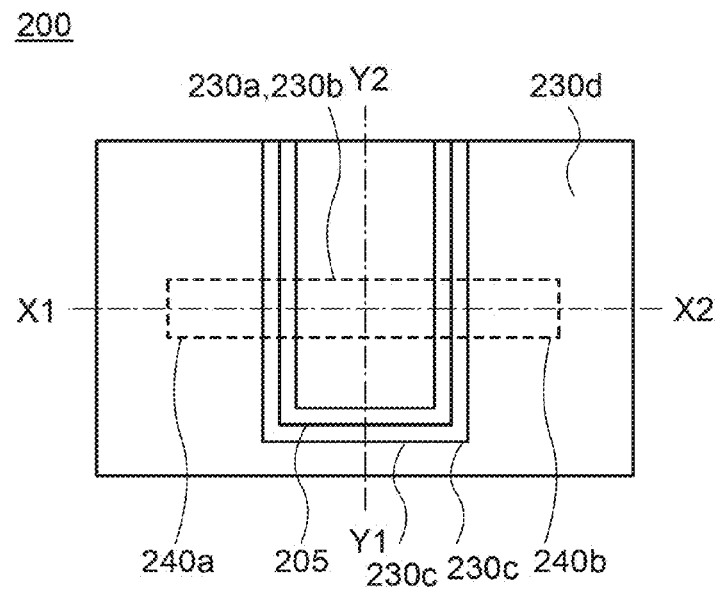
FIG. 24B
FIG. 24C
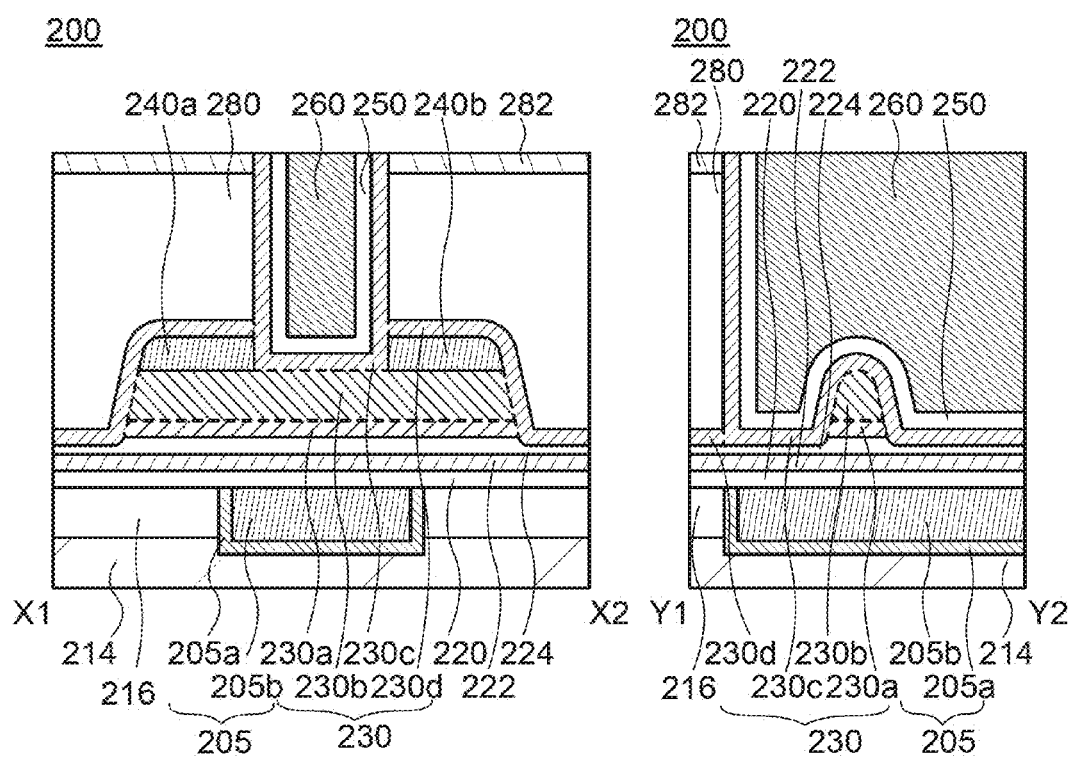

FIG. 25A
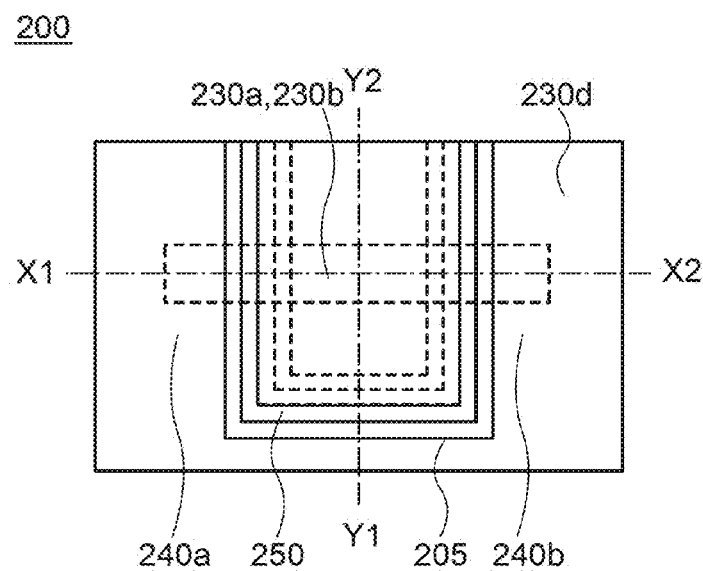
FIG. 25B
FIG. 25C
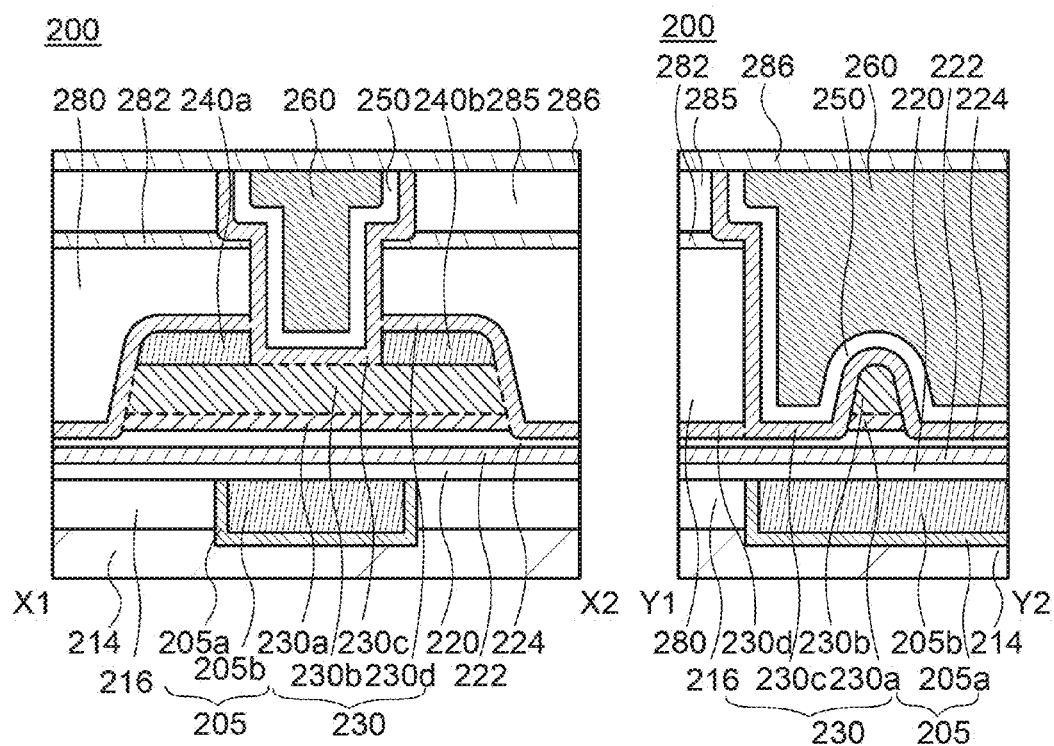

FIG. 26A
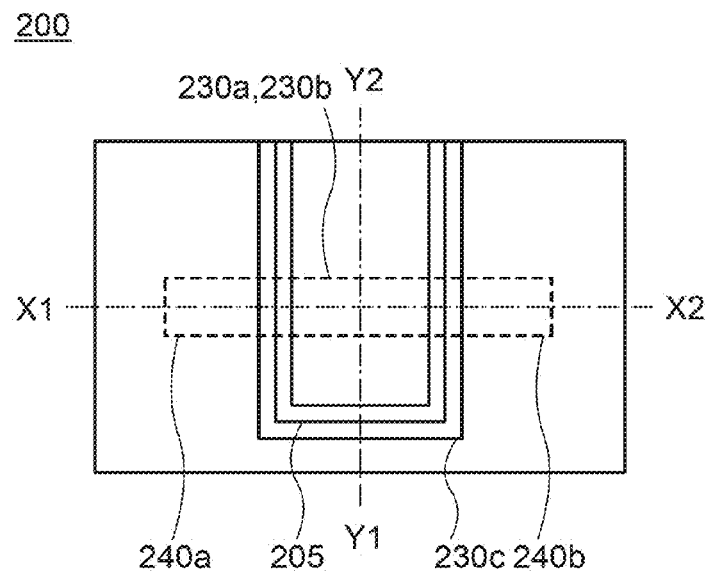
FIG. 26B
FIG. 26C
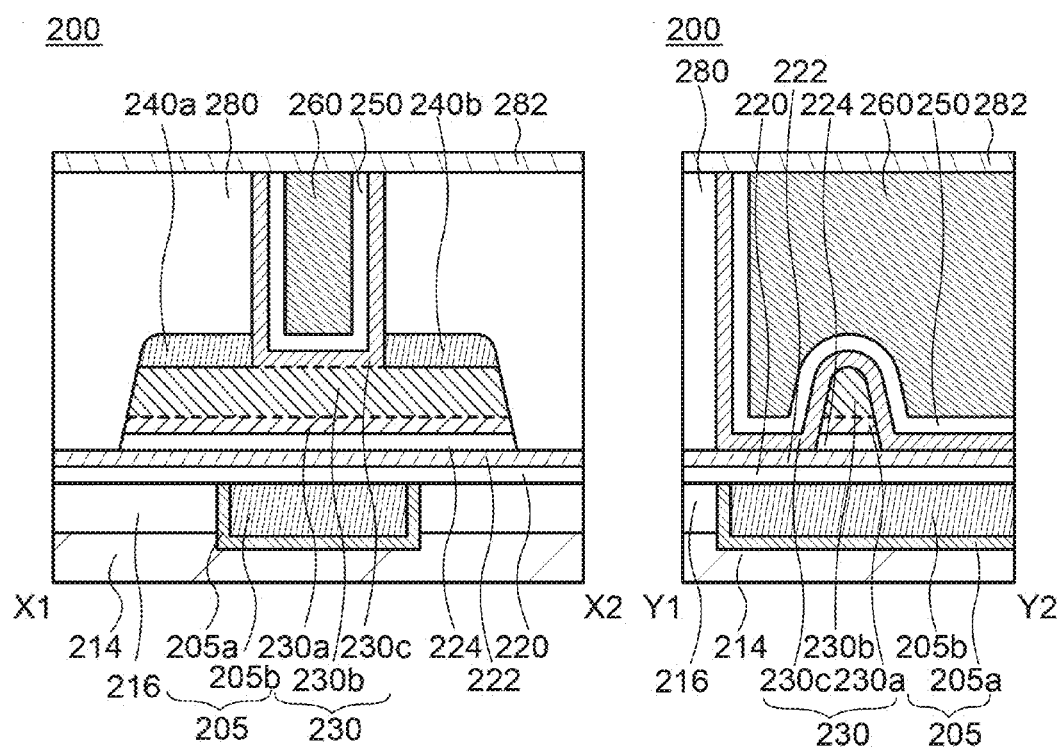

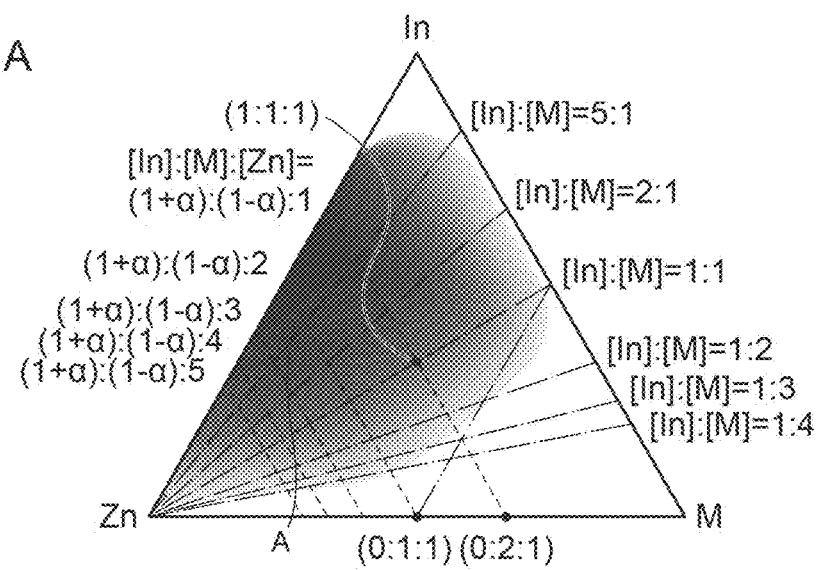
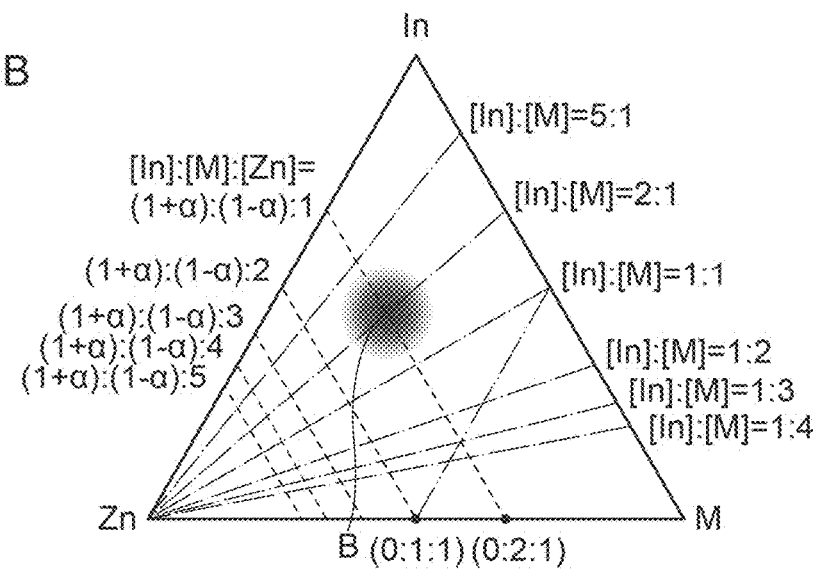
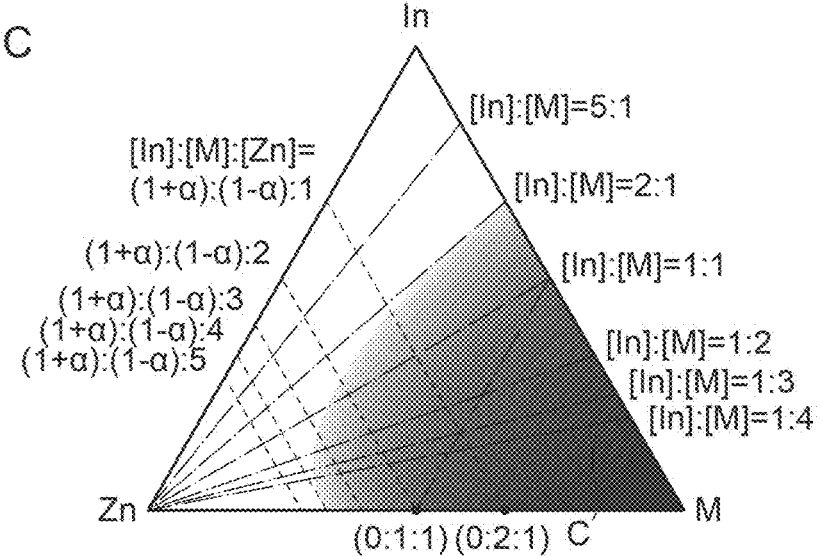
FIG. 31A
FIG. 31B
FIG. 31C

SEMICONDUCTOR DEVICE AND MANUFACTURING METHOD THEREOF

BACKGROUND OF THE INVENTION

1. Field of the Invention

The present invention relates to an object, a method, or a manufacturing method. The present invention relates to a process, a machine, manufacture, or a composition of matter. One embodiment of the present invention relates to a semiconductor device, a light-emitting device, a display device, an electronic device, a lighting device, and a method for fabricating these devices. In particular, one embodiment of the present invention relates to an electronic device that includes, as a component, an LSI, a CPU, a power device mounted in a power circuit, a semiconductor integrated circuit including a memory, a thyristor, a converter, an image sensor, and the like. For example, one embodiment of the present invention relates to a light-emitting device utilizing an organic electroluminescence (hereinafter also referred to as EL) phenomenon, and a method for manufacturing the light-emitting device.

Note that one embodiment of the present invention is not limited to the above technical field.

In this specification, a semiconductor device generally means a device that can function by utilizing semiconductor characteristics. An electro-optical device, a semiconductor circuit, and an electronic device include a semiconductor device in some cases.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a material for a semiconductor thin film applicable to the transistor. As another material, an oxide semiconductor has been attracting attention.

It is known that a transistor including an oxide semiconductor has an extremely low leakage current in an off state. For example, a low-power-consumption CPU utilizing a characteristic of low leakage current of the transistor including an oxide semiconductor has been disclosed (see Patent Document 1).

A transistor including an oxide semiconductor is known to have a problem of low reliability because of high possibility of change in electric characteristics, although the transistor including an oxide semiconductor can be operated at higher speed than a transistor including amorphous silicon and can be manufactured more easily than a transistor including polycrystalline silicon. For example, the threshold voltage of the transistor is changed in some cases after a bias-temperature stress test (BT test).

REFERENCE

Patent Document

[Patent Document 1] Japanese Published Patent Application No. 2012-257187

SUMMARY OF THE INVENTION

An object of one embodiment of the present invention is to improve reliability of a semiconductor device including an oxide semiconductor. There is a problem in that a transistor including an oxide semiconductor tends to have normally-on characteristics and it is difficult to provide a logic circuit which operates properly in a driver circuit. Thus, an object of one embodiment of the present invention is to obtain normally-off characteristics of a transistor including an oxide semiconductor.

Another object is to provide a highly reliable transistor. Another object is to provide a transistor with extremely low leakage current in an off state.

Another object of the present invention is to provide a highly reliable semiconductor device. Another object is to provide a semiconductor device with high productivity. Another object is to provide semiconductor devices with high yield. Another object is to provide a semiconductor device that occupies a small area.

Alternatively, an object is to provide a highly integrated semiconductor device. Another object is to provide a semiconductor device which can operate at high speed. Another object is to provide a semiconductor device with low power consumption.

Another object is to provide a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first transistor, a first insulator over the first transistor, a second transistor over the first insulator, a second insulator over the second transistor, and a capacitor over the second insulator. The first insulator has a barrier property against oxygen and hydrogen. The second transistor includes an oxide semiconductor. The second insulator includes an oxygen-excess region. The capacitor includes a first electrode, a second electrode, and a dielectric between the first electrode and the second electrode. The dielectric includes a third insulator having a barrier property against oxygen and hydrogen. The first insulator and the third insulator are in contact with each other on an outer edge of a region where the second transistor is located so that the second transistor and the second insulator are enclosed by the first insulator and the third insulator.

In the above structure, the first insulator and the third insulator are each aluminum oxide.

A semiconductor wafer includes a plurality of semiconductor devices in the above structure and a region for dicing.

Another embodiment of the present invention is a method for manufacturing a semiconductor device including the steps of forming a first transistor over a substrate; forming a first insulator having a barrier property against oxygen and hydrogen over the first transistor; forming a first conductor over the first insulator; forming a second insulator over the first conductor; forming a third insulator over the second insulator using a high-k material; forming a fourth insulator over the third insulator; forming a first oxide semiconductor over the fourth insulator; forming a second conductor over the first oxide semiconductor; processing the second conductor into an island shape; processing the first oxide semiconductor into an island shape using the second conductor having the island-shape as a mask; processing the second conductor having the island-shape to form a third conductor and a fourth conductor; forming a second oxide semiconductor over the first oxide semiconductor, the third conductor, and the fourth conductor and then performing heat treatment; forming a fifth insulator over the second oxide semiconductor; forming a fifth conductor having an island shape over the fifth insulator to form a second transistor; forming a sixth insulator over the second transistor; forming an opening reaching the second transistor in the sixth insulator; forming a sixth conductor over the opening and the sixth insulator; forming a barrier layer having a barrier property against oxygen and hydrogen over the sixth conductor; performing oxygen plasma treatment on the barrier layer and the sixth insulator and then forming a seventh insulator having a barrier property against oxygen and hydrogen over the barrier layer and the sixth insulator; and forming a seventh conductor in a region overlapping with the sixth conductor through the seventh insulator to form a capacitor.

In the above structure, the barrier layer is tantalum nitride formed by an ALD method.

In the above structure, the barrier layer is aluminum oxide formed by an ALD method.

In the above structure, the seventh conductor is aluminum oxide formed by a sputtering method.

A change in electric characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

Alternatively, a novel semiconductor device can be provided. A module including the semiconductor device can be provided. An electronic device including the semiconductor device or the module can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 7A and 7B illustrate cross-sectional structures of semiconductor devices of an embodiment.

FIG. 21A is a top view of a transistor of an embodiment and FIGS. 21B and 21C illustrate cross-sectional structures of the transistor.

FIG. 22A is a top view of a transistor of an embodiment and FIGS. 22B and 22C illustrate cross-sectional structures of the transistor.

FIG. 23A is a top view of a transistor of an embodiment and FIGS. 23B and 23C illustrate cross-sectional structures of the transistor.

FIG. 24A is a top view of a transistor of an embodiment and FIGS. 24B and 24C illustrate cross-sectional structures of the transistor.

FIG. 25A is a top view of a transistor of an embodiment and FIGS. 25B and 25C illustrate cross-sectional structures of the transistor.

FIG. 26A is a top view of a transistor of an embodiment and FIGS. 26B and 26C illustrate cross-sectional structures of the transistor.

FIGS. 31A to 31C each illustrate an atomic ratio range of an oxide semiconductor of an embodiment of the present invention.

DETAILED DESCRIPTION OF THE INVENTION

Figure 1:
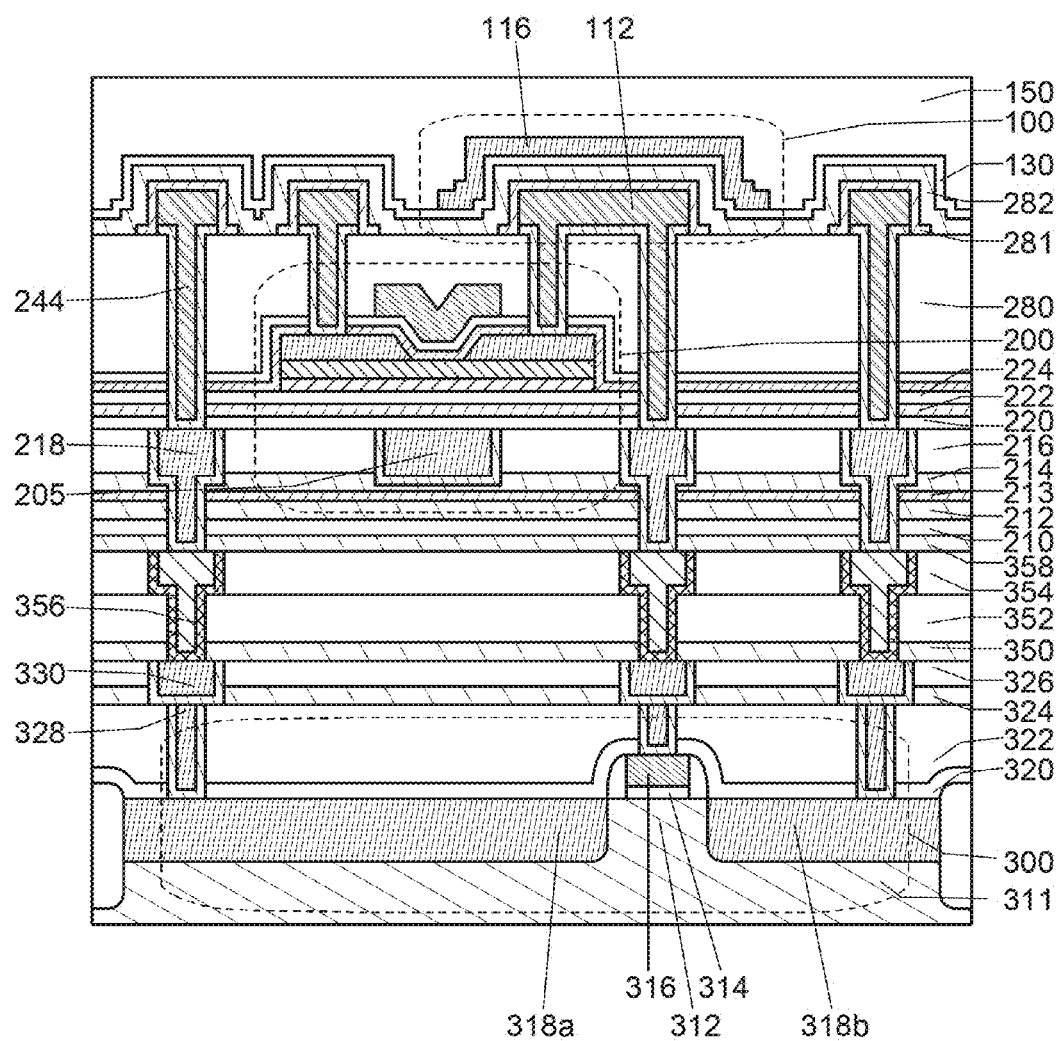
FIG. 1 illustrates a cross-sectional structure of a semiconductor device of an embodiment.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Further, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentration ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The terms "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, one embodiment of a semiconductor device will be described with reference to FIG. 1, FIG. 2, FIG. 3, FIG. 4, FIG. 5, FIGS. 6A and 6B, FIGS. 7A and 7B, FIGS. 8A to 8D, FIGS. 9A to 9C, FIGS. 10A and 10B, FIGS. 11A and 11B, and FIGS. 12A and 12B.

Structure Examples

Examples of a semiconductor device (memory device) including a capacitor of one embodiment of the present invention are illustrated in FIG. 1, FIG. 2, FIG. 3, FIG. 4, FIG. 5, FIGS. 6A and 6B, FIGS. 7A and 7B, and FIGS. 8A to 8D. Note that FIG. 6A is a circuit diagram of FIGS. 1 to 4. FIGS. 7A and 7B illustrate end portions of regions where semiconductor devices illustrated in FIGS. 1 to 4 are formed.

<Circuit Configuration of Semiconductor Device>

Semiconductor devices illustrated in FIG. 6A and FIGS. 1 to 4 each include a transistor 300, a transistor 200, and a capacitor 100.

The transistor 200 is a transistor in which a channel is formed in a semiconductor layer including an oxide semiconductor. Since the off-state current of the transistor 200 is small, by using the transistor 200 in a semiconductor device (memory device), stored data can be retained for a long time. In other words, it is possible to obtain a semiconductor device (memory device) which does not require refresh operation or has an extremely low frequency of the refresh operation, which leads to a sufficient reduction in power consumption.

In FIG. 6A, a wiring 3001 is electrically connected to a source of the transistor 300. A wiring 3002 is electrically connected to a drain of the transistor 300. A wiring 3003 is electrically connected to one of a source and a drain of the transistor 200. A wiring 3004 is electrically connected to a gate of the transistor 200. A gate of the transistor 300 and the other of the source and the drain of the transistor 200 are electrically connected to one electrode of the capacitor 100. A wiring 3005 is electrically connected to the other electrode of the capacitor 100.

The semiconductor device in FIG. 6A has a feature that the potential of the gate of the transistor 300 can be retained, and thus enables writing, retaining, and reading of data as follows.

Writing and retaining of data will be described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained at the node FG (retaining).

In the case where the off-state current of the transistor 200 is low, the electric charge of the node FG is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when the high-level electric charge is given to the gate of the transistor 300 is lower than an apparent threshold voltage $V_{th\_L}$ at the time when the low-level electric charge is given to the gate of the transistor 300. Here, an apparent threshold voltage refers to the potential of the wiring 3005 which is needed to make the transistor 300 be in "on state". Thus, the potential of the wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the wiring 3005 is $V_0$ ($>V_{th\_H}$), the transistor 300 is brought into "on state". On the other hand, in the case where the low-level charge is supplied to the node FG in writing, even when the potential of the wiring 3005 is $V_0$ ($<V_{th\_L}$), the transistor 300 remains in "off state". Thus, the data retained in the node FG can be read by determining the potential of the wiring 3002.

By arranging semiconductor devices each having the structure illustrated in FIG. 6A in a matrix, a memory device (memory cell array) can be formed.

Note that in the case where memory cells are arrayed, it is necessary that data of a desired memory cell be read in read operation. For example, when a p-channel transistor is used as the transistor 300, the memory cell has a NOR-type structure. Thus, only data of a desired memory cell can be read by supplying a potential at which the transistor 300 is in "off state" regardless of the charge supplied to the node FG, that is, a potential lower than $V_{th\_H}$ to the wiring 3005 of memory cells from which data is not read. Alternatively, when an n-channel transistor is used as the transistor 300, the memory cell has a NAND-type structure. Thus, only data of a desired memory cell can be read by supplying a potential at which the transistor 300 is in "on state" regardless of the charge applied to the node FG, that is, a potential higher than $V_{th\_L}$ to the wiring 3005 of memory cells from which data is not read.

<Circuit Configuration 2 of Semiconductor Device>

Figure 6A:
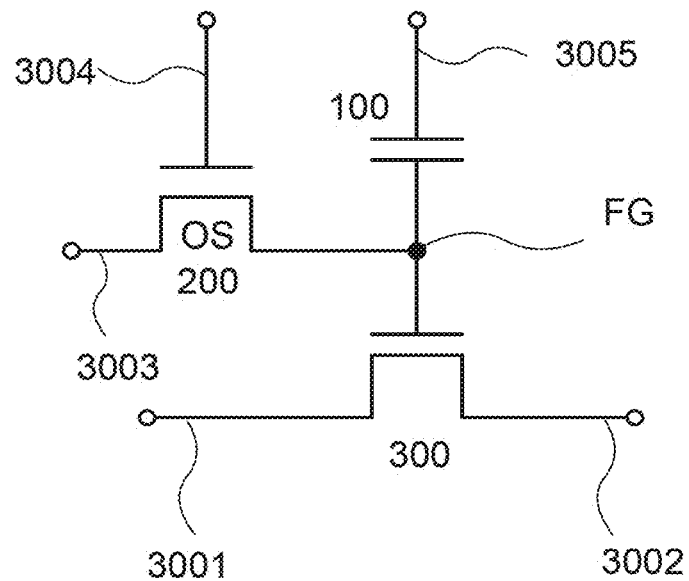
FIGS. 6A and 6B are circuit diagrams of semiconductor devices of an embodiment.
Figure 6B:
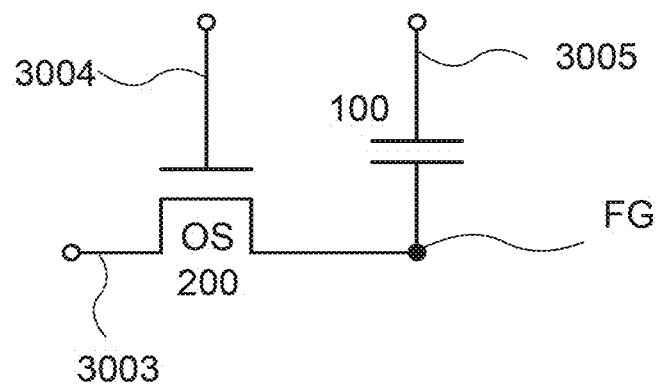

A semiconductor device illustrated in FIG. 6B is different from the semiconductor device in FIG. 6A in that the transistor 300 is not provided. Also in this case, data can be written and retained in a manner similar to that of the semiconductor device in FIG. 6A.

Reading of data in the semiconductor device in FIG. 6B is described. When the transistor 200 is brought into on state, the wiring 3003 which is in a floating state and the capacitor 100 are brought into conduction, and the electric charge is redistributed between the wiring 3003 and the capacitor 100. As a result, the potential of the wiring 3003 is changed. The amount of change in the potential of the wiring 3003 varies depending on the potential of the one electrode of the capacitor 100 (or the electric charge accumulated in the capacitor 100).

For example, the potential of the wiring 3003 after the charge redistribution is $(C_B \times V_{B0} + C \times V)/(C_B + C)$, where V is the potential of the one electrode of the capacitor 100, C is the capacitance of the capacitor 100, $C_B$ is the capacitance component of the wiring 3003, and $V_{B0}$ is the potential of the wiring 3003 before the charge redistribution. Thus, it can be found that, assuming that the memory cell is in either of two states in which the potential of the one electrode of the capacitor 100 is $V_1$ and $V_0$ ($V_1 > V_0$), the potential of the wiring 3003 in the case of retaining the potential $V_1$ (=$(C_B \times V_{B0} + C \times V_1)/(C_B + C)$) is higher than the potential of the wiring 3003 in the case of retaining the potential $V_0$ (=$(C_B \times V_{B0} + C \times V_0)/(C_B + C)$).

Then, by comparing the potential of the wiring 3003 with a predetermined potential, data can be read.

In the case of employing the configuration, for example, a transistor including silicon may be used for a driver circuit for driving a memory cell, and a transistor including an oxide semiconductor may be stacked over the driver circuit as the transistor 200.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device of one embodiment of the present invention does not have a limit on the number of times data can be rewritten, and the reliability thereof is drastically improved. Furthermore, data is written depending on the state of the transistor (on or off), whereby high-speed operation can be achieved.

<Structure 1 of Semiconductor Device>

The semiconductor device of one embodiment of the present invention includes the transistor 300, the transistor 200, and the capacitor 100 as illustrated in FIG. 1. The transistor 200 is provided over the transistor 300, and the capacitor 100 is provided over the transistor 300 and the transistor 200.

The transistor 300 is provided over a substrate 311 and includes a conductor 316, an insulator 314, a semiconductor region 312 that is part of the substrate 311, and low-resistance regions 318a and 318b functioning as a source region and a drain region.

The transistor 300 may be a p-channel transistor or an n-channel transistor.

It is preferable that a region of the semiconductor region 312 where a channel is formed, a region in the vicinity thereof, the low-resistance regions 318a and 318b functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs, GaAlAs, or the like.

The low-resistance regions 318a and 318b contain an element which imparts n-type conductivity, such as arsenic or phosphorus, or an element which imparts p-type conductivity, such as boron, in addition to a semiconductor material used for the semiconductor region 312.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 300 in FIG. 1 is just an example and is not limited to the structure illustrated therein; an appropriate transistor may be used in accordance with a circuit configuration or a driving method. In the case of using the circuit configuration in FIG. 6B, the transistor 300 may be omitted.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, a top surface of the insulator 322 may be planarized by planarization treatment using a chemical mechanical polishing (CMP) method or the like to increase the level of planarity.

The insulator 324 is preferably formed using a film having a barrier property that prevents hydrogen or impurities from diffusing from the substrate 311, the transistor 300, or the like into a region where the transistor 200 is formed.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in TDS analysis in the range of 50° C. to 500° C., for example.

Note that the dielectric constant of the insulator 326 is preferably lower than that of the insulator 324. For example, the relative dielectric constant of the insulator 326 is preferably lower than 4, further preferably lower than 3. For example, the relative dielectric constant of the insulator 324 is preferably 0.7 times or less that of the insulator 326, further preferably 0.6 times or less that of the insulator 326. In the case where a material with a low dielectric constant is used as an interlayer film, the parasitic capacitance between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. A plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 1, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. In such a structure, the transistor 300 and the transistor 200 can be separated by a barrier layer, so that diffusion of hydrogen from the transistor 300 to the transistor 200 can be prevented.

Note that as the conductor having a barrier property against hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

An insulator 358, an insulator 210, an insulator 212, an insulator 213, an insulator 214, and an insulator 216 are stacked sequentially over the insulator 354. A material having a barrier property against oxygen or hydrogen is preferably used for one of the insulator 358, the insulator 210, the insulator 212, the insulator 213, the insulator 214, and the insulator 216.

The insulator 358 and the insulator 212 are preferably formed using, for example, a film having a barrier property that prevents hydrogen or impurities from diffusing from a region where the substrate 311 or the transistor 300 is formed or the like into a region where the transistor 200 is formed. Therefore, the insulator 358 and the insulator 212 can be formed using a material similar to that used for forming the insulator 324.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the insulator 213 and the insulator 214, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

For example, the insulator 210 and the insulator 216 can be formed using a material similar to that used for forming the insulator 320. In the case where a material with a low dielectric constant is used as an interlayer film, the parasitic capacitance between wirings can be reduced. For example, a silicon oxide film, a silicon oxynitride film, or the like can be used as the insulator 216.

A conductor 218, a conductor (a conductor 205) forming the transistor 200, and the like are embedded in the insulator 358, the insulator 210, the insulator 212, the insulator 213, the insulator 214, and the insulator 216. Note that the conductor 218 functions as a plug or a wiring that is electrically connected to the capacitor 100 or the transistor 300. The conductor 218 can be formed using a material similar to that used for forming the conductor 328 and the conductor 330.

In particular, a conductor 218 in a region in contact with the insulator 358, the insulator 212, the insulator 213, and the insulator 214 is preferably a conductor having a barrier property against oxygen, hydrogen, and water. In such a structure, the transistor 300 and the transistor 200 can be completely separated by a layer having a barrier property against oxygen, hydrogen, and water, so that diffusion of hydrogen from the transistor 300 into the transistor 200 can be prevented.

The transistor 200 is provided over the insulator 216. Note that a transistor structure which will be described in the following embodiment can be used as the structure of the transistor 200. Note that the transistor 200 in FIG. 1 is just an example and is not limited to the structure illustrated therein; an appropriate transistor may be used in accordance with a circuit configuration or a driving method.

An insulator 280 is provided over the transistor 200. The insulator 280 preferably includes oxide containing oxygen in excess of that in the stoichiometric composition. That is, in the insulator 280, a region containing oxygen in excess of that in the stoichiometric composition (hereinafter also referred to as oxygen-excess region) is preferably formed. In particular, in the case of using an oxide semiconductor in the transistor 200, when an insulator including an oxygen-excess region is provided in an interlayer film or the like in the vicinity of the transistor 200, oxygen vacancies in the transistor 200 are reduced, whereby the reliability can be improved.

As the insulator including the oxygen-excess region, specifically, an oxide material that releases part of oxygen by heating is preferably used. An oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor 200 may function as a planarization film that covers a roughness thereunder. Conductors 244 and the like are embedded in the insulator 280.

Note that the conductor 244 functions as a plug or a wiring that is electrically connected to the capacitor 100, the transistor 200, or the transistor 300. The conductor 244 can be formed using a material similar to that used for forming the conductor 328 and the conductor 330.

For example, when the conductor 244 is formed to have a stacked-layer structure, the conductor 244 preferably includes a conductor that is not easily oxidized (with high oxidation resistance). In particular, a conductor with high oxidation resistance is preferably provided in a region in contact with the insulator 280 including the oxygen-excess region. Such a structure can prevent the conductor 244 from absorbing excess oxygen from the insulator 280. Furthermore, the conductor 244 preferably includes a conductor having a barrier property against hydrogen. In particular, a conductor having a barrier property against an impurity such as hydrogen is provided in a region in contact with the insulator 280 including the oxygen-excess region, whereby diffusion of the impurity of the conductor 244, diffusion of part of the conductor 244, and diffusion of an impurity from the outside through the conductor 244 can be prevented.

A barrier layer 281 may be provided over the conductor 244. The barrier layer 281 can prevent diffusion of the impurity included in the conductor 244 and diffusion of part of the conductor 244. Furthermore, diffusion of an impurity through the conductor 244 can be prevented.

Metal oxide such as aluminum oxide, hafnium oxide, or tantalum oxide, metal nitride such as tantalum nitride, or the like is preferably used as the barrier layer 281. In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor.

In the case where a conductor 112 (the conductor 244) has a stacked-layer structure of a conductor having a barrier property against oxygen, hydrogen, or water (e.g., tantalum nitride) and a conductor which has high conductivity (e.g., tungsten or copper), the conductor which has high conductivity (e.g., tungsten or copper) is completely sealed with tantalum nitride and the barrier layer 281. Thus, not only diffusion of a conductor itself (e.g., copper) but also entry of impurities from above the insulator 282 through the conductor 244 can be prevented.

The insulator 282 is provided over the barrier layer 281 and the insulator 280. A material having a barrier property against oxygen or hydrogen is preferably used for the insulator 282. Thus, the insulator 282 can be formed using a material similar to that used for forming the insulator 214. As the insulator 282, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

Therefore, the transistor 200 and the insulator 280 including the oxygen-excess region can be located between a stacked-layer structure of the insulator 212, the insulator 213, and the insulator 214 and the insulator 282. The insulator 212, the insulator 213, the insulator 214, and the insulator 282 each have a barrier property that prevents diffusion of oxygen or impurities such as hydrogen and water.

Oxygen released from the insulator 280 and the transistor 200 can be prevented from diffusing into the capacitor 100 or a layer where the transistor 300 is formed. Furthermore, impurities such as hydrogen and water can be prevented from diffusing from a layer over the insulator 282 and a layer under the insulator 214 into the transistor 200.

That is, oxygen can be efficiently supplied from the oxygen-excess region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be prevented and the reliability can be improved.

FIGS. 7A and 7B are each a cross-sectional view in the vicinity of a scribe line.

For example, as illustrated in FIG. 7A, an opening is provided in the insulator 212, the insulator 213, the insulator 214, the insulator 216, an insulator 220, an insulator 222, an insulator 224, and the insulator 280 in the vicinity of a region overlapping with the scribe line (shown by a dashed-dotted line in FIG. 7A) formed in an edge of a memory cell including the transistor 200. In addition, the insulator 282 is provided to cover the side surfaces of the insulator 212, the insulator 213, the insulator 214, the insulator 216, the insulator 220, the insulator 222, the insulator 224, and the insulator 280.

Accordingly, the insulator 212, the insulator 213, and the insulator 214 are in contact with the insulator 282 in the opening. At that time, at least one of the insulator 212, the insulator 213, and the insulator 214 is formed using a material and a method similar to those used for forming the insulator 282, whereby adhesion therebetween can be improved.

In the structure, the insulator 280 and the transistor 200 can be enclosed by the insulator 212, the insulator 213, the insulator 214, and the insulator 282. Since the insulator 212, the insulator 213, the insulator 214, and the insulator 282 each have a function of preventing diffusion of oxygen, hydrogen, and water, entry and diffusion of hydrogen or water from the side surfaces of the insulator 220, the insulator 222, the insulator 224, and the insulator 280 into the transistor 200 can be prevented even when the semiconductor device described in this embodiment is subjected to scribing.

Furthermore, in the structure, excess oxygen in the insulator 280 can be prevented from diffusing into the outside of the insulator 282 and the insulator 214. Accordingly, excess oxygen in the insulator 280 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be prevented and the reliability can be improved.

As another example, as illustrated in FIG. 7B, openings may be provided in the insulator 212, the insulator 213, the insulator 214, the insulator 216, the insulator 220, the insulator 222, the insulator 224, and the insulator 280 on both sides of the scribe line (shown by the dashed-dotted line in FIG. 7B). Note that the number of the openings in the figure is two. A plurality of openings may be provided as appropriate.

Since the insulator 212, the insulator 213, and the insulator 214 are in contact with the insulator 282 in at least two regions in the openings provided on both sides of the scribe line, higher adhesion is obtained. Note that also in that case, when at least one of the insulator 212, the insulator 213, and the insulator 214 is formed using a material and a method similar to those used for forming the insulator 282, the adhesion therebetween can be improved.

Since the plurality of openings are provided, the insulator 282 can be in contact with the insulator 212, the insulator 213, and the insulator 214 in a plurality of regions. In addition, when impurities passing through the scribe line diffuse into a region which is included in the region where the insulator 214 is in contact with the insulator 282 and is the nearest to the transistor 200, a diffusion path of the impurities can be lengthened.

In such a structure, the transistor 200 and the insulator 280 can be enclosed tightly. Thus, the oxide where the channel is formed in the transistor 200 can be an oxide semiconductor with a low density of defect states and stable characteristics. That is, a change in electrical characteristics of the transistor 200 can be prevented and the reliability can be improved.

The capacitor 100 is provided over the transistor 200. The capacitor 100 includes the conductor 112, the barrier layer 281, the insulator 282, an insulator 130, and a conductor 116.

The conductor 112 functions as an electrode of the capacitor 100. For example, in the structure in FIG. 1, part of the conductor 244 functioning as a plug or a wiring that is connected to the transistor 200 and the transistor 300 functions as the conductor 112. Note that when the barrier layer 281 has conductivity, the barrier layer 281 functions as part of the electrode of the capacitor 100. When the barrier layer 281 has an insulating property, the barrier layer 281 functions as a dielectric of the capacitor 100.

Such a structure can increase the productivity owing to a reduction of the number of steps in the process as compared to the case where the electrode and the wiring are formed separately.

A region located between the conductor 112 and the conductor 116 in the insulator 282 functions as a dielectric. For example, the use of a high dielectric constant (high-k) material, such as aluminum oxide, for the insulator 282 can ensure a sufficient capacitance of the capacitor 100.

An insulator 130 may be provided as part of the dielectric. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, in the case where a high dielectric constant (high-k) material, such as aluminum oxide, is used for the insulator 282, a material with high dielectric strength, such as silicon oxynitride, is used for the insulator 130. In the capacitor 100 having the structure, the dielectric strength can be increased and the electrostatic breakdown of the capacitor 100 can be prevented because of the insulator 130.

The conductor 116 is provided so as to cover the top and side surfaces of the conductor 112 with the barrier layer 281, the insulator 282, and the insulator 130 located therebetween. In the structure where the side surfaces of the conductor 112 are wrapped by the conductor 116 with the insulators located therebetween, capacitance is also formed on the side surfaces of the conductor 112, resulting in an increase in the capacitance per unit projected area of the capacitor. Thus, the semiconductor device can be reduced in area, highly integrated, and miniaturized.

Note that the conductor 116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 116 is formed concurrently with another component such as a conductor, Cu (copper), Al (aluminum), or the like which is a low-resistance metal material may be used.

An insulator 150 is provided over the conductor 116 and the insulator 130. The insulator 150 can be formed using a material similar to that used for forming the insulator 320. The insulator 150 may function as a planarization film that covers roughness due to underlying layers.

The above is the description of the structure example. A change in electric characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

Modification Example 1

Figure 2:
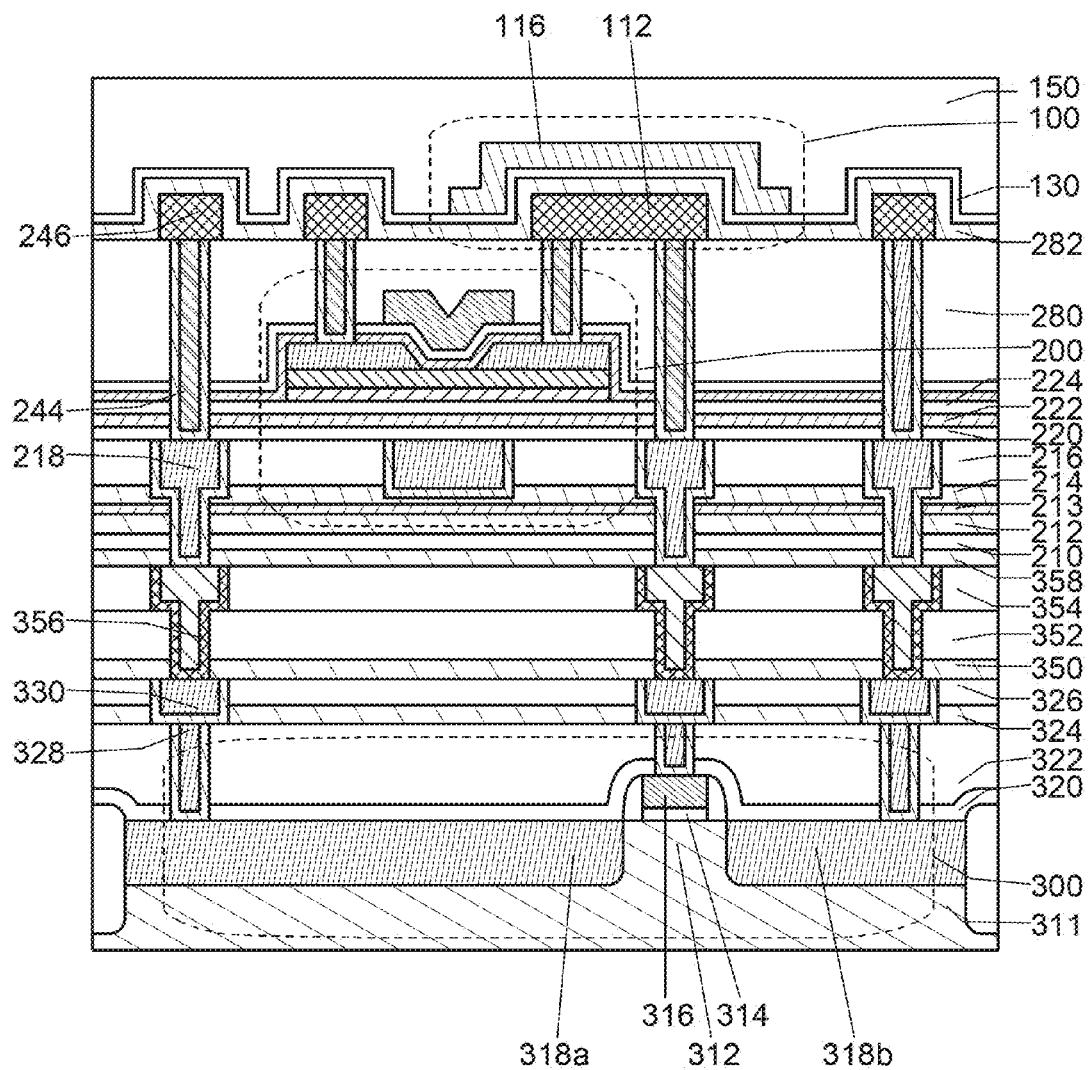
FIG. 2 illustrates a cross-sectional structure of a semiconductor device of an embodiment.

As a modification example of this embodiment, the conductor 244 and a conductor 246 may be formed as illustrated in FIG. 2. That is, the conductor 244 serving as a plug may be embedded in the insulator 280, and the conductor 246 serving as a wiring may be provided over the conductor 244 using a conductor having a barrier property. In that case, it is preferable to use a conductor having not only a barrier property but also high oxidation resistance for the conductor 246. In the structure where the wiring is formed using the conductor having a barrier property, the barrier layer 281 is not necessarily provided.

It is preferable to use tantalum nitride having a barrier property for the conductor 246. In the case where the conductor 244 has a stacked-layer structure of a conductor having a barrier property against oxygen, hydrogen, or water (e.g., tantalum nitride) and a conductor which has high conductivity (e.g., tungsten or copper), the conductor which has high conductivity (e.g., tungsten or copper) is completely sealed with tantalum nitride. Thus, not only diffusion of a conductor itself (e.g., copper) but also entry of impurities from above the insulator 282 through the conductor 244 can be prevented.

Thus, as illustrated in FIG. 2, the capacitor 100 includes the conductor 112, the insulator 282, the insulator 130, and the conductor 116.

The conductor 112 functioning as the electrode of the capacitor 100 can be formed concurrently with the conductor 246. Such a structure can increase the productivity. Furthermore, the number of steps in the process can be reduced because a mask for forming the barrier layer is not needed.

A region located between the conductor 112 and the conductor 116 in the insulator 282 functions as a dielectric. For example, the use of a high dielectric constant (high-k) material, such as aluminum oxide, for the insulator 282 can ensure a sufficient capacitance of the capacitor 100.

The insulator 130 may be provided as part of the dielectric. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, in the case where a high dielectric constant (high-k) material, such as aluminum oxide, is used for the insulator 282, a material with high dielectric strength, such as silicon oxynitride, is used for the insulator 130. In the capacitor 100 having the structure, the dielectric strength can be increased and the electrostatic breakdown of the capacitor 100 can be prevented because of the insulator 130.

The conductor 116 is provided so as to cover the top and side surfaces of the conductor 112 with the barrier layer 281, the insulator 282, and the insulator 130 located therebetween. In the structure where the side surfaces of the conductor 112 are wrapped by the conductor 116 with the insulators located therebetween, capacitance is also formed on the side surfaces of the conductor 112, resulting in an increase in the capacitance per unit projected area of the capacitor. Thus, the semiconductor device can be reduced in area, highly integrated, and miniaturized.

The above is the description of the structure example. A change in electric characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

Modification Example 2

Figure 3:
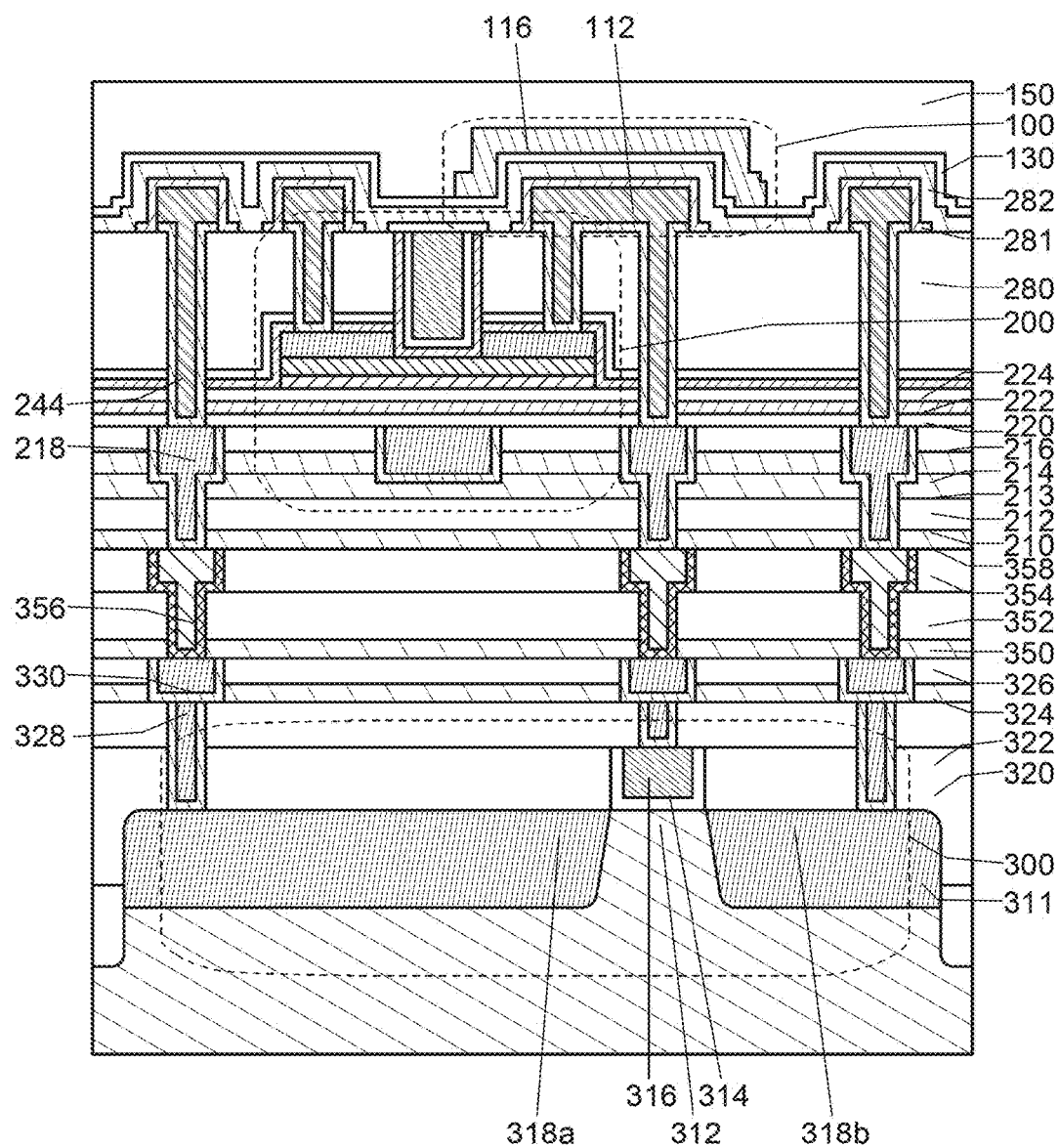
FIG. 3 illustrates a cross-sectional structure of a semiconductor device of an embodiment.

FIG. 3 illustrates another modification example of this embodiment. FIG. 3 is different from FIG. 1 in the structures of the transistor 300 and the transistor 200.

In the transistor 300 illustrated in FIG. 3, the semiconductor region 312 (part of the substrate 311) in which the channel is formed has a projecting shape. Furthermore, the conductor 316 is provided to cover top and side surfaces of the semiconductor region 312 with the insulator 314 located therebetween. Note that the conductor 316 may be formed using a material for adjusting the work function. The transistor 300 having such a structure is also referred to as a FIN transistor because a projection of the semiconductor substrate is utilized. An insulator serving as a mask for forming the projection may be provided in contact with a top surface of the projection. Although the case where the projection is formed by processing part of the semiconductor substrate is described here, a semiconductor film having a projecting shape may be formed by processing an SOI substrate.

Details of the structure of the transistor 200 in FIG. 3 will be described in another embodiment. An oxide, a gate insulator, and a conductor serving as a gate are formed in an opening formed in the insulator 280. Thus, it is preferable to form the barrier layer 281 at least over the conductor serving as a gate.

In the case where the conductor 112 (the conductor 244) has a stacked-layer structure of a conductor having a barrier property against oxygen, hydrogen, or water (e.g., tantalum nitride) and a conductor which has high conductivity (e.g., tungsten or copper), the conductor which has high conductivity (e.g., tungsten or copper) is completely sealed with tantalum nitride and the barrier layer 281. Thus, not only diffusion of a conductor itself (e.g., copper) but also entry of impurities from above the insulator 282 through the conductor 244 can be prevented.

Note that the capacitor 100 is provided over the transistor 200. In the structure in FIG. 3, the capacitor 100 includes the conductor 112, the barrier layer 281, the insulator 282, the insulator 130, and the conductor 116.

The conductor 112 functions as the electrode of the capacitor 100. For example, in the structure in FIG. 3, part of the conductor 244 functioning as a plug or a wiring that is connected to the transistor 200 and the transistor 300 functions as the conductor 112. Note that when the barrier layer 281 has conductivity, the barrier layer 281 functions as part of the electrode of the capacitor 100. When the barrier layer 281 has an insulating property, the barrier layer 281 functions as a dielectric of the capacitor 100.

Such a structure can increase the productivity owing to a reduction of the number of steps in the process as compared to the case where the electrode and the wiring are formed separately.

A region located between the conductor 112 and the conductor 116 in the insulator 282 functions as a dielectric. For example, the use of a high dielectric constant (high-k) material, such as aluminum oxide, for the insulator 282 can ensure a sufficient capacitance of the capacitor 100.

The insulator 130 may be provided as part of the dielectric. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, in the case where a high dielectric constant (high-k) material, such as aluminum oxide, is used for the insulator 282, a material with high dielectric strength, such as silicon oxynitride, is used for the insulator 130. In the capacitor 100 having the structure, the dielectric strength can be increased and the electrostatic breakdown of the capacitor 100 can be prevented because of the insulator 130.

The conductor 116 is provided so as to cover the top and side surfaces of the conductor 112 with the barrier layer 281, the insulator 282, and the insulator 130 located therebetween. In the structure where the side surfaces of the conductor 112 are wrapped by the conductor 116 with the insulators located therebetween, capacitance is also formed on the side surfaces of the conductor 112, resulting in an increase in the capacitance per unit projected area of the capacitor. Thus, the semiconductor device can be reduced in area, highly integrated, and miniaturized.

Modification Example 3

Figure 4:
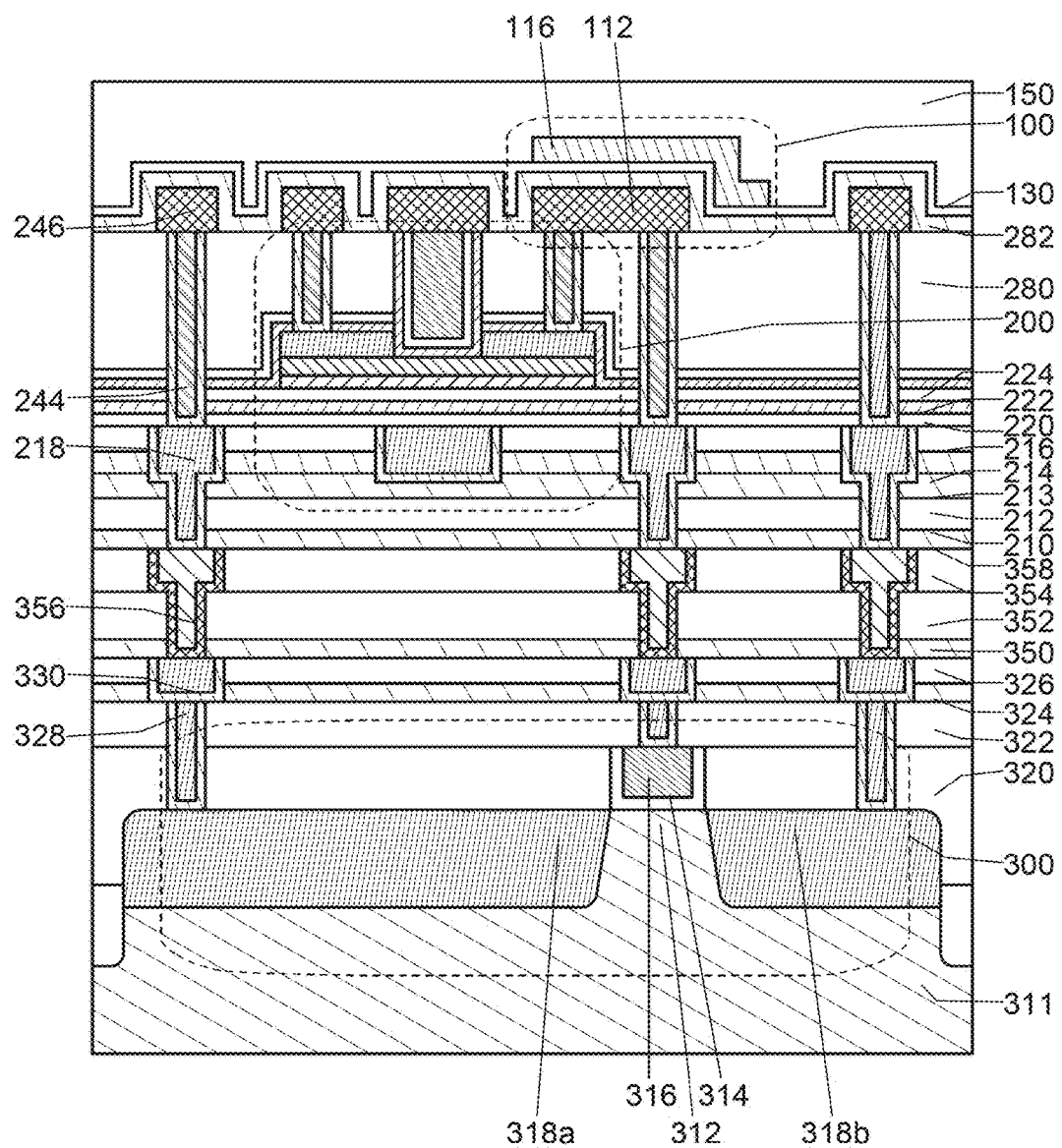
FIG. 4 illustrates a cross-sectional structure of a semiconductor device of an embodiment.

FIG. 4 illustrates another modification example of this embodiment. FIG. 4 is different from FIG. 2 in the structures of the transistor 300 and the transistor 200.

The transistor 300 illustrated in FIG. 4 may be a FIN transistor having a projecting shape in the semiconductor region 312 (part of the substrate 311) in which the channel is formed.

Details of the structure of the transistor 200 in FIG. 4 will be described in another embodiment. An oxide, a gate insulator, and a conductor serving as a gate are formed in an opening formed in the insulator 280.

The conductor 244 and the conductor 246 may be formed as illustrated in FIG. 4. That is, the conductor 244 serving as a plug is embedded in the insulator 280, and the conductor 246 serving as a wiring is provided over the conductor 244 using a conductor having a barrier property. Thus, the conductor 246 that is connected to the conductor serving as a gate of the transistor 200 is also formed using a conductor having a barrier property. Note that it is preferable to use a conductor having not only a barrier property but also high oxidation resistance for the conductor 246. In the structure where the wiring is formed using the conductor having a barrier property, the barrier layer 281 is not necessarily provided.

It is preferable to use tantalum nitride having a barrier property for the conductor 246. In the case where the conductor 244 has a stacked-layer structure of a conductor having a barrier property against oxygen, hydrogen, or water (e.g., tantalum nitride) and a conductor which has high conductivity (e.g., tungsten or copper), the conductor which has high conductivity (e.g., tungsten or copper) is completely sealed with tantalum nitride. Thus, not only diffusion of a conductor itself (e.g., copper) but also entry of impurities from above the insulator 282 through the conductor 244 can be prevented.

Thus, as illustrated in FIG. 4, the capacitor 100 includes the conductor 112, the insulator 282, the insulator 130, and the conductor 116.

The conductor 112 functioning as the electrode of the capacitor 100 can be formed concurrently with the conductor 246. Such a structure can increase the productivity. Furthermore, the number of steps in the process can be reduced because a mask for forming the barrier layer is not needed.

A region located between the conductor 112 and the conductor 116 in the insulator 282 functions as a dielectric. For example, the use of a high dielectric constant (high-k) material, such as aluminum oxide, for the insulator 282 can ensure a sufficient capacitance of the capacitor 100.

The insulator 130 may be provided as part of the dielectric. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, in the case where a high dielectric constant (high-k) material, such as aluminum oxide, is used for the insulator 282, a material with high dielectric strength, such as silicon oxynitride, is used for the insulator 130. In the capacitor 100 having the structure, the dielectric strength can be increased and the electrostatic breakdown of the capacitor 100 can be prevented because of the insulator 130.

The conductor 116 is provided so as to cover the top and side surfaces of the conductor 112 with the barrier layer 281, the insulator 282, and the insulator 130 located therebetween. In the structure where the side surfaces of the conductor 112 are wrapped by the conductor 116 with the insulators located therebetween, capacitance is also formed on the side surfaces of the conductor 112, resulting in an increase in the capacitance per unit projected area of the capacitor. Thus, the semiconductor device can be reduced in area, highly integrated, and miniaturized.

Modification Example 4

Figure 5:
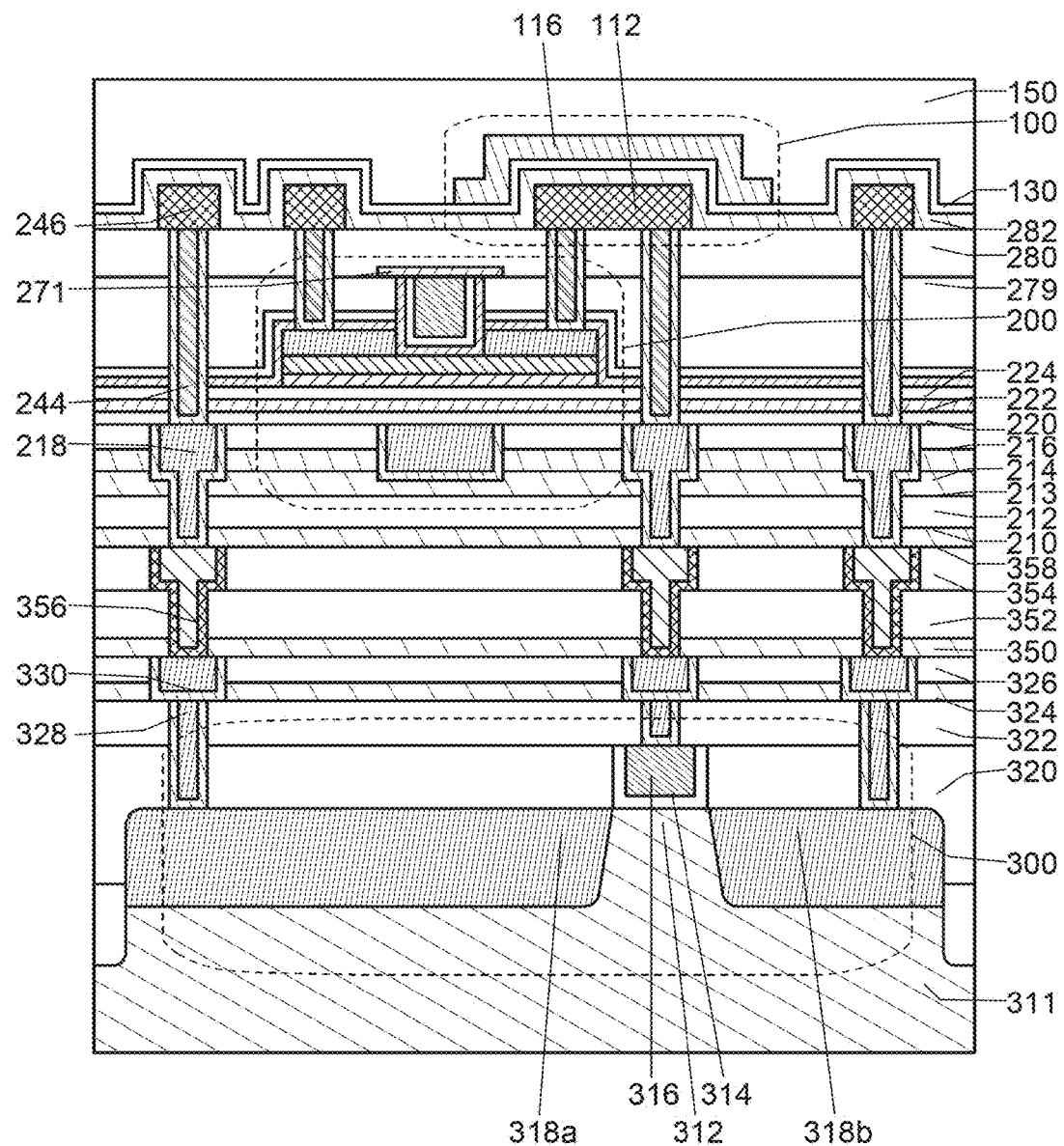
FIG. 5 illustrates a cross-sectional structure of a semiconductor device of an embodiment.

FIG. 5 illustrates another modification example of this embodiment. FIG. 5 is different from FIG. 4 in the structure of the transistor 200.

As illustrated in FIG. 5, an insulator 279 and a barrier layer 271 may be provided. The insulator 279 can be formed using a material and a method similar to those used for forming the insulator 280. That is, like the insulator 280, the insulator 279 preferably includes an oxide containing oxygen in excess of that in the stoichiometric composition. Thus, the insulator 279 is an insulator containing oxygen, such as a silicon oxide film or a silicon oxynitride film. The insulator containing excess oxygen can be formed using a silicon oxide film or a silicon oxynitride film containing a large amount of oxygen as a result of deposition by a CVD method or a sputtering method under the conditions which are set as appropriate. After an insulator to be the insulator 279 is formed, planarization treatment using a CMP method or the like may be performed to improve the planarity of a top surface of the insulator. To form an oxygen-excess region in the insulator 279, for example, oxygen may be added by an ion implantation method, an ion doping method, or plasma treatment.

The barrier layer 271 is formed using an insulator or a conductor having a barrier property against oxygen. The barrier layer 271 can be formed using, for example, aluminum oxide, hafnium oxide, tantalum oxide, tantalum nitride, or the like by a sputtering method or an atomic layer deposition (ALD) method.

The insulator 280 is provided over the insulator 279 and the barrier layer 271. In the case where treatment for making an oxygen-excess state is performed on the insulator 280, excess oxygen which is introduced is diffused not only into the insulator 280 but also into the insulator 279 when the insulator 280 is formed using a material and a method similar to those used for forming the insulator 279. To form an oxygen-excess region in the insulator 280 and the insulator 279, for example, oxygen may be added to the insulator 280 by an ion implantation method, an ion doping method, or plasma treatment.

The above is the description of the structure example. A change in electric characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

At least part of this embodiment can be implemented in combination with any of the other embodiments described in this specification as appropriate.

Embodiment 2

In this embodiment, an example of a method for manufacturing the semiconductor device described in the above structure example will be described below with reference to FIGS. 8A to 8D, FIGS. 9A to 9C, FIGS. 10A and 10B, FIGS. 11A and 11B, FIGS. 12A and 12B, FIG. 13, FIG. 14, FIG. 15, FIG. 16, FIG. 17, FIG. 18, and FIG. 19.

<Method for Manufacturing Semiconductor Device>

First, the substrate 311 is prepared. A semiconductor substrate is used as the substrate 311. For example, a single crystal silicon substrate (including a p-type semiconductor substrate or an n-type semiconductor substrate), a compound semiconductor substrate containing silicon carbide or gallium nitride, or the like can be used. An SOI substrate may alternatively be used as the substrate 311. The case where single crystal silicon is used for the substrate 311 is described below.

Next, an element isolation layer is formed in the substrate 311. The element isolation layer may be formed by a local oxidation of silicon (LOCOS) method, a shallow trench isolation (STI) method, or the like.

In the case where a p-channel transistor and an n-channel transistor are formed on the same substrate, an n-well or a p-well may be formed in part of the substrate 311. For example, a p-well may be formed by adding an impurity element that imparts p-type conductivity, such as boron, to the n-type substrate 311, and an n-channel transistor and a p-channel transistor may be formed on the same substrate.

Then, an insulator to be the insulator 314 is formed over the substrate 311. For example, after surface nitriding treatment, oxidizing treatment may be performed to oxidize the interface between silicon and silicon nitride, whereby a silicon oxynitride film may be formed. For example, a silicon oxynitride film can be obtained by performing oxygen radical oxidation after a thermal silicon nitride film is formed on the surface at 700° C. in an $NH_3$ atmosphere.

The insulator may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

Then, a conductive film to be the conductor 316 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Further alternatively, a stacked-layer structure of a film of metal nitride and a film of any of the above metals may be used. As a metal nitride, tungsten nitride, molybdenum nitride, or titanium nitride can be used. When the metal nitride film is provided, adhesiveness of the metal film can be increased; thus, separation can be prevented. Note that the threshold voltage of the transistor 300 can be adjusted by determining a work function of the conductor 316, and therefore, a material of the conductive film is selected as appropriate in accordance with the characteristics that the transistor 300 needs to have.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, a resist mask is formed over the conductive film by a photolithography process or the like and an unnecessary portion of the conductive film is removed. After that, the resist mask is removed, whereby the conductor 316 is formed.

After the conductor 316 is formed, a sidewall covering a side surface of the conductor 316 may be formed. The sidewall can be formed in such a manner that an insulator thicker than the conductor 316 is formed and subjected to anisotropic etching so that only a portion of the insulator on the side surface of the conductor 316 remains.

The insulator to be the insulator 314 is etched concurrently with the formation of the sidewall, whereby the insulator 314 is formed under the conductor 316 and the sidewall. The insulator 314 may be formed by etching the insulator with the conductor 316 or a resist mask for processing the conductor 316 used as an etching mask after the conductor 316 is formed. In this case, the insulator 314 is formed under the conductor 316. Alternatively, the insulator can be used as the insulator 314 without being processed by etching.

Then, an element that imparts n-type conductivity, such as phosphorus, or an element that imparts p-type conductivity, such as boron, is added to a region of the substrate 311 where the conductor 316 (and the sidewall) is not provided.

Subsequently, the insulator 320 is formed, and then, heat treatment is performed to activate the aforementioned element that imparts conductivity.

The insulator 320 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulator 320 is preferably formed using silicon nitride containing oxygen and hydrogen (SiNOH) because the amount of hydrogen released by heating can be increased. Alternatively, the insulator 320 can also be formed using silicon oxide with high step coverage that is formed by reacting tetraethyl orthosilicate (TEOS), silane, or the like with oxygen, nitrous oxide, or the like.

The insulator 320 can be formed by, for example, a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method, because coverage can be further improved. It is preferable to use a thermal CVD method, an MOCVD method, or an ALD method in order to reduce plasma damage.

The heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the transistor 300 is formed. Note that in the case of using the circuit configuration in FIG. 6B, the transistor 300 may be omitted. In that case, there is no particular limitation on the substrate that can be used as the substrate. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium, gallium arsenide, indium arsenide, or indium gallium arsenide, or the like; a silicon-on-insulator (SOI) substrate; a germanium-on-insulator (GOI) substrate; or the like can be used. Further alternatively, any of these substrates provided with a semiconductor element may be used.

Alternatively, a flexible substrate may be used as the substrate. A transistor may be directly formed over a flexible substrate; or alternatively, a transistor may be formed over a substrate and then separated from the substrate and transferred to a flexible substrate. In order that the transistor be separated from the different substrate to be transferred to the flexible substrate, it is preferable to provide a separation layer between the manufacturing substrate and the transistor including an oxide semiconductor.

Figure 8A:
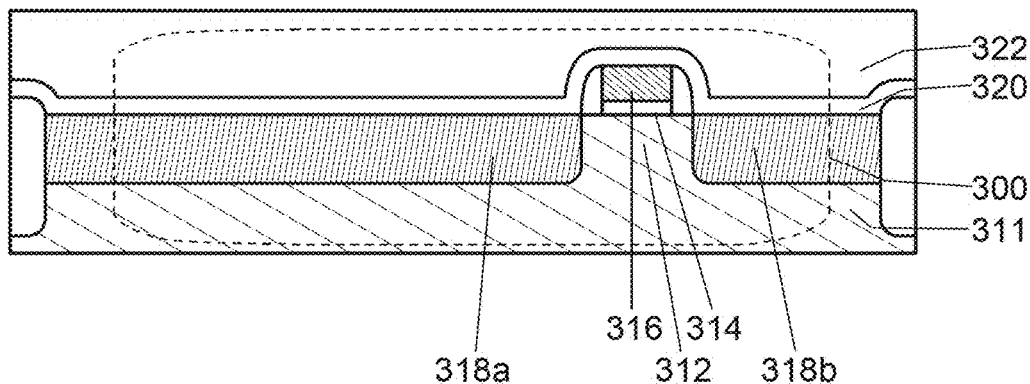
FIGS. 8A to 8D illustrate an example of a method for manufacturing a semiconductor device of an embodiment.

Then, the insulator 322 is formed over the insulator 320. The insulator 322 can be formed using a material and a method similar to those used for forming the insulator 320. In addition, the top surface of the insulator 322 is planarized by a CMP method or the like (FIG. 8A).

Figure 8B:
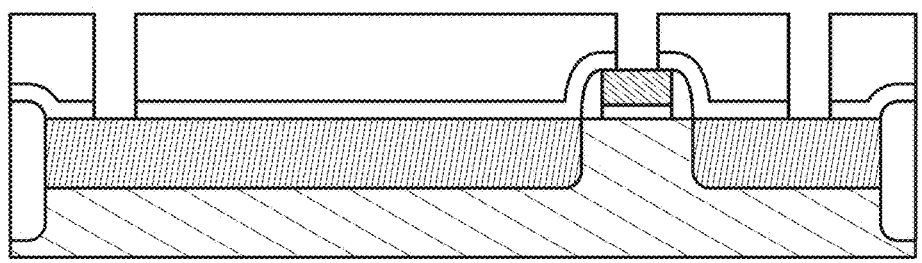
Figure 8C:
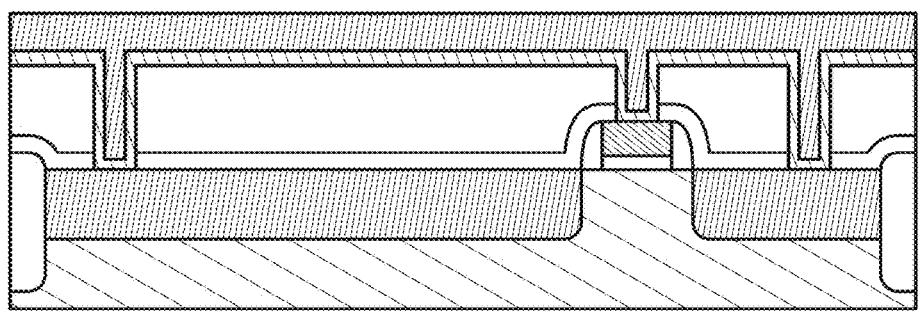

Then, openings that reach the low-resistance region 318a, the low-resistance region 318b, the conductor 316, and the like are formed in the insulator 320 and the insulator 322 by a lithography process or the like (FIG. 8B). After that, a conductive film is formed to fill the openings (see FIG. 8C). The conductive film can be formed by a sputtering method, a CVD method (including a thermal CVD method, an MOCVD method, a PECVD method, and the like), an MBE method, an ALD method, a PLD method, or the like.

Figure 8D:
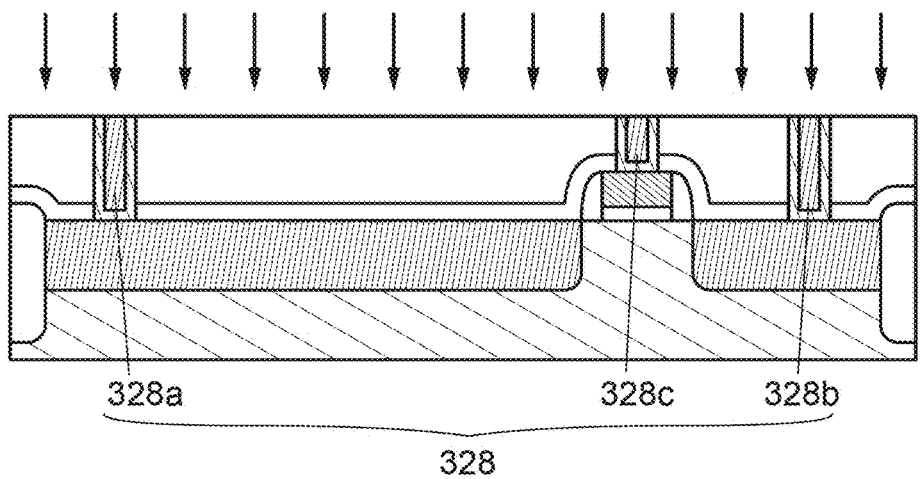

Then, planarization treatment is performed on the conductive film to expose a top surface of the insulator 322, whereby a conductor 328a, a conductor 328b, a conductor 328c, and the like are formed (FIG. 8D). Note that arrows in FIG. 8D show CMP treatment. Furthermore, in the specification and the drawings, the conductor 328a, the conductor 328b, and the conductor 328c each function as a plug or a wiring and are collectively referred to as a conductor 328 in some cases. Note that in this specification, conductors each functioning as a plug or a wiring are treated in a similar manner.

Figure 9A:
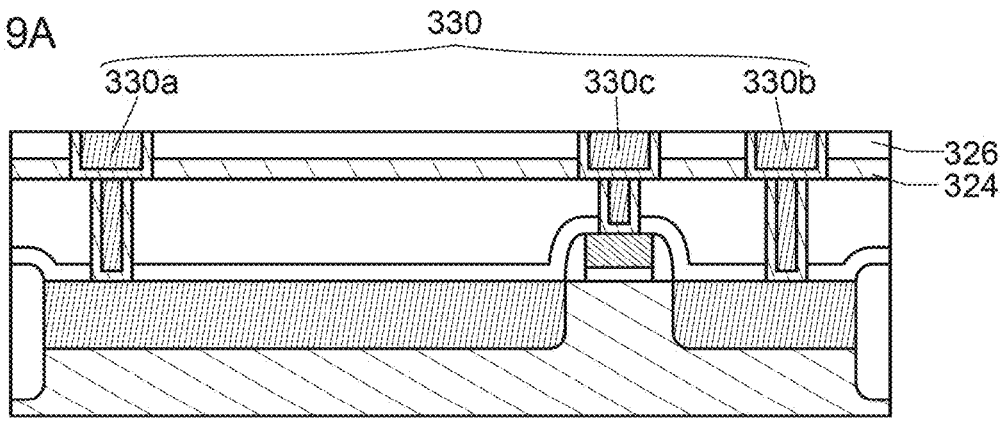
FIGS. 9A to 9C illustrate the example of a method for manufacturing a semiconductor device of an embodiment.

Then, a conductor 330a, a conductor 330b, and a conductor 330c are formed over the insulator 320 by a damascene process or the like (FIG. 9A).

The insulator 324 and the insulator 326 can be formed using a material and a method similar to those used for forming the insulator 320.

The insulator 324 is preferably formed using, for example, a film having a barrier property that prevents hydrogen or impurities from diffusing from the substrate 311, the transistor 300, or the like into a region where the transistor 200 is formed. As an example of the film having a barrier property against hydrogen, silicon nitride formed by a CVD method can be given.

The insulator 326 is preferably an insulator having a low dielectric constant (low-k material). For example, silicon oxide formed by a CVD method can be used. In the case where a material with a low dielectric constant is used as an interlayer film, the parasitic capacitance between wirings can be reduced.

A conductive film to be the conductor 330 can be formed using a material and a method similar to those used for forming the conductor 328.

Note that in the case where the conductor 330 has a stacked-layer structure, it is preferable that a conductor which is in contact with the insulator 324 and has a barrier property against oxygen, hydrogen, or water (e.g., tantalum nitride) and a conductor which has high conductivity (e.g., tungsten or copper) be stacked in the structure. For example, tantalum nitride having a barrier property can be formed by an ALD method using a deposition gas that does not contain chlorine at a substrate temperature of 250° C. A dense conductor including reduced defects such as cracks or pinholes or having a uniform thickness can be formed by an ALD method. In the case where the insulator 324 having a barrier property against oxygen, hydrogen, or water is in contact with the conductor having a barrier property against oxygen, hydrogen, or water, the diffusion of oxygen, hydrogen, or water can be prevented more reliably.

Figure 9B:
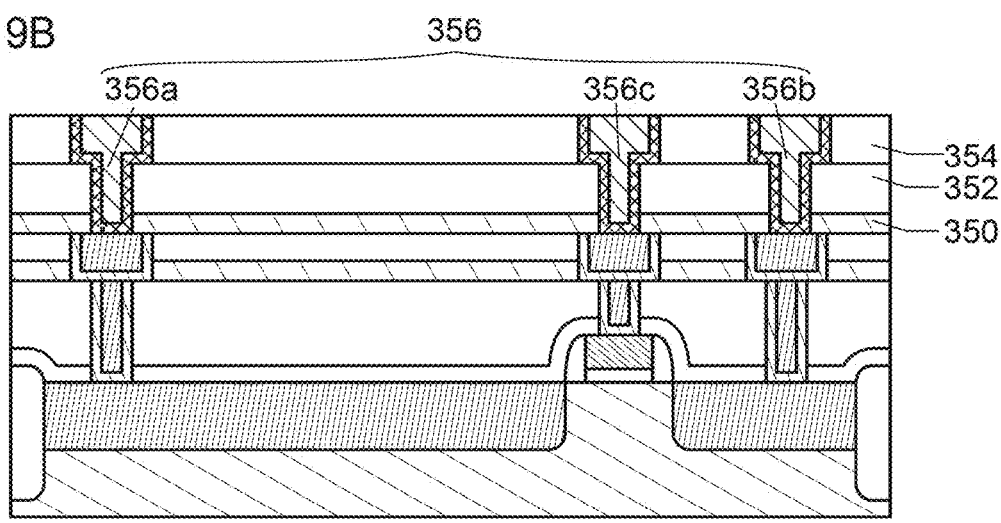

Then, the insulator 350, the insulator 352, the insulator 354, a conductor 356a, a conductor 356b, and a conductor 356c are formed (FIG. 9B). The insulator 352 and the insulator 354 can be formed using a material and a method similar to those used for forming the insulator 320. The conductor 356 can be formed using a material similar to that used for forming the conductor 328 by a dual damascene process or the like.

Note that in the case where the conductor 356 has a stacked-layer structure, it is preferable that a conductor which is contact with the insulator 350 and has a barrier property against oxygen, hydrogen, or water (e.g., tantalum nitride) and a conductor which has high conductivity (e.g., tungsten or copper) be stacked in the structure. In particular, when a material which is likely to diffuse, such as copper, is used in the conductor 356, it is preferable that a conductor having a barrier property against copper also be stacked together with the material. In addition, it is preferable that the insulator 354 also have a barrier property against copper. In the case where the insulator 354 is in contact with the conductor having a barrier property against oxygen, hydrogen, or water, the diffusion of oxygen, hydrogen, or water can be prevented more reliably.

Next, the insulator 358 having a barrier property against hydrogen or oxygen is formed. Like the insulator 354, the insulator 358 preferably has a barrier property against the conductor used for the conductor 356.

The insulator 210, the insulator 212, the insulator 213, and the insulator 214 are formed over the insulator 358. The insulator 210, the insulator 212, the insulator 213, and the insulator 214 can be formed using a material and a method similar to those used for forming the insulator 324, the insulator 326, and the like.

For example, the insulator 210 is preferably an insulator with a low dielectric constant (low-k material). For example, silicon oxide formed by a CVD method can be used. In the case where a material with a low dielectric constant is used as an interlayer film, the parasitic capacitance between wirings can be reduced.

The insulator 212 is preferably formed using, for example, a film having a barrier property that prevents impurities such as hydrogen from diffusing from the substrate 311, the transistor 300, or the like into a region where the transistor 200 is formed. As an example of the film having a barrier property against hydrogen, silicon nitride formed by a CVD method can be given.

The insulator 213 can be aluminum oxide formed by an ALD method as an example of a film having a barrier property against hydrogen, for example. A dense insulator including reduced defects such as cracks or pinholes or having a uniform thickness can be formed by an ALD method.

The insulator 214 can be aluminum oxide formed by a sputtering method as an example of a film having a barrier property against hydrogen, for example.

Figure 9C:
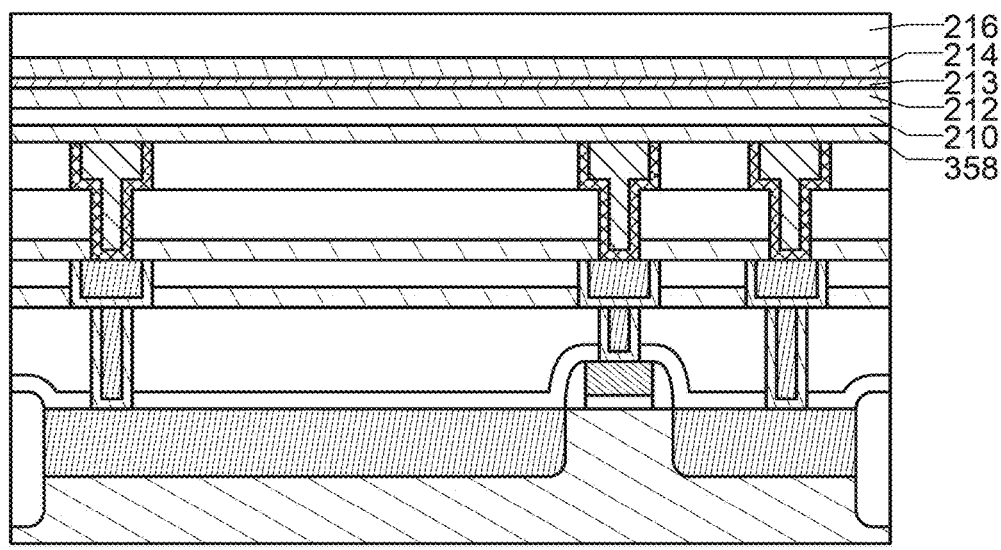

Then, the insulator 216 is formed over the insulator 214. The insulator 216 can be formed using a material and a method similar to those used for forming the insulator 210 (FIG. 9C).

Figure 10A:
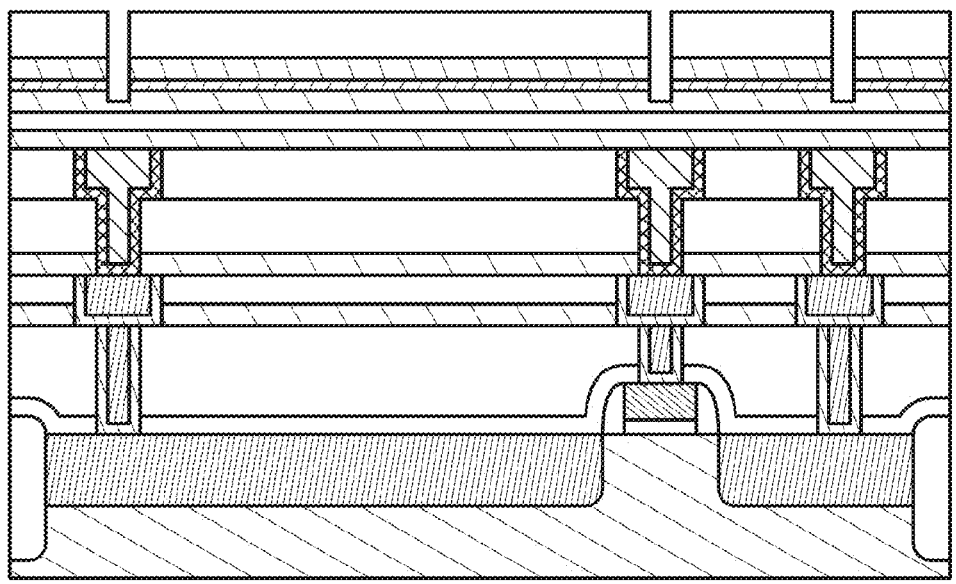
FIGS. 10A and 10B illustrate the example of a method for manufacturing a semiconductor device of an embodiment.

Then, depressions are formed in regions overlapping with the conductor 356a, the conductor 356b, the conductor 356c, and the like in the stacked-layer structure of the insulator 358, the insulator 210, the insulator 212, the insulator 214, and the insulator 216 (FIG. 10A). Note that each of the depressions is preferably deep enough to form an opening in at least the insulator formed using a hardly-etched material. Here, the hardly-etched material denotes a material that is hardly etched, e.g., metal oxide. Typical examples of the metal oxide film formed of a hardly-etched material include a film containing any of aluminum oxide, zirconium oxide, and hafnium oxide; a silicate film containing any of these materials ($HfSi_xO_y$, $ZrSi_xO_y$, or the like), and a film of a composite oxide containing two or more of these materials ($Hf_{1-x}Al_xO_y$, $Zr_{1-x}Al_xO_y$, or the like).

Figure 10B:
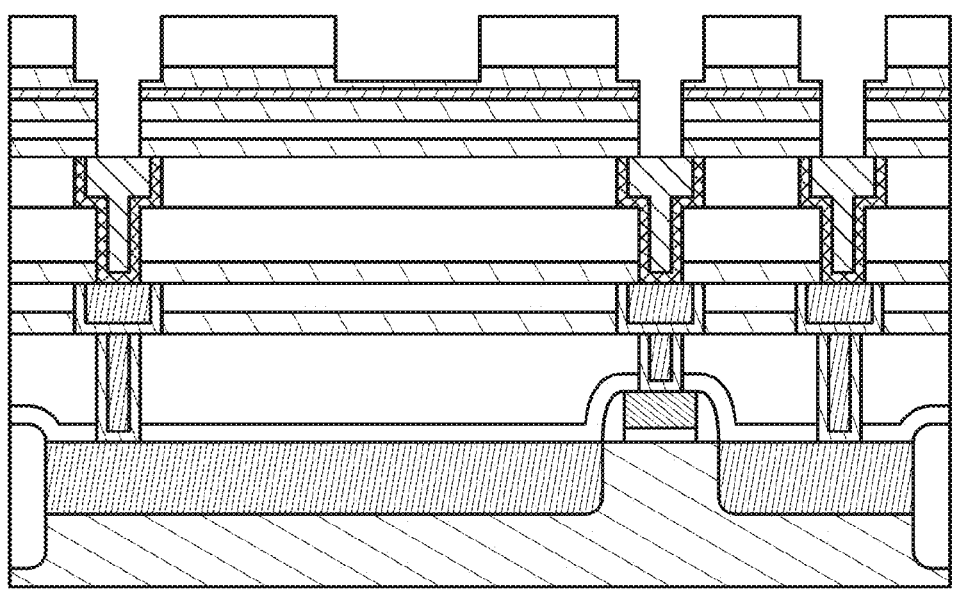

Then, an opening is formed in a region where the conductor 205 is to be formed in the stacked-layer structure of the insulator 210, the insulator 212, the insulator 214, and the insulator 216, and bottom surfaces of the depressions formed in the stacked-layer structure of the insulator 210, the insulator 212, the insulator 214, and the insulator 216 are removed, whereby openings reaching the conductor 356a, the conductor 356b, and the conductor 356c are formed (FIG. 10B). At this time, by increasing the widths of the upper parts of the depressions, e.g., the openings formed in the insulator 216, an adequate design margin for plugs or wirings to be formed in a later step can be provided.

Figure 11A:
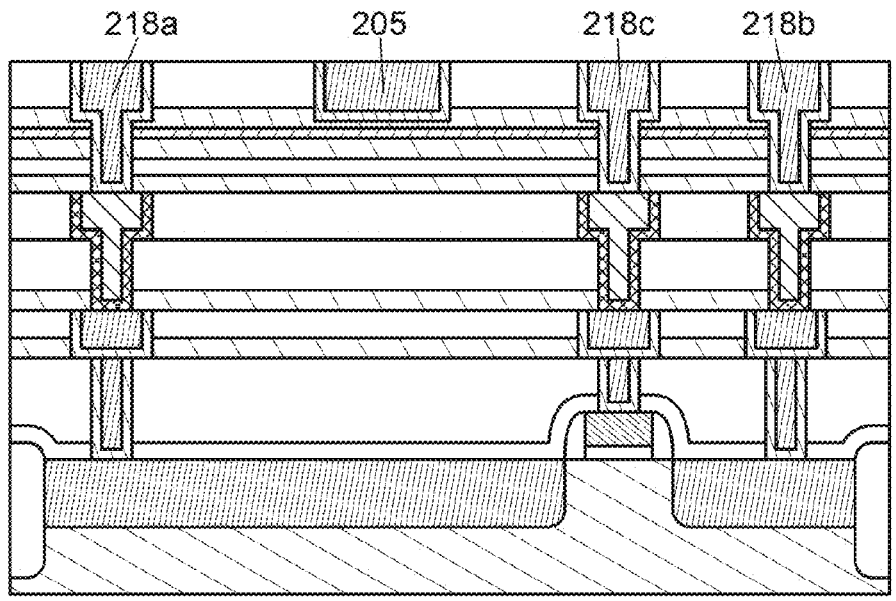
FIGS. 11A and 11B illustrate the example of a method for manufacturing a semiconductor device of an embodiment.

After that, a conductive film is formed to fill the openings. The conductive film can be formed using a material and a method similar to those used for forming the conductor 328. Then, planarization treatment is performed on the conductive film to expose a top surface of the insulator 216, whereby a conductor 218a, a conductor 218b, a conductor 218c, and the conductor 205 are formed (FIG. 11A).

Then, the transistor 200 is formed. The manufacturing method which will be described in the following embodiment can be used as a method for manufacturing the transistor 200.

Figure 11B:
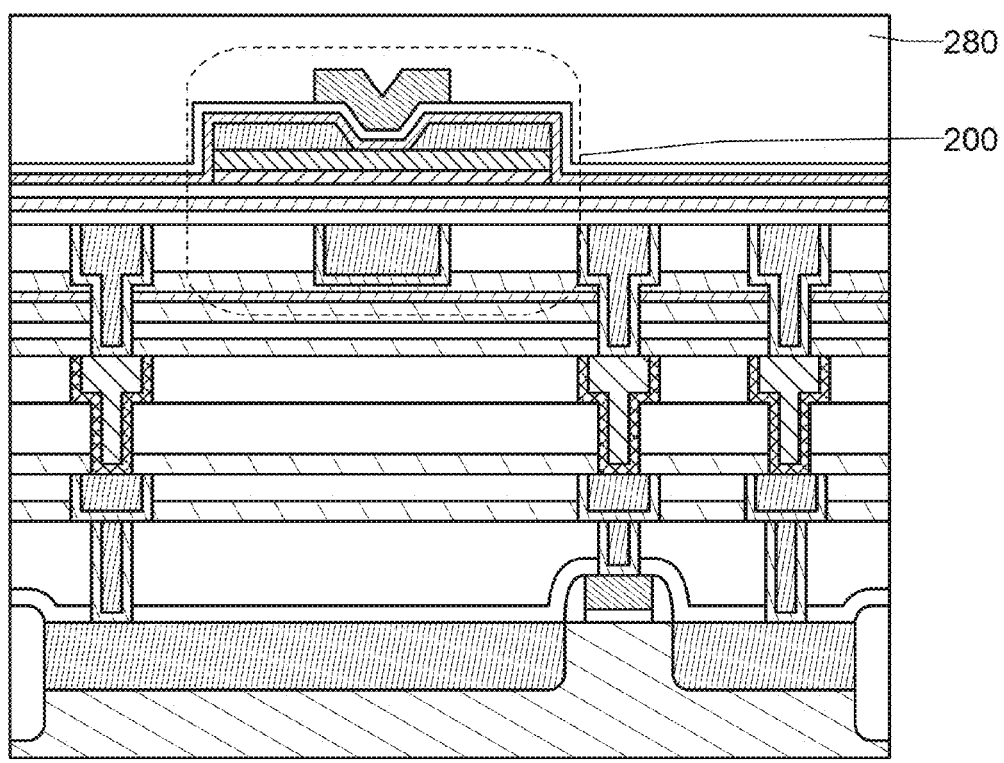

Next, the insulator 280 is formed over the transistor 200. The insulator 280 is preferably formed using an oxide containing oxygen in excess of that in the stoichiometric composition. Note that the insulator 280 is an insulator containing oxygen, such as a silicon oxide film or a silicon oxynitride film. The insulator containing excess oxygen can be formed using a silicon oxide film or a silicon oxynitride film containing a large amount of oxygen as a result of film formation by a CVD method or a sputtering method under the conditions which are set as appropriate. After an insulator to be the insulator 280 is formed, planarization treatment using a CMP method or the like may be performed to improve the planarity of a top surface of the insulator (FIG. 11B).

Here, an oxygen-excess region may be formed in the insulator 280. To form an oxygen-excess region, for example, oxygen may be added by an ion implantation method, an ion doping method, or plasma treatment.

Figure 12A:
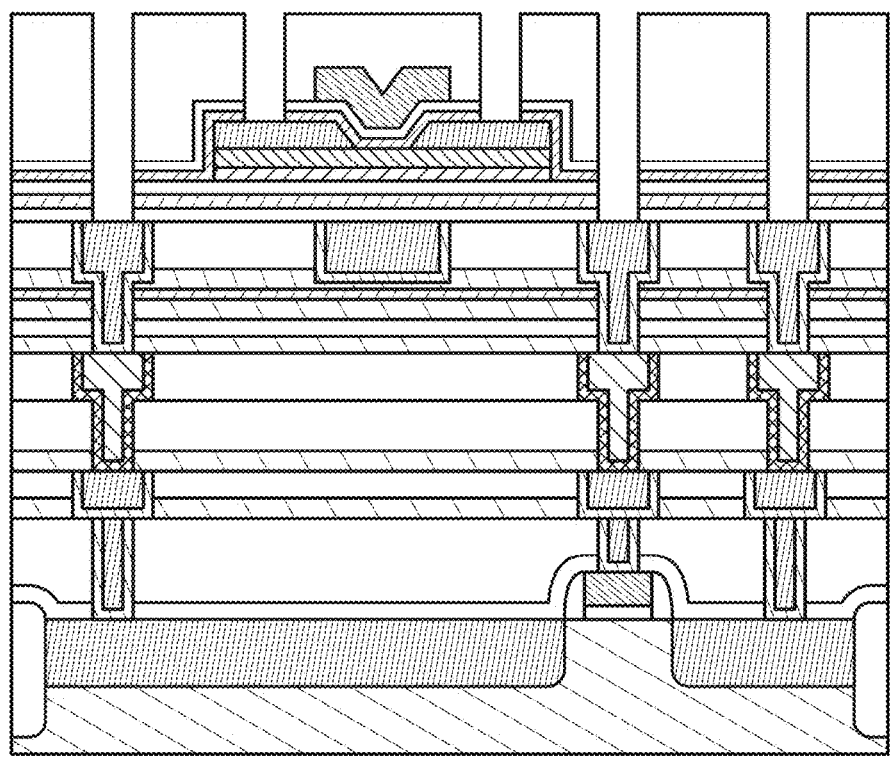
FIGS. 12A and 12B illustrate the example of a method for manufacturing a semiconductor device of an embodiment.

Next, openings which reach the conductor 218a, the conductor 218b, the conductor 218c, the transistor 200, and the like are formed in the insulator 220, the insulator 222, the insulator 224, and the insulator 280 (FIG. 12A).

Figure 12B:
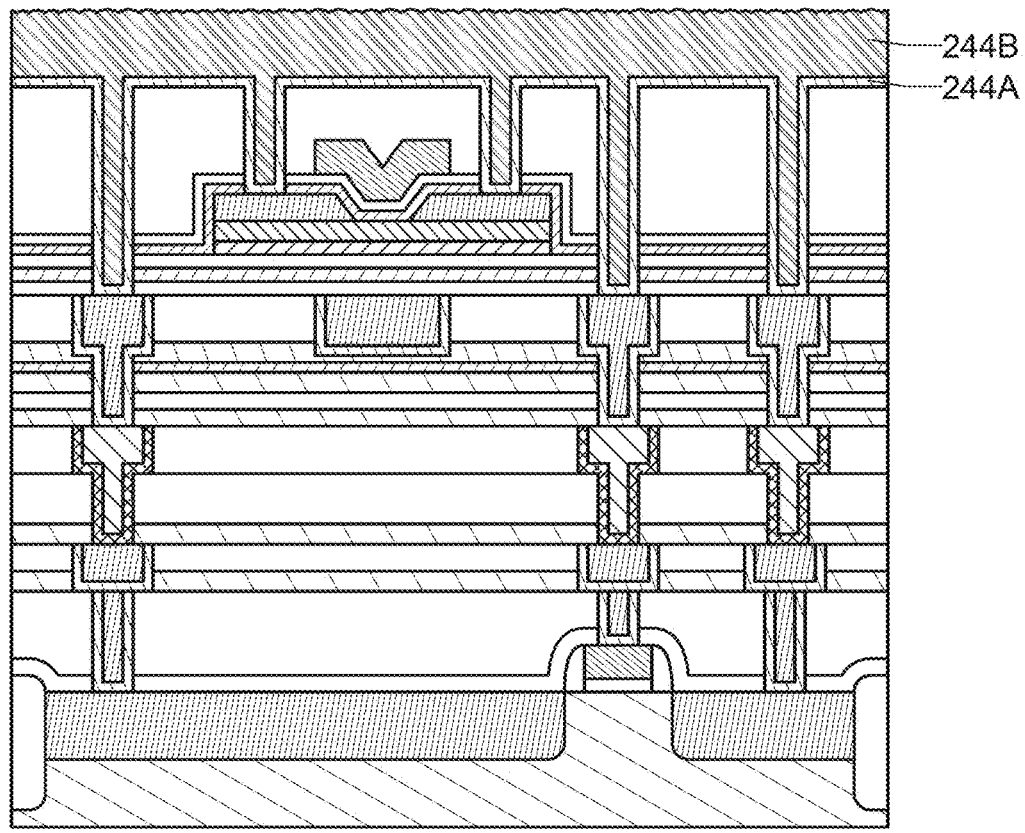
Figure 13:
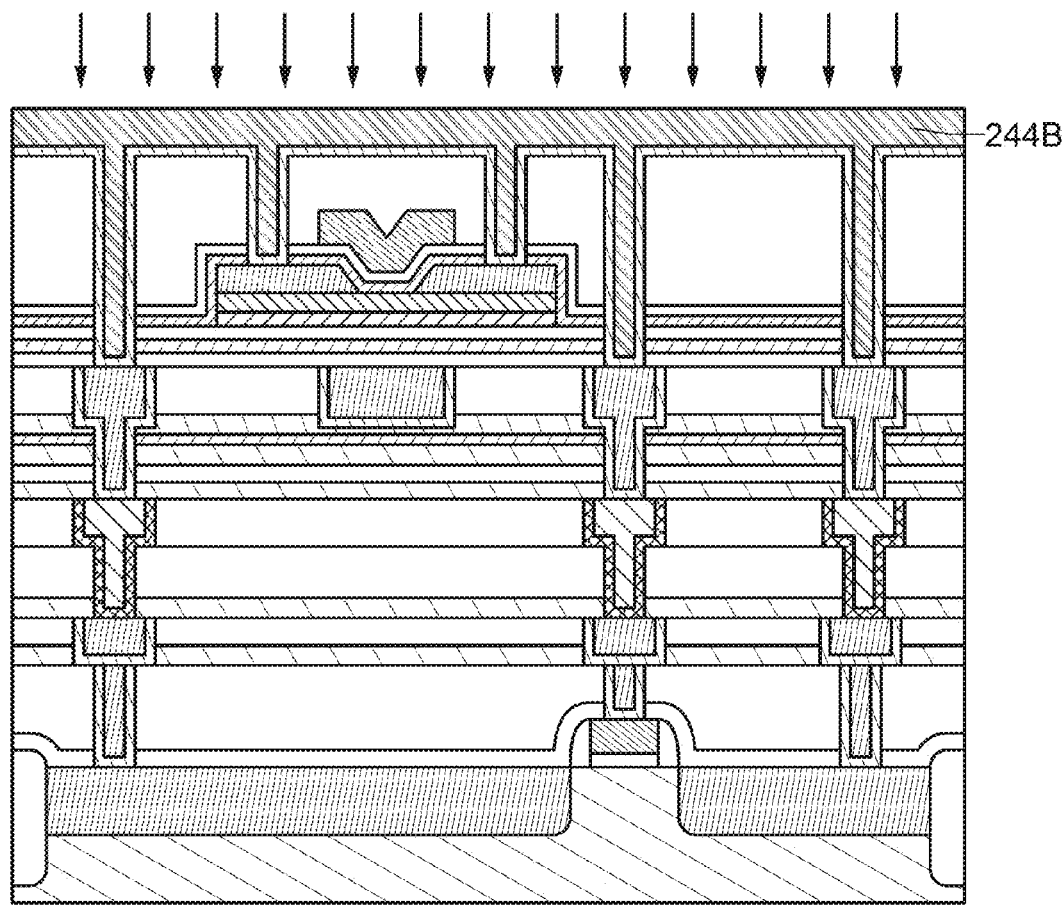
FIG. 13 illustrates the example of a method for manufacturing a semiconductor device of an embodiment.
Figure 14:
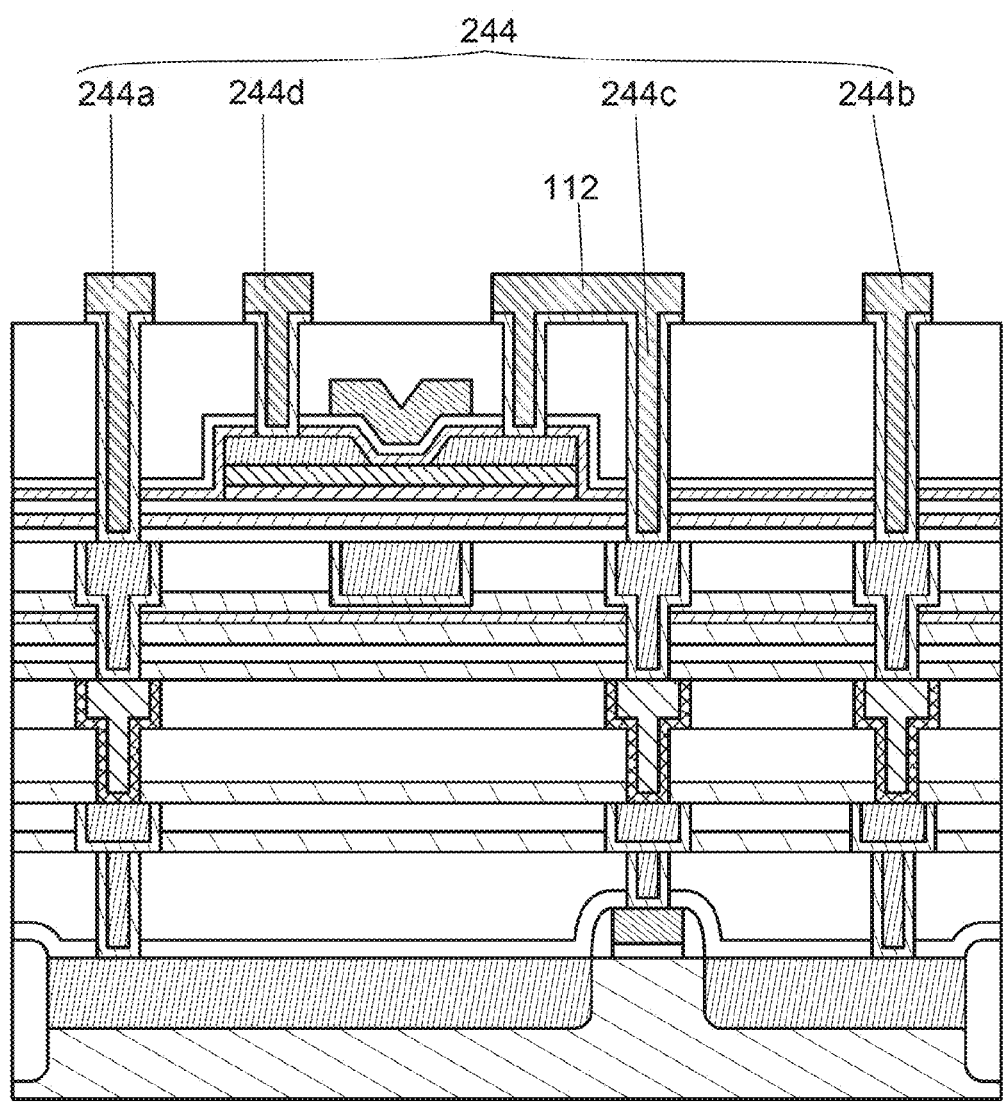
FIG. 14 illustrates the example of a method for manufacturing a semiconductor device of an embodiment.

After that, a conductive film 244A and a conductive film 244B are formed to fill the openings (FIG. 12B). Then, planarization treatment is performed on the conductive film to remove the upper surface of the conductive film 244B; as a result, the thickness of the conductive film 244B is reduced so that the conductive film 244B can be processed by a lithography process (FIG. 13; the arrows in this figure denotes CMP process). Subsequently, unnecessary portions of the conductive film 244A and the conductive film 244B are removed by etching using a resist mask to form a conductor 244a, a conductor 244b, a conductor 244c (the conductor 112), and a conductor 244d (FIG. 14).

Figure 15:
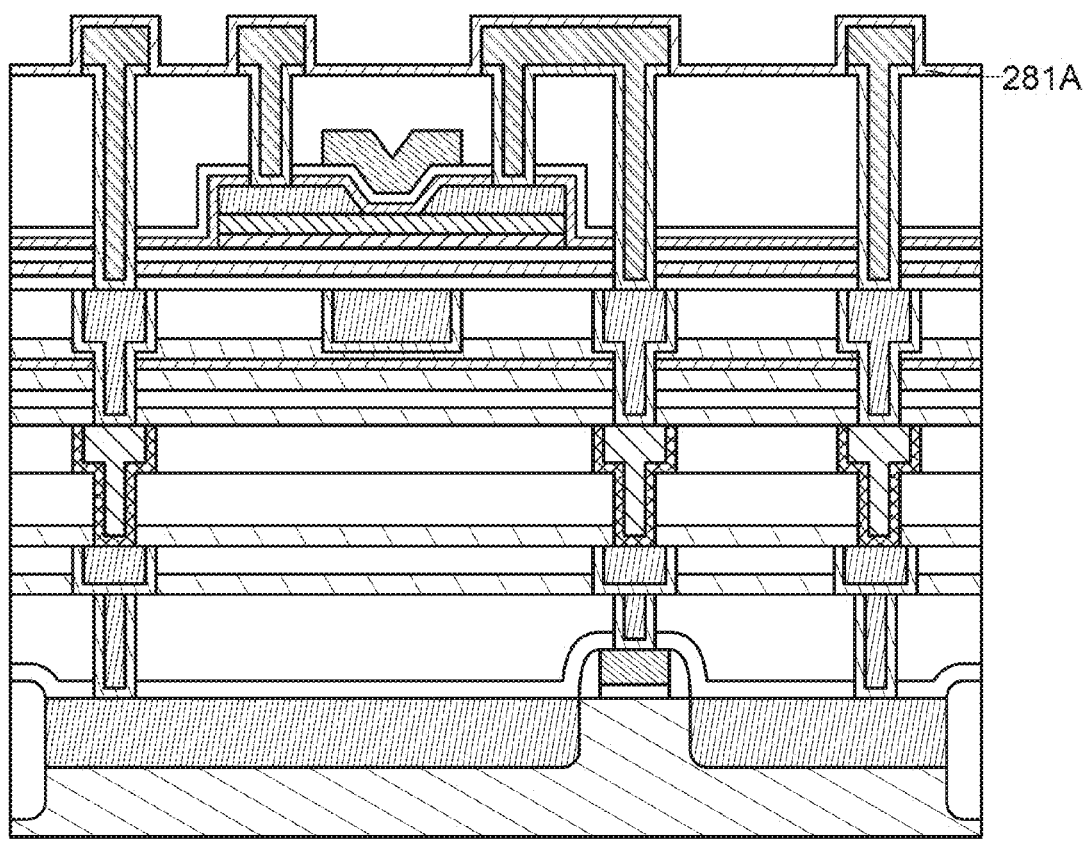
FIG. 15 illustrates the example of a method for manufacturing a semiconductor device of an embodiment.

Then, a barrier film 281A is formed over the insulator 280 and the conductor 244 (FIG. 15). Aluminum oxide formed by an ALD method can be used as the barrier film 281A. A dense insulator including reduced defects such as cracks or pinholes or having a uniform thickness can be formed by an ALD method. The barrier layer 281 can prevent diffusion of impurities contained the conductor 244 and diffusion of part of the conductor 244. The use of aluminum oxide can prevent entry of impurities such as hydrogen and moisture into the transistor 200 in and after a manufacturing process of the transistor.

Figure 16:
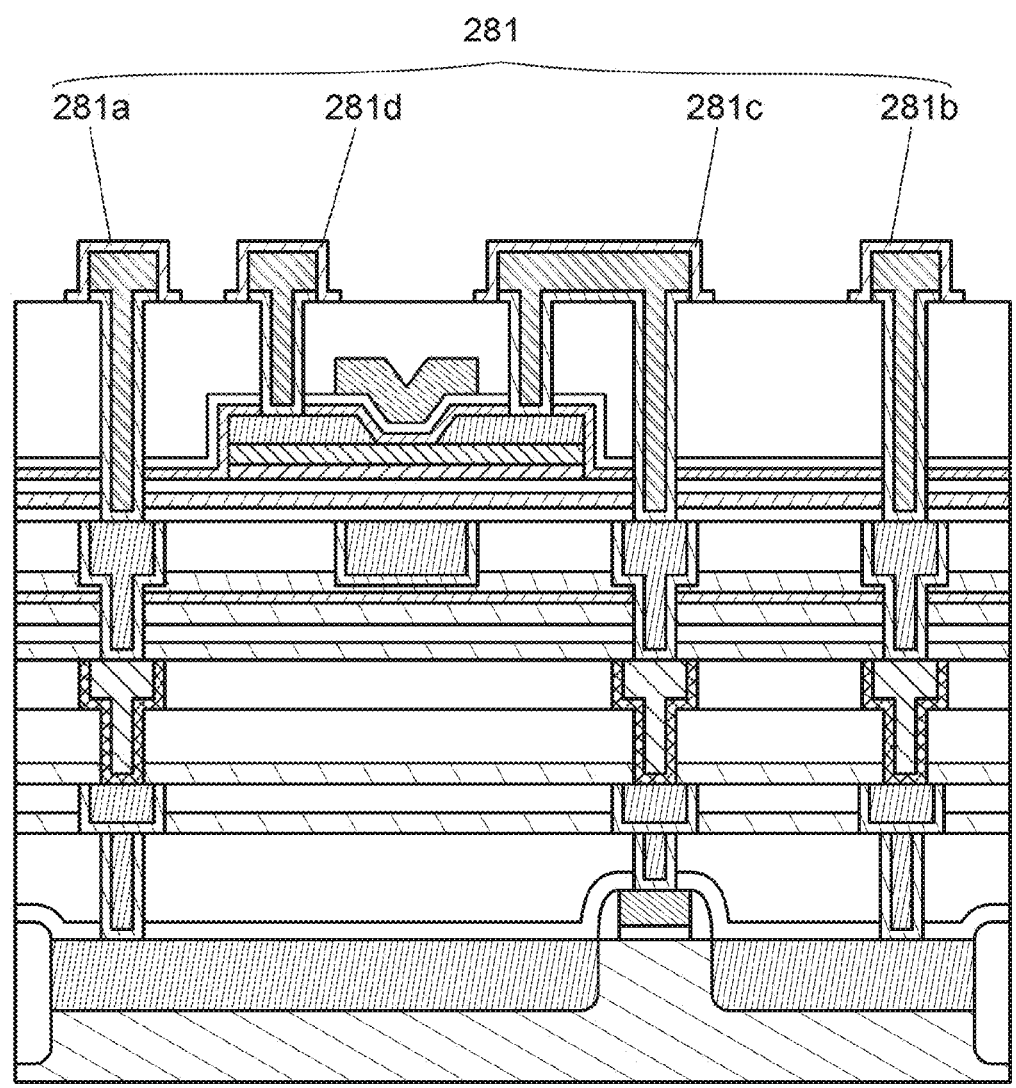
FIG. 16 illustrates the example of a method for manufacturing a semiconductor device of an embodiment.

Next, an unnecessary portion of the barrier film 281A is removed by etching using a resist mask to form a barrier layer 281a, a barrier layer 281b, a barrier layer 281c, and a barrier layer 281d (FIG. 16).

Here, an oxygen-excess region is formed in the insulator 280. To form an oxygen-excess region, for example, oxygen may be added by an ion implantation method, an ion doping method, or plasma treatment.

Figure 17:
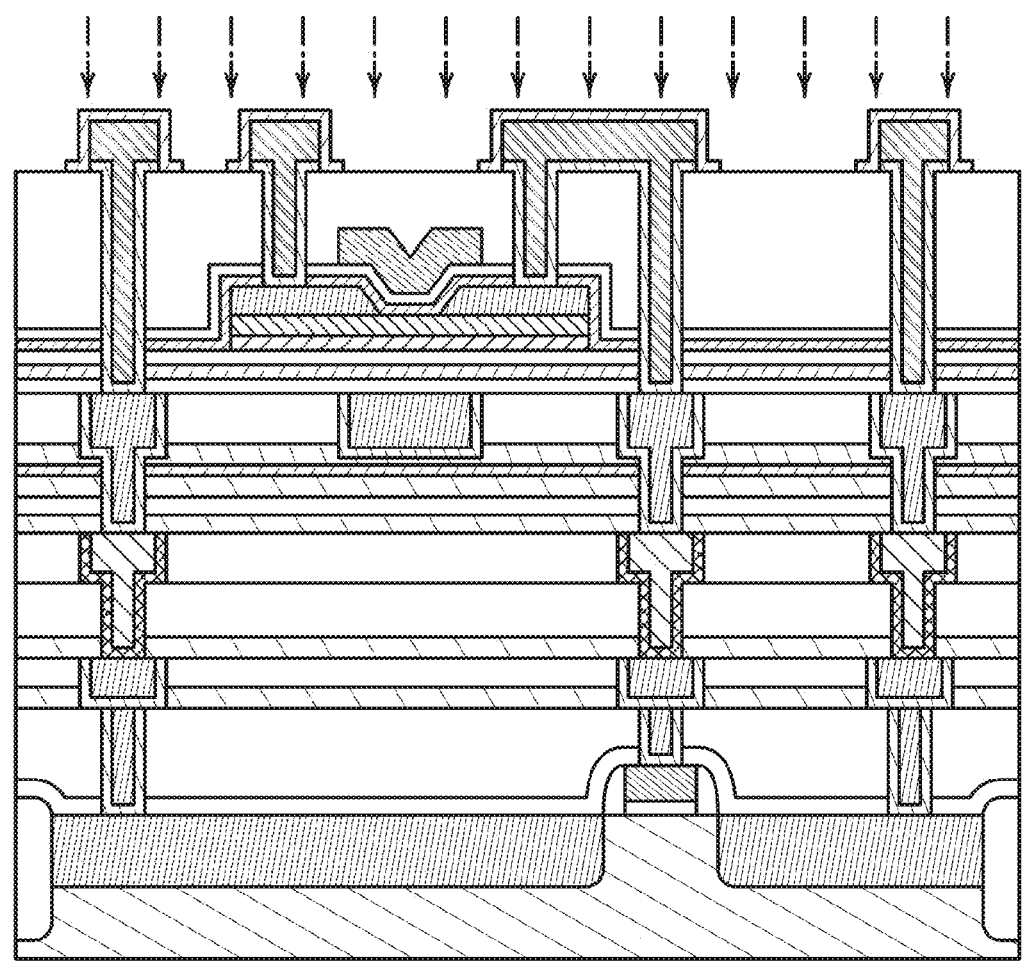
FIG. 17 illustrates the example of a method for manufacturing a semiconductor device of an embodiment.

For example, oxygen plasma treatment is performed (arrows in FIG. 17 denote the plasma treatment). In typical oxygen plasma treatment, the surface of an oxide semiconductor is processed by radicals generated from an oxygen gas by glow discharge plasma. However, as a gas from which plasma is generated, a mixed gas of an oxygen gas and a rare gas may be used, as well as oxygen. For example, oxygen plasma treatment may be performed at a temperature higher than or equal to 250° C. and lower than or equal to 400° C., preferably higher than or equal to 300° C. and lower than or equal to 400° C., in an atmosphere containing an oxidizing gas or under reduced pressure.

The oxygen plasma treatment dehydrates or dehydrogenates the insulator 280 and an oxide 230 which is used as an active layer in the transistor 200, and introduces excess oxygen to the insulator 280; as a result, an oxygen-excess region can be formed. In addition, oxygen vacancies are generated in the dehydrated or dehydrogenated oxide 230 and the resistance of the oxide 230 is reduced. Meanwhile, the excess oxygen in the insulator 280 compensates oxygen vacancies of the oxide 230. Therefore, owing to the oxygen plasma treatment, hydrogen and water that serve as impurities can be removed from the insulator 280. In addition, hydrogen and water that serve as impurities can be removed from the oxide 230 while oxygen vacancies in the oxide 230 are compensated. Thus, the electrical characteristics of the transistor 200 can be improved and variation in the electrical characteristics thereof can be reduced.

The barrier layer 281 can prevent oxidation of the conductor 244 due to oxygen plasma treatment. Note that when the conductor 244 is formed using a conductor with high oxidation resistance, the barrier layer 281 is not necessarily included.

Figure 18:
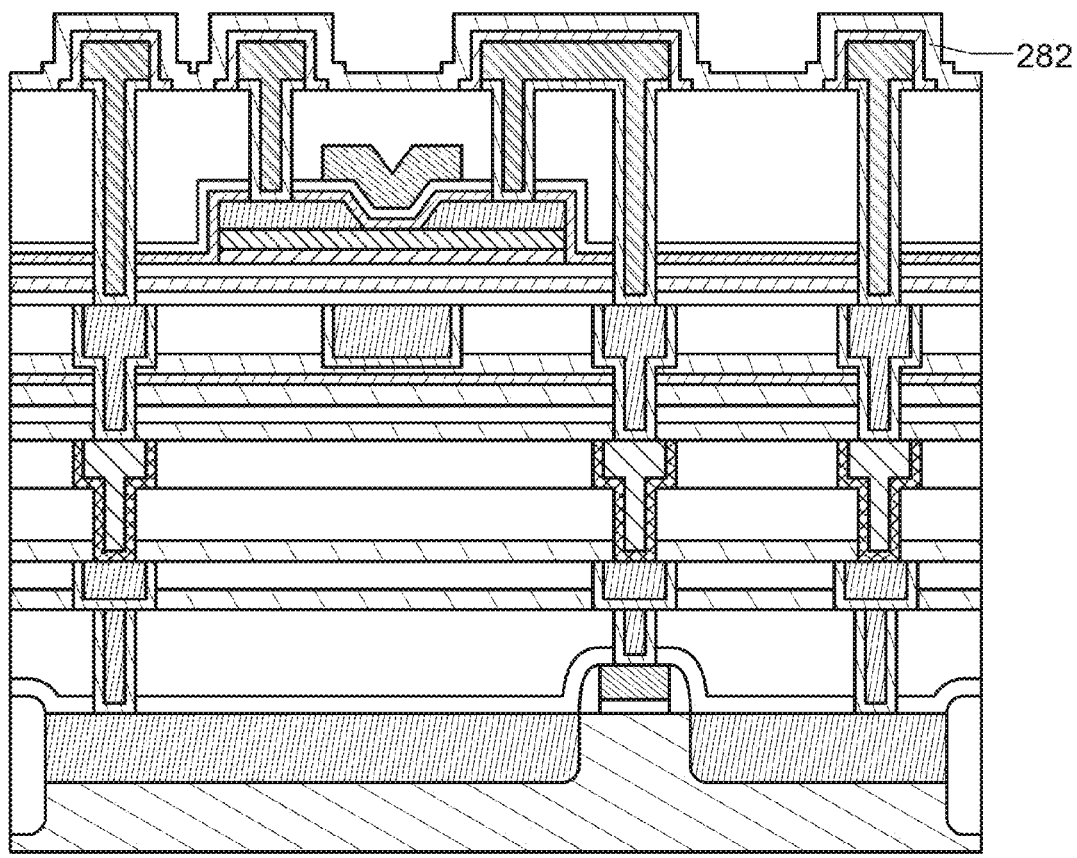
FIG. 18 illustrates the example of a method for manufacturing a semiconductor device of an embodiment.

Next, the insulator 282 is formed over the insulator 280 and the barrier layer 281 (FIG. 18). A method of stacking oxides over the insulator 280 using a sputtering apparatus is given as an example of the oxygen introduction treatment. For example, by forming the insulator 282 in an oxygen gas atmosphere using a sputtering apparatus, oxygen can be introduced into the insulator 280 while the insulator 282 is formed.

During deposition by a sputtering method, ions and sputtered particles exist between a target and the substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The potential relationship is $E_2 > E_1 > E_0$.

The ions in plasma are accelerated by a potential difference ($E_2 - E_0$) and collide with the target; accordingly, the sputtered particles are ejected from the target. These sputtered particles attach to a deposition surface, thereby forming a film. Some ions recoil by the target and might be taken into the insulator 280 below the formed film as recoil ions through the formed film. The ions in the plasma are accelerated by a potential difference ($E_2 - E_1$) and collide with the deposition surface. Some ions reach the inside of the insulator 110. The ions are taken into the insulator 280; accordingly, a region into which the ions are taken is formed in the insulator 280. That is, an oxygen-excess region is formed in the insulator 280 in the case where the ions include oxygen.

Oxygen (at least including any of oxygen radicals, oxygen atoms, and oxygen ions) may be introduced into the insulator 280 through the insulator 282, so that a region containing excess oxygen may be formed. Oxygen can be introduced by an ion implantation method, an ion doping method, a plasma immersion ion implantation method, plasma treatment, or the like. By performing the oxygen introduction treatment through the insulator 282, the oxygen-excess region can be formed in a state where the insulator 280 is protected.

Next, heat treatment may be performed. The heat treatment may be performed at a temperature higher than or equal to 250° C. and lower than or equal to 650° C., preferably higher than or equal to 300° C. and lower than or equal to 500° C., further preferably higher than or equal to 350° C. and lower than or equal to 400° C., in an inert gas atmosphere, an atmosphere containing an oxidizing gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate released oxygen. For the heat treatment, lamp heating can be performed with the use of an RTA apparatus.

By the heat treatment, excess oxygen introduced into the insulator 280 is diffused into the insulator 280. Here, the insulator 280 is enclosed by the insulator 222 and the insulator 282 having a barrier property against oxygen. Therefore, excess oxygen introduced into the insulator 280 is prevented from being released to the outside and is supplied to the oxide 230 efficiently.

Moreover, by the heat treatment, hydrogen in the insulator 280 is moved to the insulator 282. Hydrogen moved to the insulator 282 reacts with oxygen in the insulator 282, whereby water is produced in some cases. The formed water is released upward from the insulator 282. Thus, hydrogen and water as impurities in the insulator 280 can be reduced. Note that in the case where the insulator 282 is formed using aluminum oxide, the insulator 282 may function as a catalyst.

Oxygen supplied to the oxide 230 compensates oxygen vacancies in the oxide 230. Thus, the oxide where the channel is formed in the transistor 200 can be an oxide semiconductor with a low density of defect states and stable characteristics. That is, a change in electrical characteristics of the transistor 200 can be prevented and the reliability can be improved.

For the formation of the region containing excess oxygen by introduction of oxygen to the deposited insulator 280, oxygen plasma treatment, an ion implantation treatment, heat treatment, or combination thereof may be used.

Then, the insulator 130 covering the top and side surfaces of the conductor 112 is formed over the insulator 282. The insulator 130 can be formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

Then, the conductor 116 is formed over the insulator 130. Note that the conductor 116 can be formed using a material and a method similar to those used for forming the conductor 112.

Next, the insulator 150 covering the capacitor 100 is formed. An insulator to be the insulator 150 can be formed using a material and a method similar to those used for forming the insulator 320 and the like.

Figure 19:
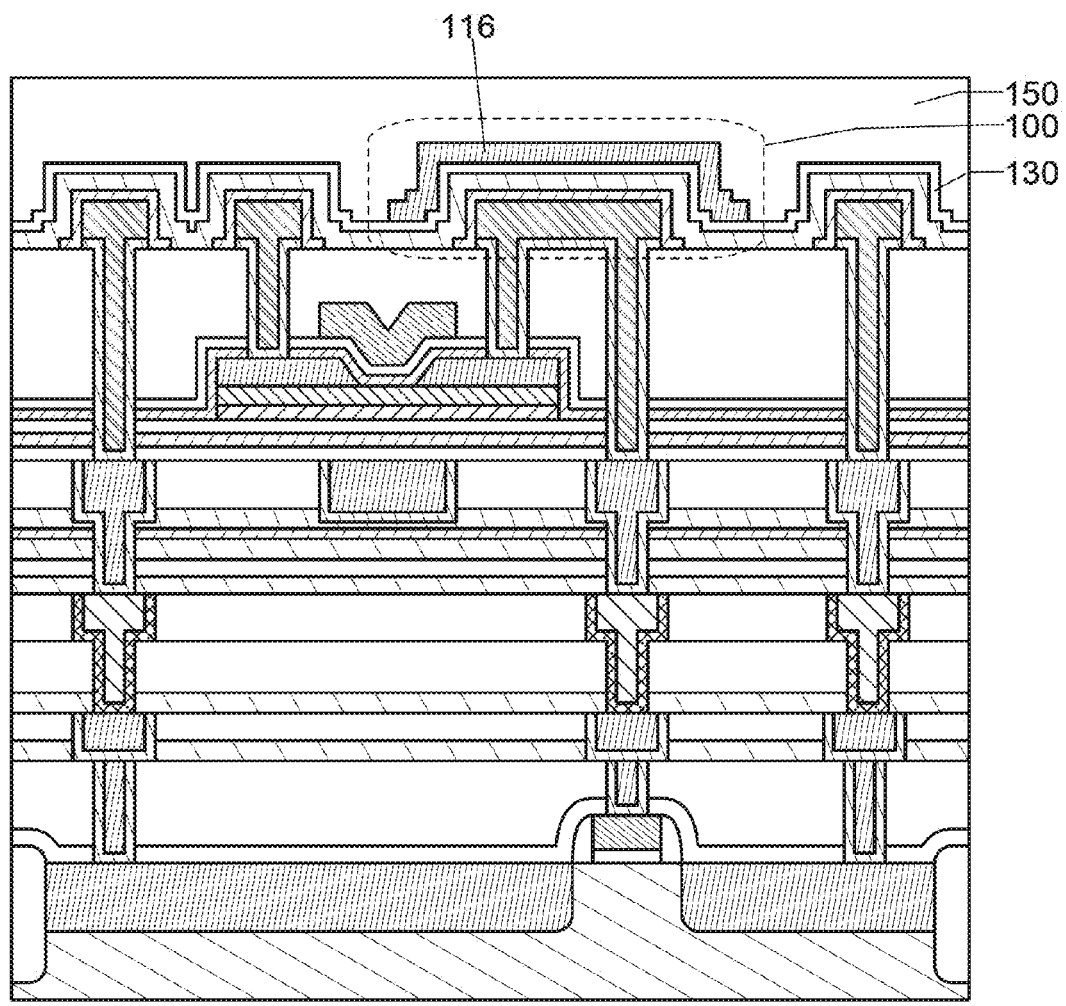
FIG. 19 illustrates the example of a method for manufacturing a semiconductor device of an embodiment.

Through the above steps, the semiconductor device of one embodiment of the present invention can be manufactured (FIG. 19).

In the semiconductor device including the transistor including an oxide semiconductor and manufactured through the above steps, a change in electrical characteristics can be prevented and the reliability can be improved. The transistor including an oxide semiconductor with high on-state current can be provided. The transistor including an oxide semiconductor with low off-state current can be provided. The semiconductor device with low power consumption can be provided.

At least part of this embodiment can be implemented in combination with any of the other embodiments described in this specification as appropriate.

Embodiment 3

In this embodiment, one embodiment of a semiconductor device will be described with reference to FIGS. 20A to 20C, FIGS. 21A to 21C, FIGS. 22A to 22C, FIGS. 23A to 23C, FIGS. 24A to 24C, FIGS. 25A to 25C, FIGS. 26A to 26C, FIGS. 27A to 27E, FIGS. 28A to 28D, FIGS. 29A to 29C, and FIGS. 30A to 30C.

<Transistor Structure 1>

Figure 20A:
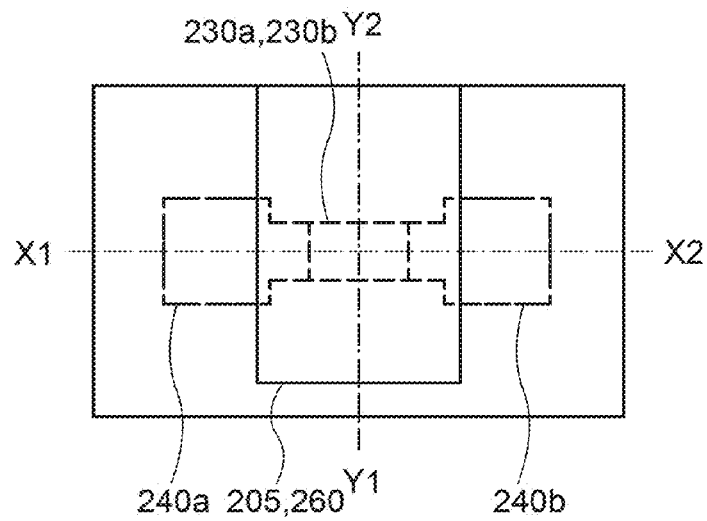
FIG. 20A is a top view of a transistor of an embodiment and FIGS. 20B and 20C illustrate cross-sectional structures of the transistor.
Figure 20B:
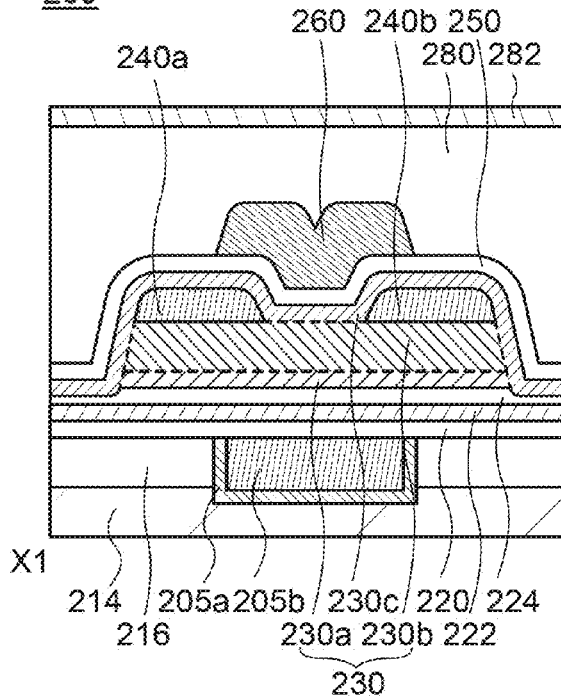
Figure 20C:
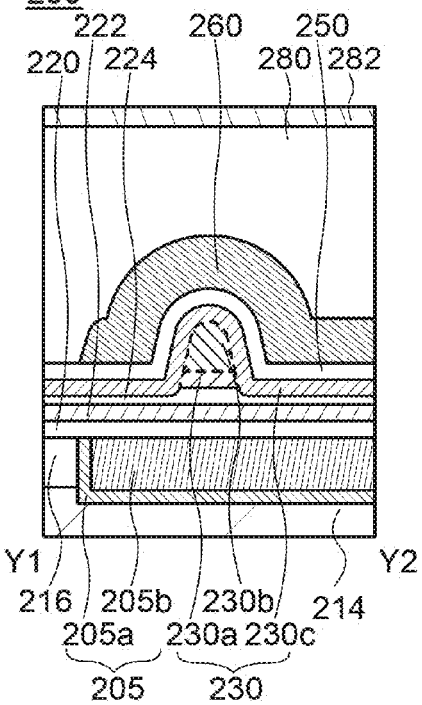

An example of a transistor of one embodiment of the present invention is described below. FIGS. 20A to 20C are a top view and cross-sectional views illustrating the transistor of one embodiment of the present invention. FIG. 20A is a top view, FIG. 20B is a cross-sectional view taken along the dashed-dotted line X1-X2 in FIG. 20A, and FIG. 20C is a cross-sectional view taken along the dashed-dotted line Y1-Y2 in FIG. 20A. Note that for simplification of the drawing, some components are not illustrated in the top view of FIG. 20A.

The transistor 200 includes the conductor 205 (a conductor 205a and a conductor 205b) and a conductor 260 (a conductor 260a and a conductor 260b) which function as gate electrodes; the insulator 220, the insulator 222, the insulator 224, and an insulator 250 which function as gate insulating layers; the oxide 230 (an oxide 230a, an oxide 230b, and an oxide 230c) which includes a region where a channel is formed; a conductor 240a which functions as one of a source electrode and a drain electrode; a conductor 240b which functions as the other of the source electrode and the drain electrode; the insulator 280 which contains excess oxygen; and the insulator 282 which has a barrier property.

The oxide 230 includes the oxide 230a, the oxide 230b over the oxide 230a, and the oxide 230c over the oxide 230b. When the transistor 200 is turned on, current flows (a channel is formed) mainly in the oxide 230b. Although current sometimes flows through a region in the vicinity of the interface (a mixed region in some cases) between the oxide 230b and each of the oxide 230a and the oxide 230c, the oxide 230a and the oxide 230c function as insulators at the other region.

As illustrated in FIGS. 20A to 20C, the oxide 230c is preferably provided to cover side surfaces of the oxide 230a and the oxide 230b. The oxide 230c, which is provided between the insulator 280 and the oxide 230b including the region where the channel is formed, can prevent impurities such as hydrogen, water, and halogen from diffusing from the insulator 280 into the oxide 230b.

A metal film containing an element selected from molybdenum, titanium, tantalum, tungsten, aluminum, copper, chromium, neodymium, and scandium; a metal nitride film containing any of the elements as its component (e.g., a tantalum nitride film, a titanium nitride film, a molybdenum nitride film, or a tungsten nitride film); or the like is used as the conductor 205. In particular, a metal nitride film such as a tantalum nitride film is preferable because it has a barrier property against hydrogen or oxygen and is difficult to oxidize (has high oxidation resistance). Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

For example, a conductor having a barrier property against hydrogen, e.g., tantalum nitride, may be used as the conductor 205a, and tungsten, which has high conductivity, may be stacked thereover as the conductor 205b. The use of the combination of the materials can prevent diffusion of hydrogen into the oxide 230 while conductivity of a wiring is ensured. Note that a two-layer structure of the conductor 205a and the conductor 205b is illustrated in FIGS. 20A to 20C; however, one embodiment of the present invention is not limited thereto, and a single-layer structure or a stacked-layer structure of three or more layers may be used. For example, a structure where a conductor having a barrier property and a conductor which has high conductivity are provided with a conductor which is highly adhesive to the conductor having a barrier property and the conductor which has high conductivity located therebetween may be employed.

Each of the insulator 220 and the insulator 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with an oxide in the transistor 200, oxygen vacancies in the oxide can be compensated. Note that the insulator 222 and the insulator 224 are not necessarily formed of the same material.

The insulator 222 preferably has a single-layer structure or a stacked-layer structure formed using an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), (Ba,Sr)$TiO_3$ (BST), or the like. In particular, an insulating film having a barrier property against oxygen or hydrogen, e.g., an aluminum oxide film or a hafnium oxide film, is preferably used. The insulator 222 formed of such a material functions as a layer which prevents release of oxygen from the oxide 230 and entry of impurities such as hydrogen from the outside.

Alternatively, aluminum oxide, bismuth oxide, germanium oxide, niobium oxide, silicon oxide, titanium oxide, tungsten oxide, yttrium oxide, or zirconium oxide may be added to these insulators, for example. These insulators may be subjected to nitriding treatment. A layer of silicon oxide, silicon oxynitride, or silicon nitride may be stacked over the insulator.

Note that the insulator 220, the insulator 222, and the insulator 224 each may have a stacked-layer structure of two or more layers. In that case, the stacked layers are not necessarily formed of the same material but may be formed of different materials.

Since the insulator 222 including a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature higher than or equal to 125° C. and lower than or equal to 450° C., typically a temperature higher than or equal to 150° C. and lower than or equal to 300° C.) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

The threshold voltages can be controlled by appropriate adjustment of the thicknesses of the insulator 220, the insulator 222, and the insulator 224. For example, when the total thickness of the insulator 220, the insulator 222, and the insulator 224 is reduced, a voltage is efficiently applied from the conductor 205, resulting in low power consumption of the transistor. The total thickness of the insulator 220, the insulator 222, and the insulator 224 is preferably less than or equal to 65 nm, further preferably less than or equal to 20 nm.

Thus, a transistor having a low leakage current in an off state can be provided. A transistor with stable electrical characteristics can be provided. A transistor having a high on-state current can be provided. A transistor with a small subthreshold swing value can be provided. A highly reliable transistor can be provided.

The oxide 230a, the oxide 230b, and the oxide 230c are each formed using a metal oxide such as an In-M-Zn oxide (M is Al, Ga, Y, or Sn). An In—Ga oxide or an In—Zn oxide may be used as the oxide 230.

The oxide 230 according to the present invention is described below.

An oxide used as the oxide 230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide contains indium, the element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide according to the present invention are described with reference to FIGS. 31A to 31C. Note that the proportion of oxygen atoms is not illustrated in FIGS. 31A to 31C. The terms of the atomic ratio of indium, the element M, and zinc contained in the oxide are denoted by [In], [M], and [Zn], respectively.

In FIGS. 31A to 31C, broken lines indicate a line where the atomic ratio of [In]:[M]:[Zn] is $(1+\alpha):(1-\alpha):1$ $(-1 \leq \alpha \leq 1)$, a line where the atomic ratio of [In]:[M]:[Zn] is $(1+\alpha):(1-\alpha):2$, a line where the atomic ratio of [In]:[M]:[Zn] is $(1+\alpha):(1-\alpha):3$, a line where the atomic ratio of [In]:[M]:[Zn] is $(1+\alpha):(1-\alpha):4$, and a line where the atomic ratio of [In]:[M]:[Zn] is $(1+\alpha):(1-\alpha):5$.

Dashed-dotted lines indicate a line where the atomic ratio of [In]:[M]:[Zn] is $1:1:\beta$ $(\beta \geq 0)$, a line where the atomic ratio of [In]:[M]:[Zn] is $1:2:\beta$, a line where the atomic ratio of [In]:[M]:[Zn] is $1:3:\beta$, a line where the atomic ratio of [In]:[M]:[Zn] is $1:4:\beta$, a line where the atomic ratio of [In]:[M]:[Zn] is $2:1:\beta$, and a line where the atomic ratio of [In]:[M]:[Zn] is $5:1:\beta$.

Dashed-double dotted lines indicate a line where the atomic ratio of [In]:[M]:[Zn] is $(1+\gamma):2:(1-\gamma)$ $(-1 \leq \gamma \leq 1)$. An oxide illustrated in FIGS. 31A to 31C with an atomic ratio of [In]:[M]:[Zn]=0:2:1 and the vicinity thereof are likely to have a spinel crystal structure.

FIGS. 31A and 31B illustrate examples of the preferred ranges of the atomic ratio of indium, the element M, and zinc contained in an oxide in one embodiment of the present invention.

Figure 32:
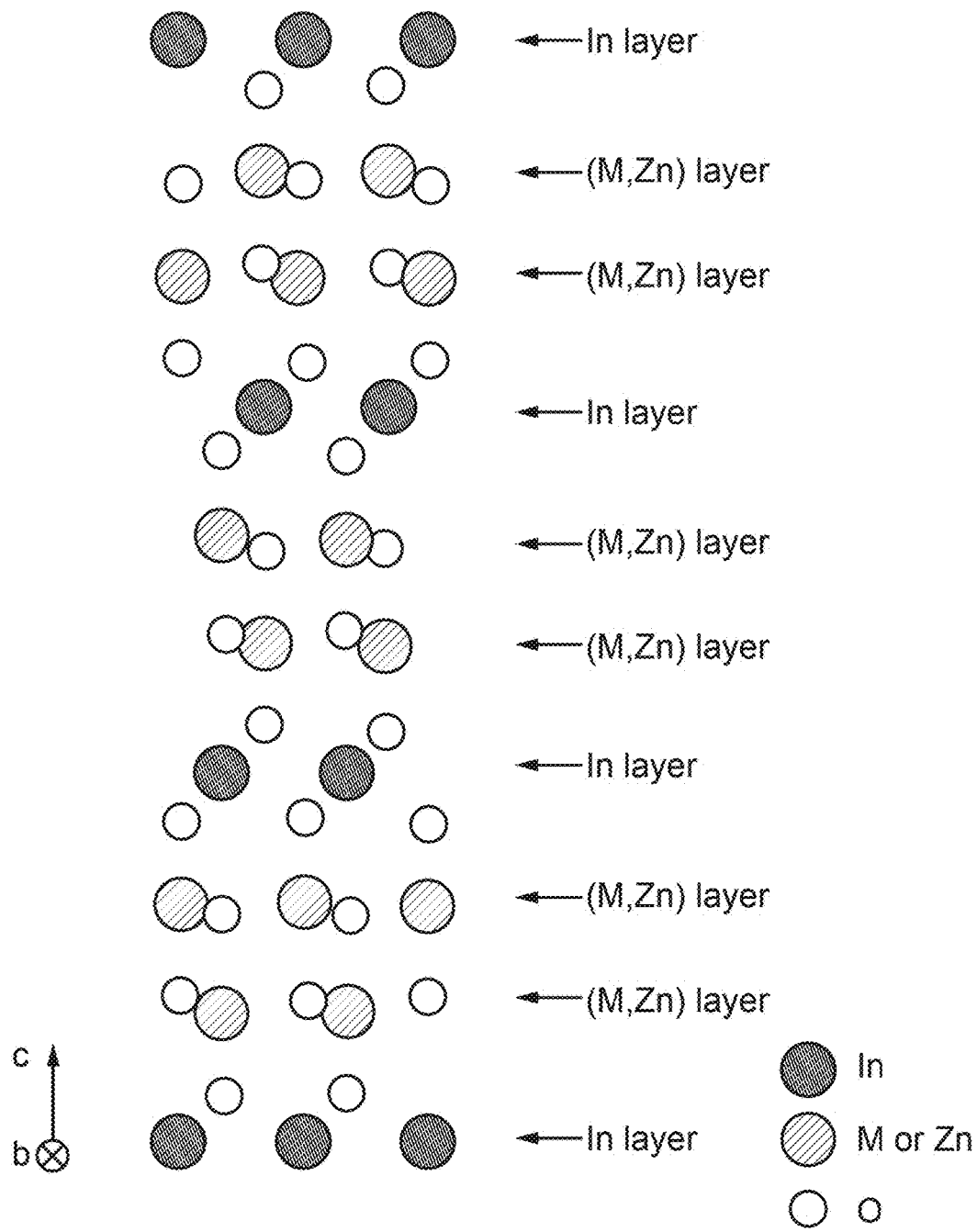
FIG. 32 illustrates an $InMZnO_4$ crystal.

FIG. 32 illustrates an example of the crystal structure of InMZnO$_4$ whose atomic ratio of [In]:[M]:[Zn] is 1:1:1. The crystal structure illustrated in FIG. 32 is InMZnO$_4$ observed from a direction parallel to a b-axis. Note that a metal element in a layer that contains M, Zn, and oxygen (hereinafter, this layer is referred to as an "(M,Zn) layer") in FIG. 32 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 32.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio of [In]:[M]:[Zn] is 1:1:2 has a layered structure that includes one In layer for every three (M,Zn) layers. In other words, if [Zn] is larger than [In] and [M], the proportion of the (M,Zn) layer to the In layer becomes higher when the oxide is crystallized.

Note that in the case where the number of (M,Zn) layers with respect to one In layer is not an integer in the oxide, the oxide might have a plurality of kinds of layered structures where the number of (M,Zn) layers with respect to one In layer is an integer. For example, in the case of [In]:[M]:[Zn]=1:1:1.5, the oxide might have the following layered structures: a layered structure of one In layer for every two (M,Zn) layers and a layered structure of one In layer for every three (M,Zn) layers.

For example, in the case where the oxide is deposited with a sputtering apparatus, a film having an atomic ratio deviated from the atomic ratio of a target is formed. In addition, [Zn] in the film might be smaller than [Zn] in the target depending on the substrate temperature in deposition.

A plurality of phases (e.g., two phases or three phases) exist in the oxide in some cases. For example, with an atomic ratio of [In]:[M]:[Zn] that is close to 0:2:1, two phases of a spinel crystal structure and a layered crystal structure are likely to exist. In addition, with an atomic ratio of [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have a higher carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has a higher carrier mobility than an oxide having a low content of indium.

In contrast, carrier mobility decreases as the indium content and the zinc content in an oxide become lower. Thus, with an atomic ratio of [In]:[M]:[Zn]=0:1:0 and the vicinity thereof (e.g., a region C in FIG. 31C), insulation performance becomes better.

Accordingly, an oxide of one embodiment of the present invention preferably has an atomic ratio represented by a region A in FIG. 31A. With the atomic ratio, a layered structure with high carrier mobility and a few grain boundaries is easily obtained.

A region B in FIG. 31B represents an atomic ratio of [In]:[M]:[Zn]=4:2:3 to 4:2:4.1 and the vicinity thereof. The vicinity includes an atomic ratio of [In]:[M]:[Zn]=5:3:4. An oxide with an atomic ratio represented by the region B is an excellent oxide that has particularly high crystallinity and high carrier mobility.

Note that the condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with a low carrier density is preferably used for the transistor. For example, an oxide whose carrier density is lower than $8\times10^{11}/cm^3$, preferably lower than $1\times10^{11}/cm^3$, and further preferably lower than $1\times10^{10}/cm^3$, and higher than or equal to $1\times10^{-9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. As examples of the impurities, hydrogen, nitrogen, alkali metal, alkaline earth metal, iron, nickel, silicon, and the like are given.

Here, the influence of impurities in the oxide is described.

When silicon or carbon that is a Group 14 element is contained in the oxide, defect states are formed. Thus, the concentration of silicon or carbon (measured by secondary ion mass spectrometry (SIMS)) is set to be lower than or equal to $2\times10^{18}$ atoms/cm$^3$, preferably lower than or equal to $2\times10^{17}$ atoms/cm$^3$, in the oxide or around an interface with the oxide.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal measured by SIMS is set to be lower than or equal to $1\times10^{18}$ atoms/cm$^3$, preferably lower than or equal to $2\times10^{16}$ atoms/cm$^3$.

When containing nitrogen, the oxide easily becomes n-type by generation of electrons serving as carriers and an increase of carrier density. Thus, a transistor whose semiconductor includes an oxide containing nitrogen is likely to be normally-on. For this reason, nitrogen in the oxide is preferably reduced as much as possible; for example, the concentration of nitrogen in the oxide measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, hydrogen in the oxide is preferably reduced as much as possible. Specifically, the concentration of hydrogen in the oxide measured by SIMS is set to be lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide with sufficiently reduced impurity concentration is used for a channel region in a transistor, the transistor can have stable electrical characteristics.

Next, the case where the oxide has a two-layer structure or a three-layer structure is described. A band diagram of a stacked-layer structure of an oxide S1, an oxide S2, and an oxide S3 and insulators that are in contact with the stacked-layer structure, a band diagram of a stacked-layer structure of the oxide S2 and the oxide S3 and insulators that are in contact with the stacked-layer structure, and a band diagram of a stacked-layer structure of the oxide S1 and the oxide S2 and insulators that are in contact with the stacked-layer structure are described with reference to FIGS. 33A to 33C.

Figure 33A:
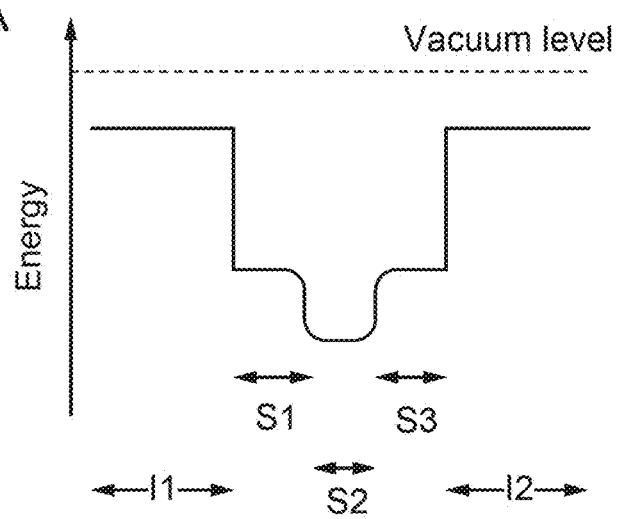
FIGS. 33A to 33C are band diagrams of stacked-layer structures of oxide semiconductors.
Figure 33B:
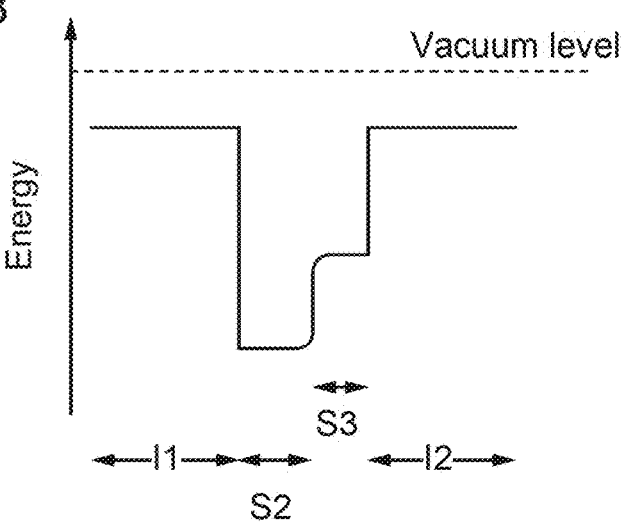
Figure 33C:
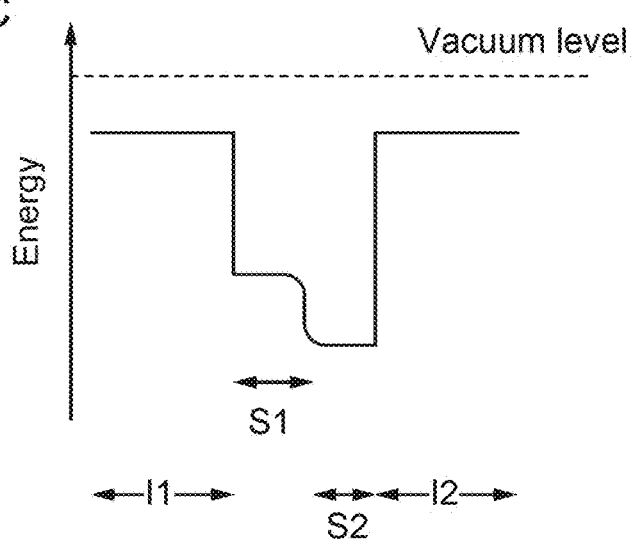

FIG. 33A is an example of a band diagram of a stacked-layer structure including an insulator I1, the oxide S1, the oxide S2, the oxide S3, and an insulator I2 in a thickness direction. FIG. 33B is an example of a band diagram of a stacked-layer structure including the insulator I1, the oxide S2, the oxide S3, and the insulator I2 in a thickness direction. FIG. 33C is an example of a band diagram of a stacked-layer structure including the insulator I1, the oxide S1, the oxide S2, and the insulator I2 in a thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxide S1 and the oxide S3 is closer to the vacuum level than that of the oxide S2. Typically, a difference in the energy level between the conduction band minimum of the oxide S2 and the conduction band minimum of each of the oxide S1 and the oxide S3 is preferably greater than or equal to 0.15 eV or greater than or equal to 0.5 eV, and less than or equal to 2 eV or less than or equal to 1 eV. That is, a difference in the electron affinity between each of the oxide S1 and the oxide S3, and the oxide S2 is preferably greater than or equal to 0.15 eV or greater than or equal to 0.5 eV, and less than or equal to 2 eV or less than or equal to 1 eV.

As shown in FIGS. 33A to 33C, the energy level of the conduction band minimum of each of the oxide S1, the oxide S2, and the oxide S3 is gradually varied. In other words, the energy level of the conduction band minimum is continuously varied or continuously connected. In order to obtain such a band diagram, the density of defect states in a mixed layer formed at the interface between the oxide S1 and the oxide S2 or the interface between the oxide S2 and the oxide S3 is preferably made low.

Specifically, when the oxide S1 and the oxide S2 or the oxide S2 and the oxide S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxide S1 and the oxide S3.

At this time, the oxide S2 serves as a main carrier path. Since the density of defect states at the interface between the oxide S1 and the oxide S2 and the interface between the oxide S2 and the oxide S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxide S1 and the oxide S3 can make the trap state apart from the oxide S2. This structure can prevent the positive shift of the threshold voltage of the transistor.

A material whose conductivity is sufficiently lower than that of the oxide S2 is used for the oxide S1 and the oxide S3. In that case, the oxide S2, the interface between the oxide S1 and the oxide S2, and the interface between the oxide S2 and the oxide S3 mainly function as a channel region. For example, an oxide with high insulation performance and the atomic ratio represented by the region C in FIG. 31C may be used as each of the oxide S1 and the oxide S3. Note that the region C in FIG. 31C represents the atomic ratio of [In]:[M]:[Zn]=0:1:0 and the vicinity thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2, as each of the oxide S1 and the oxide S3. In addition, it is suitable to use an oxide with sufficiently high insulation performance and an atomic ratio where [M]/([Zn]+[In]) is greater than or equal to 1 as the oxide S3.

The insulator 250 can have a single-layer structure or a stacked-layer structure using, for example, one or more of an insulator containing silicon oxide, silicon oxynitride, silicon nitride oxide, aluminum oxide, hafnium oxide, tantalum oxide, zirconium oxide, lead zirconate titanate (PZT), strontium titanate (SrTiO$_3$), (Ba,Sr)TiO$_3$ (BST), or the like. Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Like the insulator 224, the insulator 250 is preferably formed using an oxide insulator that contains oxygen in excess of the stoichiometric composition. When such an insulator containing excess oxygen is provided in contact with the oxide 230, oxygen vacancies in the oxide 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen or hydrogen, can be used. The insulator 250 formed of such a material each serve as a layer that prevents release of oxygen from the oxide 230 and entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, the threshold voltage of the transistor 200 can be shifted in the positive direction. The transistor 200 having the structure is a normally-off transistor which is in a non-conduction state (also referred to as an off state) even when the gate voltage is 0 V.

In addition to the insulator 250, a barrier film may be provided between the oxide 230 and the conductor 260 in the semiconductor device in FIGS. 20A to 20C. Alternatively, the oxide 230c may have a barrier property.

For example, an insulating film containing excess oxygen is provided in contact with the oxide 230 and enclosed by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide 230.

One of the conductor 240a and the conductor 240b functions as a source electrode, and the other thereof functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductor 240a and the conductor 240b. In particular, a metal nitride film such as a tantalum nitride film is preferable because it has a barrier property against hydrogen or oxygen and has high oxidation resistance.

Although a single-layer structure is illustrated in FIGS. 20A to 20C, a stacked-layer structure of two or more layers may be used. For example, a tantalum nitride film and a tungsten film may be stacked. Alternatively, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. In particular, a metal nitride film such as a tantalum nitride film is preferable because it has a barrier property against hydrogen or oxygen and has high oxidation resistance. Furthermore, one or both of manganese and zirconium may be used. Alternatively, a semiconductor typified by polycrystalline silicon doped with an impurity element such as phosphorus, or a silicide such as nickel silicide may be used. Although a single-layer structure is illustrated in FIGS. 20A to 20C, a stacked-layer structure of two or more layers may be used.

A two-layer structure where a titanium film is stacked over an aluminum film may be employed, for example. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked-layer structure using any of the above-described light-transmitting conductive materials and any of the above-described metals.

Next, the insulator 280 and the insulator 282 are provided over the transistor 200.

The insulator 280 preferably includes oxide containing oxygen in excess of that in the stoichiometric composition. That is, in the insulator 280, a region containing oxygen in excess of that in the stoichiometric composition (hereinafter also referred to as oxygen-excess region) is preferably formed. In particular, in the case of using an oxide semiconductor in the transistor 200, when an insulator including an oxygen-excess region is provided as an interlayer film or the like in the vicinity of the transistor 200, oxygen vacancies in the transistor 200 are reduced, whereby the reliability can be improved.

As the insulator including the oxygen-excess region, specifically, an oxide material that releases part of oxygen by heating is preferably used. An oxide that releases part of oxygen by heating is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$, in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 that covers the transistor 200 may function as a planarization film that covers a roughness thereunder.

The insulator 282 is preferably formed using an insulating film having a barrier property against oxygen or hydrogen, e.g., an aluminum oxide film or hafnium oxide film. The insulator 282 formed of such a material each serve as a layer that prevents release of oxygen from the oxide 230 and entry of an impurity such as hydrogen from the outside.

The above structure makes it possible to provide a transistor including an oxide semiconductor with high on-state current. Alternatively, a transistor including an oxide semiconductor with low off-state current can be provided. Furthermore, when the transistor with the above structure is used in a semiconductor device, a change in the electrical characteristics of the semiconductor device can be reduced, and the reliability thereof can be improved. Alternatively, the power consumption of the semiconductor device can be reduced.

<Transistor Structure 2>

FIGS. 21A to 21C illustrate another example applicable to the transistor 200. FIG. 21A illustrates a top surface of the transistor 200. For simplification of the figure, some films are not illustrated in FIG. 21A. FIG. 21B is a cross-sectional view taken along the dashed-dotted line X1-X2 in FIG. 21A, and FIG. 21C is a cross-sectional view taken along the dashed-dotted line Y1-Y2 in FIG. 21A.

Note that in the transistor 200 illustrated in FIGS. 21A to 21C, components having the same function as the components in the transistor 200 in FIGS. 20A to 20C are denoted by the same reference numerals.

In the structure in FIGS. 21A to 21C, the conductor 260 has two stacked layers. The two stacked layers may be formed of the same material. For example, the conductor 260a is formed by a thermal CVD method, an MOCVD method, or an ALD method. In particular, an ALD method is preferably used. The application of an ALD method or the like can reduce damage to the insulator 250 which is caused during deposition. Furthermore, it is preferable to form the conductor 260a by an ALD method or the like because coverage can be improved. Thus, the transistor 200 with high reliability can be provided.

Then, the conductor 260b is formed by a sputtering method. At that time, since the conductor 260a is provided over the insulator 250, damage caused during deposition of the conductor 260b can be prevented from influencing the insulator 250. Since the deposition rate in a sputtering method is higher than that in an ALD method, the productivity can be improved with a high yield.

Furthermore, an insulator 270 is provided to cover the conductor 260 in the structure in FIGS. 21A to 21C. In the case where the insulator 280 is formed using an oxide material from which oxygen is released, the insulator 270 is formed using a substance having a barrier property against oxygen to prevent the conductor 260b from being oxidized by the released oxygen.

For example, the insulator 270 can be formed using a metal oxide such as aluminum oxide. The insulator 270 is formed to a thickness with which the oxidation of the conductor 260 is prevented. For example, the thickness of the insulator 270 is set to be greater than or equal to 1 nm and less than or equal to 10 nm, preferably greater than or equal to 3 nm and less than or equal to 7 nm.

This structure can expand the range of choices for materials of the conductor 260. For example, a material which has high conductivity while having low oxidation resistance, such as aluminum, can be used. For example, a conductor which can be easily deposited and processed can be used.

Thus, the oxidation of the conductor 260 can be prevented, and oxygen released from the insulator 280 can be supplied to the oxide 230 efficiently. Using a conductor which has high conductivity as the conductor 260 can lead to lower power consumption of the transistor 200.

<Transistor Structure 3>

FIGS. 22A to 22C illustrate another example applicable to the transistor 200. FIG. 22A illustrates a top surface of the transistor 200. For simplification of the figure, some films are not illustrated in FIG. 22A. FIG. 22B is a cross-sectional view taken along the dashed-dotted line X1-X2 in FIG. 22A, and FIG. 22C is a cross-sectional view taken along the dashed-dotted line Y1-Y2 in FIG. 22A.

Note that in the transistor 200 illustrated in FIGS. 22A to 22C, components having the same function as the components in the transistor 200 in FIGS. 20A to 20C are denoted by the same reference numerals.

In the structure illustrated in FIGS. 22A to 22C, the conductor 260 functioning as a gate electrode includes the conductor 260a, the conductor 260b, and a conductor 260c. The oxide 230c over the insulator 224 may be divided as long as it covers the side surface of the oxide 230b.

The conductor 260a is formed by a thermal CVD method, an MOCVD method, or an ALD method. In particular, an ALD method is preferably used. The use of an ALD method or the like can reduce plasma damage to the insulator 250. Furthermore, it is preferable to form the conductor 260a by an ALD method or the like because coverage can be improved. Thus, the transistor 200 with high reliability can be provided.

The conductor 260b is formed using a material which has high conductivity, such as tantalum, tungsten, copper, or aluminum. The conductor 260c, which is formed over the conductor 260b, is preferably formed using a material with high oxidation resistance, such as tungsten nitride.

For example, in the case where an oxide material from which oxygen is released is used as the insulator 280, when a conductor with high oxidation resistance is used as the conductor 260c, a large area of which is in contact with the insulator 280 including the oxygen-excess region, oxygen released from the oxygen-excess region can be prevented from being absorbed by the conductor 260. Furthermore, the oxidation of the conductor 260 can be prevented, and oxygen released from the insulator 280 can be supplied to the oxide 230 efficiently. Using a conductor which has high conductivity as the conductor 260b can lead to lower power consumption of the transistor 200.

As illustrated in FIG. 22C, the oxide 230b is covered with the conductor 260 in the channel width direction of the transistor 200. The insulator 224 has a projection, whereby the side surface of the oxide 230b is also covered with the conductor 260. For example, at the side surfaces of the oxide 230b, the bottom surface of the conductor 260 is preferably located closer to the substrate than the bottom surface of the oxide 230b by adjusting the shape of the projection of the insulator 224. In other words, the transistor 200 has a structure where the oxide 230b can be electrically surrounded by an electric field of the conductor 260. A structure where the oxide 230b is electrically surrounded by an electric field of the conductor is referred to as a surrounded channel (s-channel) structure. In the transistor 200 with an s-channel structure, the channel can be formed in the whole oxide 230b (bulk). In the s-channel structure, the drain current of the transistor can be increased, so that a larger amount of on-state current (current which flows between the source and the drain when the transistor is on) can be obtained. Furthermore, the entire channel formation region of the oxide 230b can be depleted by the electric field of the conductor 260. Accordingly, the off-state current of the s-channel transistor can be further reduced. When the channel width is shortened, the effects of the s-channel structure, such as an increase in on-state current and a reduction in off-state current, can be enhanced.

<Transistor Structure 4>

FIGS. 23A to 23C illustrate another example applicable to the transistor 200. FIG. 23A illustrates a top surface of the transistor 200. For simplification of the figure, some films are not illustrated in FIG. 23A. FIG. 23B is a cross-sectional view taken along the dashed-dotted line X1-X2 in FIG. 23A, and FIG. 23C is a cross-sectional view taken along the dashed-dotted line Y1-Y2 in FIG. 23A.

Note that in the transistor 200 illustrated in FIGS. 23A to 23C, components having the same function as the components in the transistor 200 in FIGS. 20A to 20C are denoted by the same reference numerals.

In the structure illustrated in FIGS. 23A to 23C, the conductors functioning as the source and the drain each have a stacked-layer structure. It is preferable that a conductor which is highly adhesive to the oxide 230b be used as the conductor 240a and the conductor 240b, and a material which has high conductivity be used as a conductor 241a and a conductor 241b. The conductor 240a and the conductor 240b are preferably formed by an ALD method. The use of an ALD method or the like can improve the coverage.

For example, when a metal oxide including indium is used as the oxide 230b, titanium nitride or the like may be used as the conductor 240a and the conductor 240b. When a material which has high conductivity, such as tantalum, tungsten, copper, or aluminum, is used as the conductor 241a and the conductor 241b, the transistor 200 with high reliability and low power consumption can be provided.

As illustrated in FIGS. 23B and 23C, the oxide 230b is covered with the conductor 260 in the channel width direction of the transistor 200. The insulator 222 has a projection, whereby the side surface of the oxide 230b is also covered with the conductor 260.

Here, when a high-k material such as hafnium oxide is used as the insulator 222, the equivalent oxide ($SiO_2$) thickness (EOT) of the insulator 222 can be small because the insulator 222 has a high relative dielectric constant. Accordingly, the distance between the conductor 205 and the oxide 230 can be increased owing to the physical thickness of the insulator 222, without reduction in the influence of the electric field which is applied from the conductor 205 to the oxide 230. Thus, the distance between the conductor 205 and the oxide 230 can be adjusted by changing the thickness of the insulator 222.

For example, at the side surfaces of the oxide 230b, the bottom surface of the conductor 260 is preferably located closer to the substrate than the bottom surface of the oxide 230b by adjusting the shape of the projection of the insulator 224. In other words, the transistor 200 has a structure where the oxide 230b can be electrically surrounded by an electric field of the conductor 260. A structure where the oxide 230b is electrically surrounded by an electric field of the conductor is referred to as a surrounded channel (s-channel) structure. In the transistor 200 with an s-channel structure, the channel can be formed in the whole oxide 230b (bulk). In the s-channel structure, the drain current of the transistor can be increased, so that a larger amount of on-state current (current which flows between the source and the drain when the transistor is on) can be obtained. Furthermore, the entire channel formation region of the oxide 230b can be depleted by the electric field of the conductor 260. Accordingly, the off-state current of the s-channel transistor can be further reduced. When the channel width is shortened, the effects of the s-channel structure, such as an increase in on-state current and a reduction in off-state current, can be enhanced.

<Transistor Structure 5>

FIGS. 24A to 24C illustrate another example applicable to the transistor 200. FIG. 24A illustrates a top surface of the transistor 200. For simplification of the figure, some films are not illustrated in FIG. 24A. FIG. 24B is a cross-sectional view taken along the dashed-dotted line X1-X2 in FIG. 24A, and FIG. 24C is a cross-sectional view taken along the dashed-dotted line Y1-Y2 in FIG. 24A.

Note that in the transistor 200 illustrated in FIGS. 24A to 24C, components having the same function as the components in the transistor 200 in FIGS. 20A to 20C are denoted by the same reference numerals.

In the transistor 200 illustrated in FIGS. 24A to 24C, the oxide 230c, the insulator 250, and the conductor 260 are formed in an opening formed in the insulator 280. Furthermore, one end portion of each of the conductor 240a and the conductor 240b is aligned with an end portion of the opening formed in the insulator 280. Furthermore, three end portions of each of the conductor 240a and the conductor 240b are aligned with parts of end portions of each of the oxide 230a and the oxide 230b. Therefore, the conductor 240a and the conductor 240b can be formed concurrently with the oxide 230 or the opening in the insulator 280. Accordingly, the number of masks and steps can be reduced, and yield and productivity can be improved.

The conductor 240a, the conductor 240b, the oxide 230c, and the oxide 230d are in contact with the insulator 280 having the oxygen-excess region with the oxide 230d located therebetween. Thus, since the oxide 230d exists between the insulator 280 and the oxide 230b including the region where the channel is formed, impurities such as hydrogen, water, and halogen can be prevented from diffusing from the insulator 280 into the oxide 230b.

Since the transistor 200 in FIGS. 24A to 24C has a structure in which the conductor 240a and the conductor 240b hardly overlap with the conductor 260, the parasitic capacitance added to the conductor 260 can be reduced. Thus, the transistor 200 with a high operation frequency can be provided.

<Transistor Structure 6>

FIGS. 25A to 25C illustrate another example applicable to the transistor 200. FIG. 25A illustrates a top surface of the transistor 200. For simplification of the figure, some films are not illustrated in FIG. 25A. FIG. 25B is a cross-sectional view taken along the dashed-dotted line X1-X2 in FIG. 25A, and FIG. 25C is a cross-sectional view taken along the dashed-dotted line Y1-Y2 in FIG. 25A.

Note that in the transistor 200 illustrated in FIGS. 25A to 25C, components having the same function as the components in the transistor 200 in FIGS. 24A to 24C are denoted by the same reference numerals.

An insulator 285 and an insulator 286 are formed over the insulator 282.

The oxide 230c, the insulator 250, and the conductor 260 are formed in an opening formed in the insulator 280, the insulator 282, and the insulator 285. Furthermore, one end portion of each of the conductor 240a and the conductor 240b is aligned with an end portion of the opening formed in the insulator 280. Furthermore, three end portions of each of the conductor 240a and the conductor 240b are aligned with parts of end portions of each of the oxide 230a and the oxide 230b. Therefore, the conductor 240a and the conductor 240b can be formed concurrently with the oxide 230a and the oxide 230b or the opening in the insulator 280. Accordingly, the number of masks and steps can be reduced, and yield and productivity can be improved.

The conductor 240a, the conductor 240b, the oxide 230c, and the oxide 230b are in contact with the insulator 280 having the oxygen-excess region with the oxide 230d located therebetween. Thus, since the oxide 230d exists between the insulator 280 and the oxide 230b including the region where the channel is formed, impurities such as hydrogen, water, and halogen can be prevented from diffusing from the insulator 280 into the oxide 230b.

In addition, a high-resistance offset region is not formed in the transistor 200 in FIGS. 25A to 25C, the on-state current of the transistor 200 can be increased.

<Transistor Structure 7>

FIGS. 26A to 26C illustrate another example applicable to the transistor 200. FIG. 26A illustrates a top surface of the transistor 200. For simplification of the figure, some films are not illustrated in FIG. 26A. FIG. 26B is a cross-sectional view taken along the dashed-dotted line X1-X2 in FIG. 26A, and FIG. 26C is a cross-sectional view taken along the dashed-dotted line Y1-Y2 in FIG. 26A.

Note that in the transistor 200 illustrated in FIGS. 26A to 26C, components having the same function as the components in the transistor 200 in FIGS. 20A to 20C are denoted by the same reference numerals.

The transistor 200 in FIGS. 26A to 26C does not include the oxide 230d. For example, in the case where a conductor with high oxidation resistance is used for the conductor 240a and the conductor 240b, the oxide 230d is not necessarily provided. Accordingly, the number of masks and steps can be reduced, and yield and productivity can be improved.

The insulator 224 may be provided only in a region overlapping with the oxide 230a and the oxide 230b. In that case, the oxide 230a, the oxide 230b, and the insulator 224 can be processed using the insulator 222 as an etching stopper. Accordingly, yield and productivity can be improved.

Since the transistor 200 in FIGS. 26A to 26C has a structure in which the conductor 240a and the conductor 240b hardly overlap with the conductor 260, the parasitic capacitance added to the conductor 260 can be reduced. Thus, the transistor 200 with a high operation frequency can be provided.

<Method for Manufacturing Transistor>

An example of a method for manufacturing the transistor illustrated in FIGS. 20A to 20C is described below with reference to FIGS. 27A to 27E, FIGS. 28A to 28D, FIGS. 29A to 29C, and FIGS. 30A to 30C.

First, a substrate is prepared (not illustrated). Although there is no particular limitation on the substrate, it preferably has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium, gallium arsenide, indium arsenide, or indium gallium arsenide, or the like; a silicon-on-insulator (SOI) substrate; a germanium-on-insulator (GOI) substrate; or the like can be used. Further alternatively, any of these substrates provided with a semiconductor element may be used.

Further alternatively, a flexible substrate may be used as the substrate to manufacture the semiconductor device. To manufacture a flexible semiconductor device, a transistor may be directly formed over a flexible substrate; or alternatively, a transistor may be formed over a substrate and then separated from the substrate and transferred to a flexible substrate. In order that the transistor be separated from the different substrate to be transferred to the flexible substrate, it is preferable to provide a separation layer between the manufacturing substrate and the transistor including an oxide semiconductor.

Figure 27A:
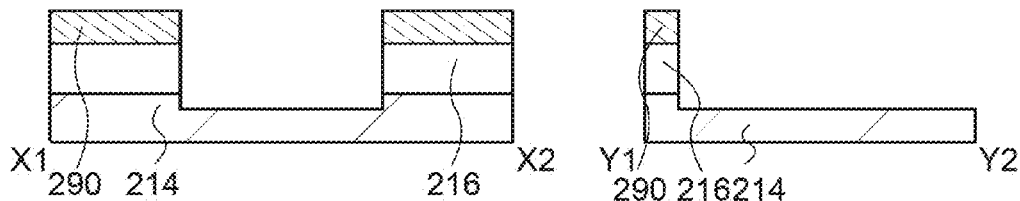
FIGS. 27A to 27E illustrate an example of a method for manufacturing a transistor of an embodiment.

Next, the insulator 214 and the insulator 216 are formed. Then, a resist mask 290 is formed over the insulator 216 by a lithography process or the like to remove unnecessary portions of the insulator 214 and the insulator 216 (FIG. 27A). After that, the resist mask 290 is removed; thus, an opening can be formed.

Here, a method for processing a film is described. To process a film finely, a variety of fine processing techniques can be used. For example, it is possible to use a method in which a resist mask formed by a lithography process or the like is subjected to slimming treatment. Alternatively, a dummy pattern is formed by a lithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

An organic resin film having a function of improving the adhesion between a film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In the case of fine processing, in particular, a material serving as a film preventing reflection of light for the exposure is preferably used for the organic resin film. Examples of the organic resin film having such a function include a bottom anti-reflection coating (BARC) film. The organic resin film may be removed at the same time as the removal of the resist mask or after the removal of the resist mask.

Figure 27B:
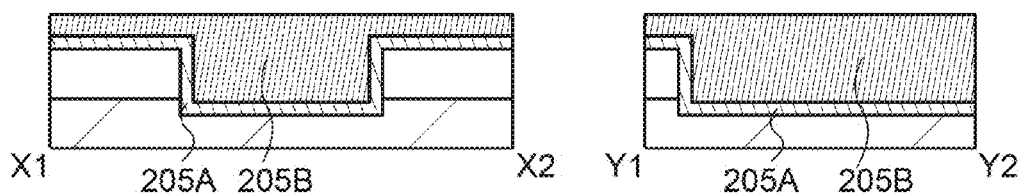

Next, a conductor 205A and a conductor 205B are formed over the insulator 214 and the insulator 216. The conductor 205A and the conductor 205B can be formed by, for example, a sputtering method, an evaporation method, or a CVD method (including a thermal CVD method, an MOCVD method, a PECVD method, and the like). It is preferable to use a thermal CVD method, an MOCVD method, or an ALD method in order to reduce plasma damage (FIG. 27B).

Figure 27C:
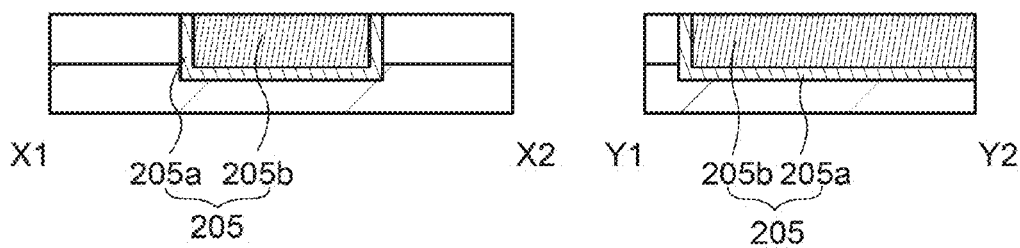

Then, unnecessary portions of the conductor 205A and the conductor 205B are removed. For example, part of the conductor 205A and part of the conductor 205B are removed by etch-back process, a chemical mechanical polishing (CMP) process, or the like until the insulator 216 is exposed, whereby the conductor 205 is formed (FIG. 27C). At that time, the insulator 216 can be used as a stopper layer, and the thickness of the insulator 216 is reduced in some cases.

The CMP process is a process for planarizing a surface of an object to be processed by a combination of chemical and mechanical actions. More specifically, the CMP process is a process in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing between the object to be processed and the polishing cloth.

Note that the CMP process may be performed only once or plural times. When the CMP process is performed plural times, first polishing is preferably performed with a high polishing rate followed by final polishing with a low polishing rate. In this manner, polishing processes using different polishing rates may be used in combination.

Figure 27D:
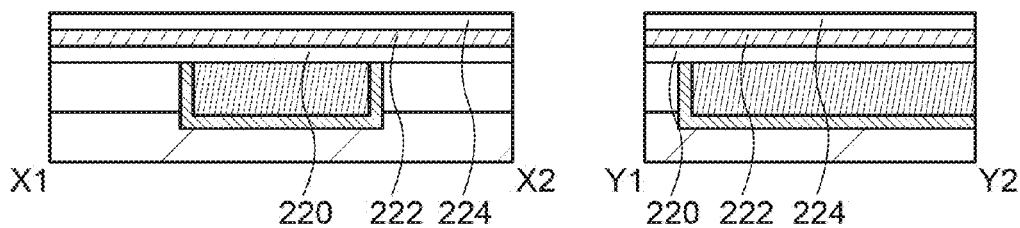
Figure 27E:
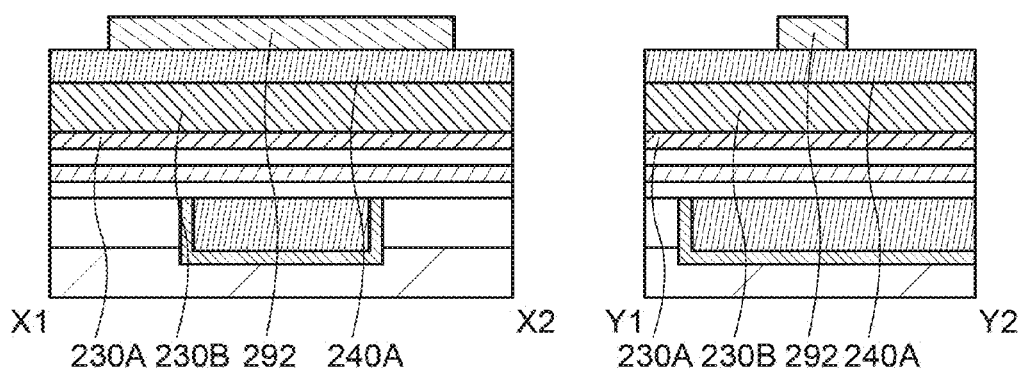

Then, the insulator 220, the insulator 222, and the insulator 224 are formed (FIG. 27D).

The insulator 220, the insulator 222, and the insulator 224 each can be formed using a material and a method similar to those used for forming the insulator 320. It is particularly preferable to use a high-k material such as hafnium oxide as the insulator 222.

The insulator 220, the insulator 222, and the insulator 224 can be formed using a sputtering method, a chemical vapor deposition (CVD) method, (including a thermal CVD method, a metal organic CVD (MOCVD) method, a plasma-enhanced CVD (PECVD) method, and the like), a molecular beam epitaxy (MBE) method, an atomic layer deposition (ALD) method, a pulsed laser deposition (PLD) method, or the like. In particular, it is preferable that the insulators be formed by a CVD method, further preferably an ALD method, because coverage can be further improved. It is preferable to use a thermal CVD method, an MOCVD method, or an ALD method in order to reduce plasma damage. The insulators can also be formed using silicon oxide films with high step coverage that is formed by reacting tetraethyl orthosilicate (TEOS), silane, or the like with oxygen, nitrous oxide, or the like.

Note that the insulator 220, the insulator 222, and the insulator 224 are preferably formed successively. By successive formation, impurities do not attach to the interfaces between the insulator 220 and the insulator 222 and between the insulator 222 and the insulator 224, resulting in high reliability of the insulators.

Then, an oxide 230A to be the oxide 230a and an oxide 230B to be the oxide 230b are sequentially formed. The oxides are preferably formed successively without exposure to the air.

Then, a conductive film 240A to be the conductor 240a and the conductor 240b is formed over the oxide 230A. As the conductive film 240A, a material which has a barrier property against hydrogen or oxygen and has high oxidation resistance is preferably used. Although the conductive film 240A has a single-layer structure in the figure, it may have a structure of two or more stacked layers. Then, a resist mask 292 is formed by a method similar to that described above (FIG. 27E).

Figure 28A:
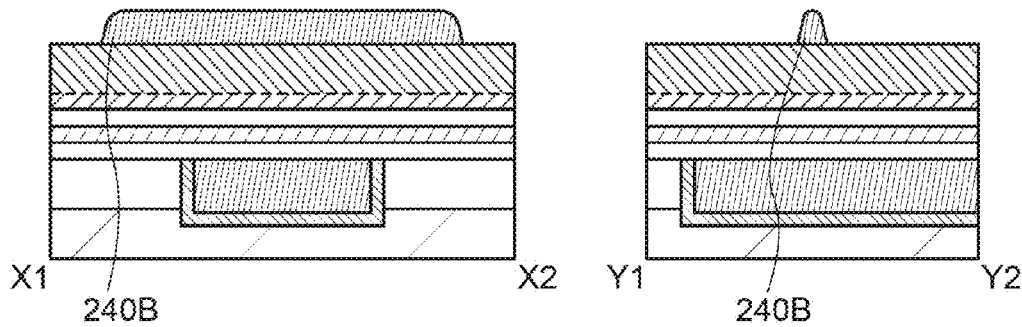
FIGS. 28A to 28D illustrate the example of a method for manufacturing a transistor of an embodiment.

An unnecessary portion of the conductive film 240A is removed by etching using the resist mask 292 to form a conductive layer 240B having an island shape (FIG. 28A). After that, unnecessary portions of the oxide 230A and the oxide 230B are removed by etching using the conductive layer 240B as a mask.

At that time, the insulator 224 may also be processed into an island-shape. For example, even when the total thickness of the insulator 220, the insulator 222, and the insulator 224 is small, the use of the insulator 222 having a barrier property as an etching stopper film can prevent over-etching of the wiring layer located below the insulators. In addition, when the total thickness of the insulator 220, the insulator 222, and the insulator 224 is reduced, a voltage is efficiently applied from the conductor 205, resulting in low power consumption of the transistor.

Figure 28B:
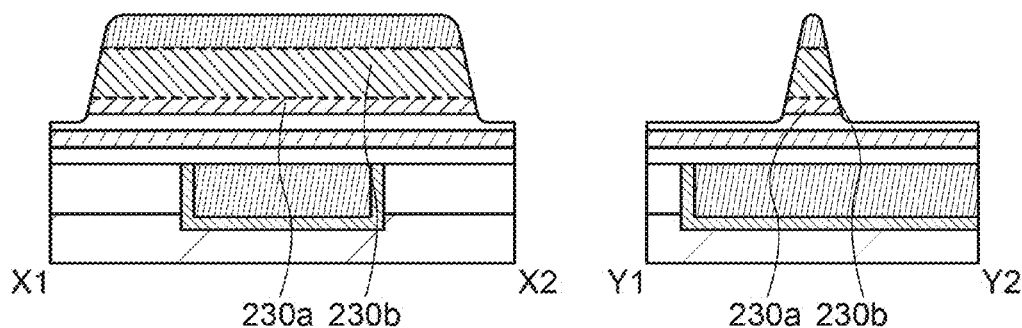

Then, the resist mask is removed. Thus, a stacked-layer structure of the island-shaped oxide 230a, the island-shaped oxide 230b, and the island-shaped conductive layer 240B can be formed (FIG. 28B).

Figure 28C:
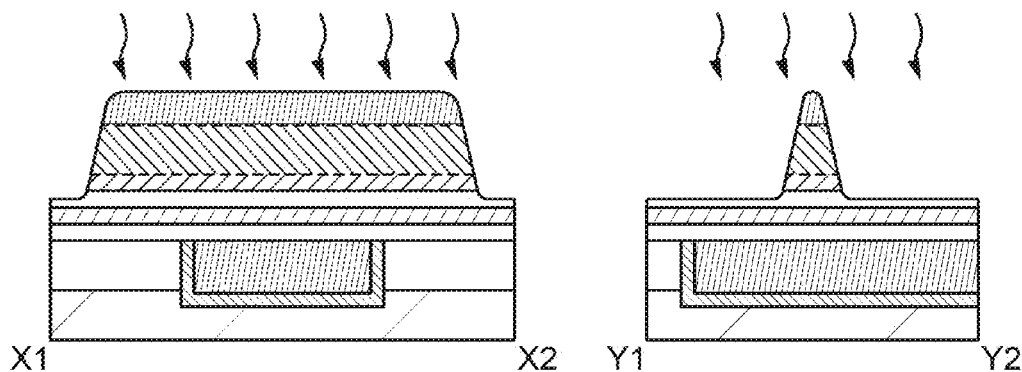
Figure 28D:
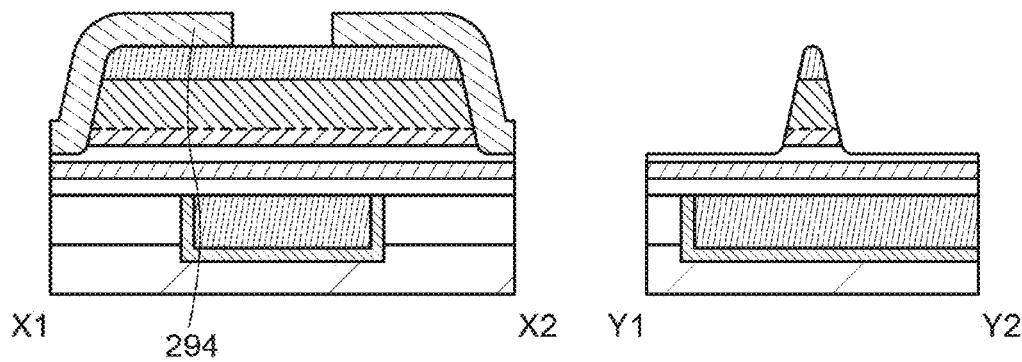

Next, heat treatment is preferably performed (arrows in FIG. 28C denote the heat treatment). The heat treatment may be performed at a temperature higher than or equal to 250° C. and lower than or equal to 400° C., preferably higher than or equal to 320° C. and lower than or equal to 380° C., in an inert gas atmosphere, in an atmosphere containing an oxidizing gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate released oxygen. The heat treatment can remove hydrogen that is an impurity for the oxide 230a and the oxide 230b. In addition, oxygen can be supplied from the insulator formed under the oxide 230a to the oxide 230a and the oxide 230b, so that oxygen vacancies in the oxides can be reduced.

Figure 29A:
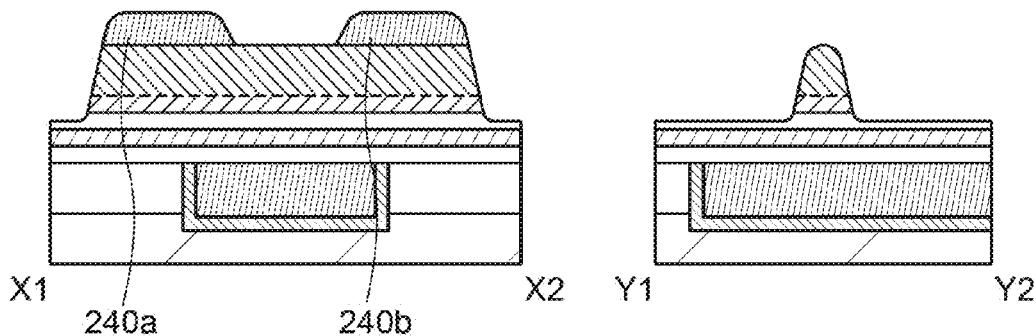
FIGS. 29A to 29C illustrate the example of a method for manufacturing a transistor of an embodiment.
Figure 29B:
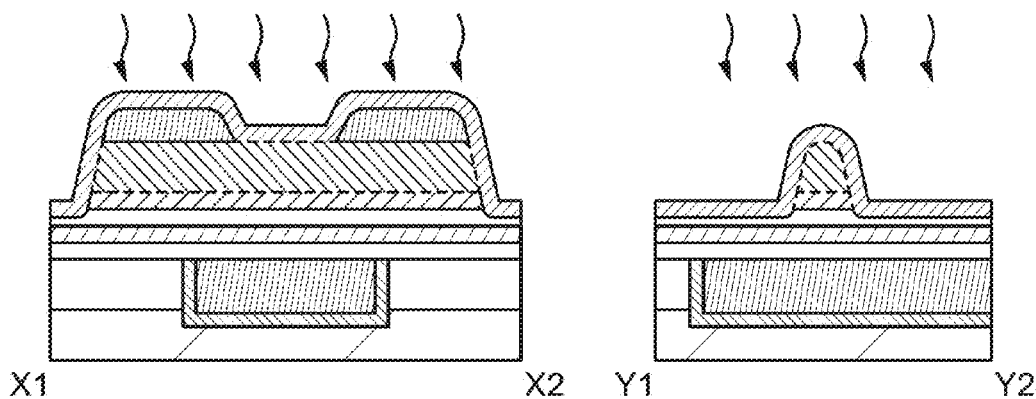
Figure 29C:
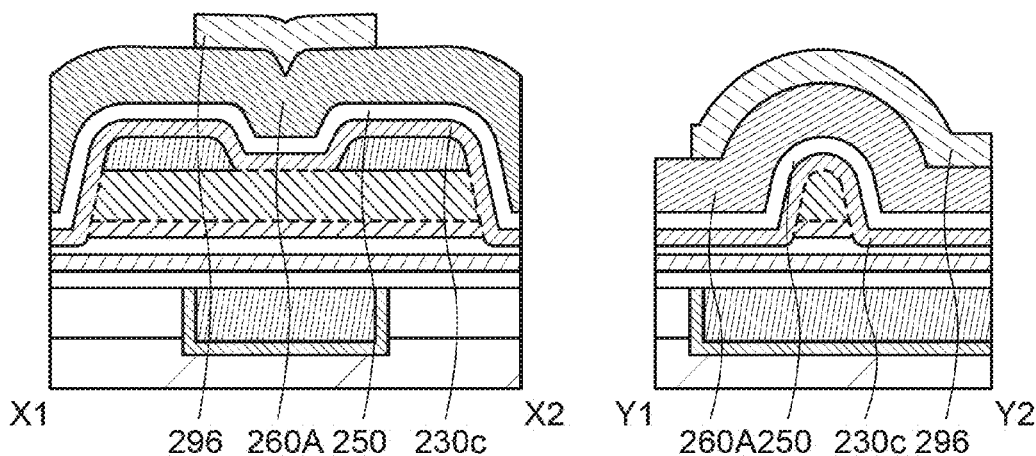

Next, a resist mask 294 is formed over the island-shaped conductive layer 240B by a method similar to that described above (FIG. 28D). Then, an unnecessary portion of the conductive layer 240B is removed by etching, and then the resist mask 294 is removed, whereby the conductor 240a and the conductor 240b are formed (FIG. 29A). At that time, the insulator 224 or the insulator 222 may be over-etched to obtain an s-channel structure.

Here, heat treatment may be performed. The heat treatment may be performed under the same condition as the heat treatment described with reference to FIG. 28C. The heat treatment can remove hydrogen that is an impurity for the oxide 230a and the oxide 230b. In addition, oxygen can be supplied from the insulator formed under the oxide 230a to the oxide 230a and the oxide 230b, so that oxygen vacancies in the oxides can be reduced. In the case where the heat treatment is performed using an oxidizing gas, an oxidizing gas is in direct contact with the region where the channel is formed, whereby oxygen vacancies included in the region where the channel is formed can be reduced efficiently.

Then, the oxide 230c is formed. Here, heat treatment may be performed (arrows in FIG. 29B denote the heat treatment). The heat treatment may be performed under the same condition as the heat treatment described with reference to FIG. 28C. The heat treatment can remove hydrogen that is an impurity for the oxide 230a and the oxide 230b. In addition, oxygen can be supplied from the insulator formed under the oxide 230a to the oxide 230a and the oxide 230b, so that oxygen vacancies in the oxides can be reduced. In the case where the heat treatment is performed using an oxidizing gas, an oxidizing gas is in direct contact with the region where the channel is formed, whereby oxygen vacancies included in the region where the channel is formed can be reduced efficiently.

Then, the insulator 250, and a conductive film 260A to be the conductor 260 are sequentially formed. As the conductive film 260A, a material which has a barrier property against hydrogen or oxygen and has high oxidation resistance is preferably used. Although the conductive film 260A has a single-layer structure in the figure, it may have a structure of two or more stacked layers.

For example, the stacked two layers may be formed of the same material. A first conductive film is formed by a thermal CVD method, an MOCVD method, or an ALD method, for example. In particular, an ALD method is preferably used. The application of an ALD method or the like can reduce damage to the insulator 250 which is caused during deposition. Furthermore, it is preferable to form the first conductive film by an ALD method or the like because coverage can be improved. Thus, the transistor 200 with high reliability can be provided.

Then, a second conductive film is formed by a sputtering method. At that time, since the first conductive film is provided over the insulator 250, damage caused during deposition of the second conductive film can be prevented from influencing the insulator 250. Since the deposition rate in a sputtering method is higher than that in an ALD method, the productivity can be improved with a high yield. Note that it is preferable to use a deposition gas which does not contain chlorine in deposition of the conductive film 260A.

Figure 30A:
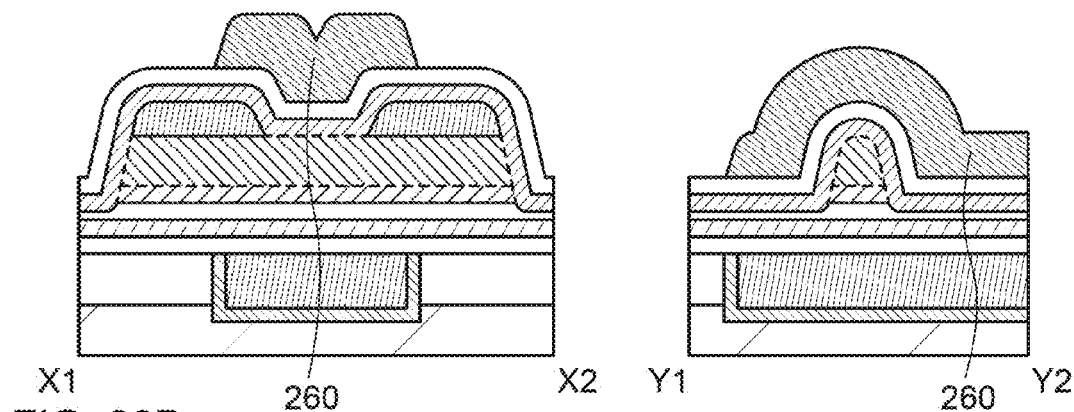
FIGS. 30A to 30C illustrate the example of a method for manufacturing a transistor of an embodiment.

Next, a resist mask 296 is formed over the conductive film 260A by a method similar to that described above (FIG. 29C). Then, an unnecessary portion of the conductive film 260A is removed by etching to form the conductor 260. After that, the resist mask 296 is removed (FIG. 30A).

Subsequently, the insulator 280 is formed over the conductor 260. The insulator 280 is an insulator containing oxygen, such as a silicon oxide film or a silicon oxynitride film. The insulator containing excess oxygen can be formed using a silicon oxide film or a silicon oxynitride film containing a large amount of oxygen as a result of deposition by a CVD method or a sputtering method under the conditions which are set as appropriate. After the silicon oxide film or the silicon oxynitride film is formed, oxygen may be added by an ion implantation method, an ion doping method, or plasma treatment.

Figure 30B:
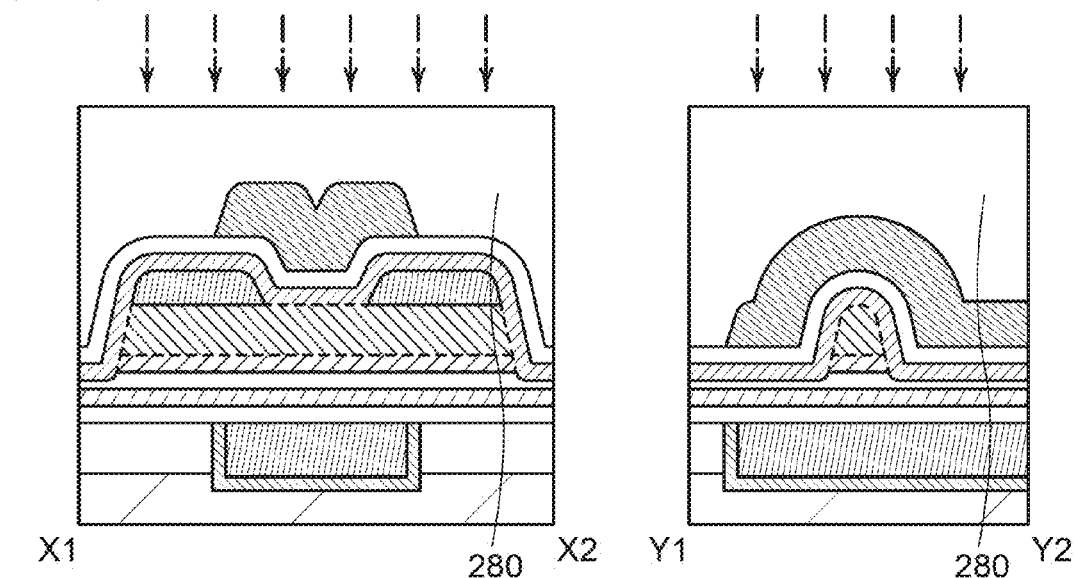

In particular, oxygen plasma treatment is preferably performed (arrows in FIG. 30B denote the plasma treatment). In typical oxygen plasma treatment, the surface of an oxide semiconductor is processed by radicals generated from an oxygen gas by glow discharge plasma. However, as a gas from which plasma is generated, a mixed gas of an oxygen gas and a rare gas may be used, as well as oxygen. For example, oxygen plasma treatment may be performed at a temperature higher than or equal to 250° C. and lower than or equal to 400° C., preferably higher than or equal to 300° C. and lower than or equal to 400° C., in an atmosphere containing an oxidizing gas or under reduced pressure.

The oxygen plasma treatment dehydrates or dehydrogenates the insulator 280 and the oxide 230 and introduces excess oxygen to the insulator 280; as a result, an oxygen-excess region can be formed. In addition, oxygen vacancies are generated in the dehydrated or dehydrogenated oxide 230 and the resistance of the oxide 230 is reduced. Meanwhile, the excess oxygen in the insulator 280 compensates oxygen vacancies of the oxide 230. Therefore, owing to the oxygen plasma treatment, hydrogen and water that serve as impurities can be removed from the insulator 280. In addition, hydrogen and water that serve as impurities can be removed from the oxide 230 while oxygen vacancies in the oxide 230 are compensated. Thus, the electrical characteristics of the transistor 200 can be improved and variation in the electrical characteristics thereof can be reduced.

Figure 30C:
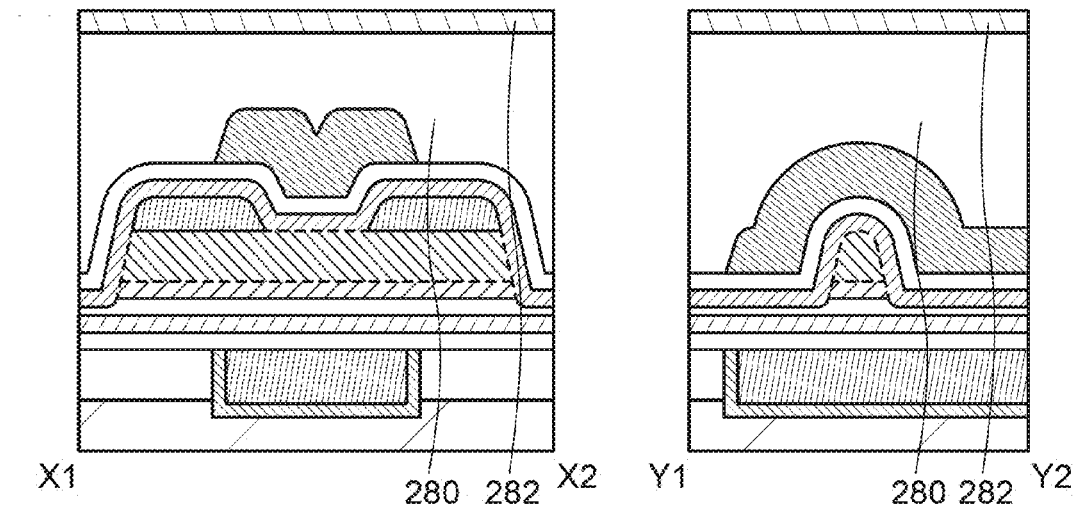

Then, the insulator 282 is formed over the insulator 280 (FIG. 30C). The insulator 282 is preferably formed with a sputtering apparatus. By using a sputtering method, an oxygen-excess region can be formed easily in the insulator 280 located under the insulator 282.

During deposition by a sputtering method, ions and sputtered particles exist between the target and the substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. Note that the potential relationship is $E_2>E_1>E_0$.

The ions in plasma are accelerated by a potential difference ($E_2-E_0$) and collide with the target; accordingly, sputtered particles are ejected from the target. These sputtered particles are attached to a deposition surface and deposited thereover; as a result, a film is formed. Some ions recoil by the target and might be taken, as recoil ions, into the insulator 280 located below the formed film, through the formed film. The ions in the plasma are accelerated by a potential difference ($E_2-E_1$) and collide with the deposition surface. At that time, some ions reach the inside of the insulator 280. The ions are taken into the insulator 280; accordingly, a region into which the ions are taken is formed in the insulator 280. That is, an oxygen-excess region is formed in the insulator 280 in the case where the ions include oxygen.

Introduction of excess oxygen to the insulator 280 can form an oxygen-excess region. The excess oxygen in the insulator 280 is supplied to the oxide 230 and can compensate oxygen vacancies in the oxide 230. Here, in the case where a conductor with high oxidation resistance is used as each of the conductor 240a, the conductor 240b, and the conductor 260 in contact with the insulator 280, excess oxygen in the insulator 280 is not absorbed by the conductor 260, the conductor 240a, and the conductor 240b but can be efficiently supplied to the oxide 230. Thus, the electrical characteristics of the transistor 200 can be improved and variation in the electrical characteristics thereof can be reduced.

Through the above steps, the transistor 200 of one embodiment of the present invention can be manufactured.

The structures, the methods, and the like described in this embodiment can be combined as appropriate with any of the structures, the methods, and the like described in the other embodiments.

Embodiment 4

In this embodiment, an oxide semiconductor included in the transistor described in the above embodiment will be described below with reference to FIGS. 34A to 34E, FIGS. 35A to 35E, FIGS. 36A to 36D, FIGS. 37A and 37B, FIG. 38, and FIG. 39.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

Figure 34A:
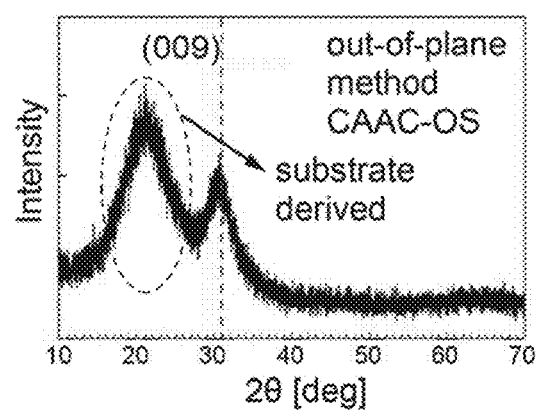
FIGS. 34A to 34E show structural analyses of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 34A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 310. The peak at a 2θ of around 36° is derived from a crystal structure that is classified into the space group Fd-3m; thus, this peak is preferably not exhibited in a CAAC-OS.

Figure 34B:
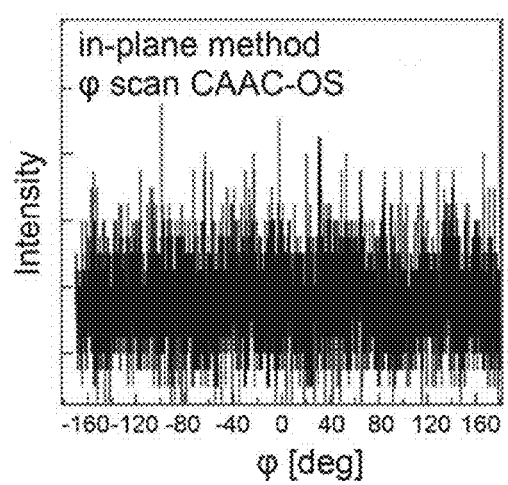
Figure 34C:
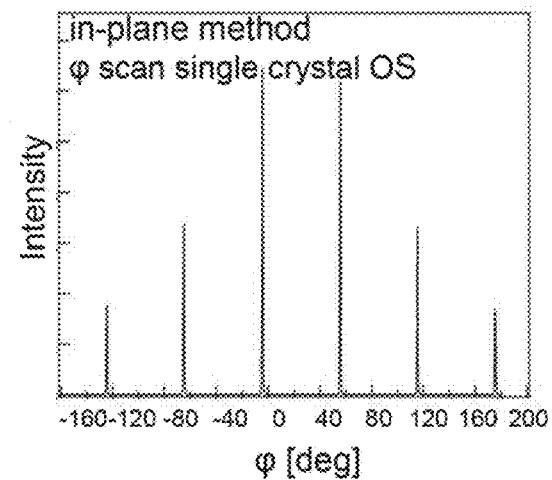
Figure 34D:
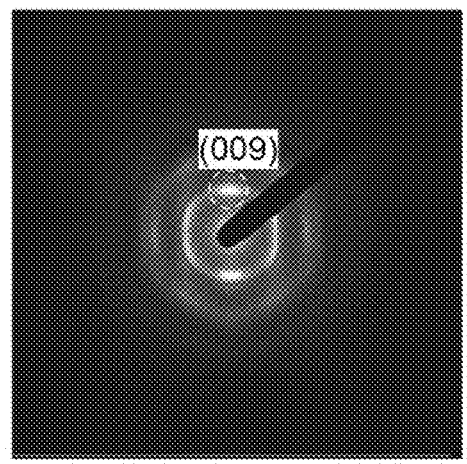

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 34B, a peak is not clearly observed. In contrast, in the case where single crystal $InGaZnO_4$ is subjected to φ scan with 2θ fixed at around 56°, as shown in FIG. 34C, six peaks which are derived from crystal planes equivalent to the (110) plane are observed. Accordingly, the structural analysis using XRD shows that the directions of a-axes and b-axes are irregularly oriented in the CAAC-OS.

Figure 34E:
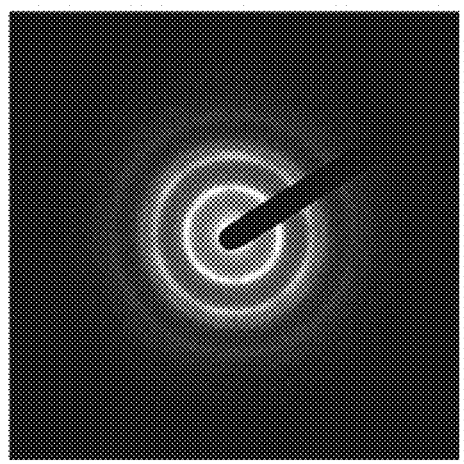

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 34D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 34E shows a diffraction pattern obtained in such a manner that an electron beam with a probe diameter of 300 nm is incident on the same sample in a direction perpendicular to the sample surface. As shown in FIG. 34E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 34E is considered to be derived from the (010) plane, the (100) plane, and the like of the $InGaZnO_4$ crystal. The second ring in FIG. 34E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 35A:
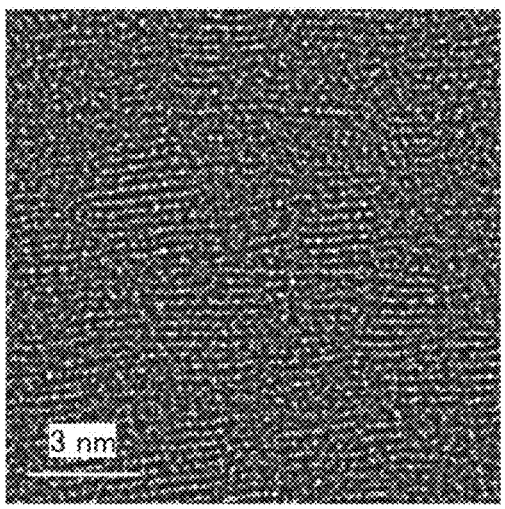
FIGS. 35A to 35E show a cross-sectional TEM image and plan-view TEM images of a CAAC-OS and images obtained through analysis thereof.

FIG. 35A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 35A shows pellets in which metal atoms are arranged in a layered manner. FIG. 35A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 35D:
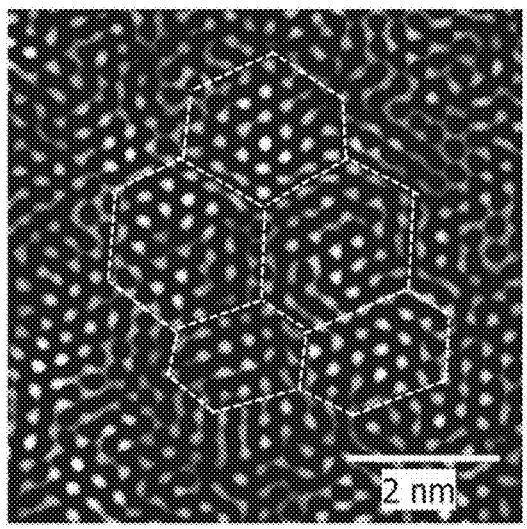
Figure 35B:
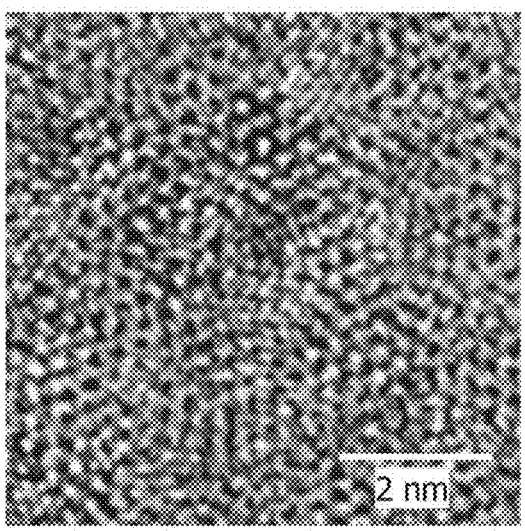
Figure 35E:
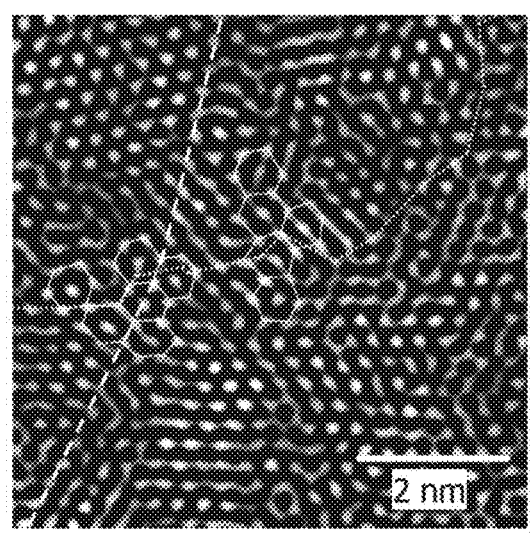
Figure 35C:
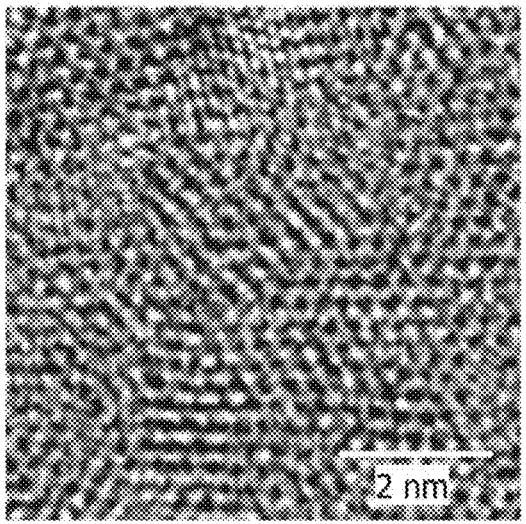

FIGS. 35B and 35C show Cs-corrected high-resolution TEM images of a plane of the CAAC-OS observed from a direction substantially perpendicular to the sample surface. FIGS. 35D and 35E are images obtained through image processing of FIGS. 35B and 35C. The method of image processing is as follows. The image in FIG. 35B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 35D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 35E, a dotted line denotes a portion where the direction of a lattice arrangement is changed between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of arrangement of oxygen atoms in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 36A:
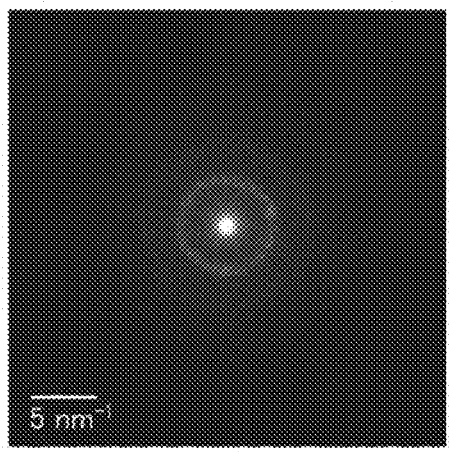
FIGS. 36A to 36D show electron diffraction patterns and a cross-sectional TEM image of an nc-OS.

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 36A is observed. FIG. 36B shows a diffraction pattern obtained when an electron beam with a probe diameter of 1 nm is incident on the same sample. As shown in FIG. 36B, a plurality of spots are observed in a ring-like region. In other words, ordering in an nc-OS is not observed with an electron beam with a probe diameter of 50 nm but is observed with an electron beam with a probe diameter of 1 nm.

Figure 36C:
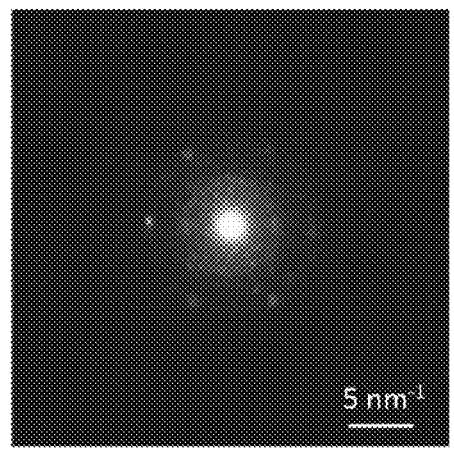
Figure 36B:
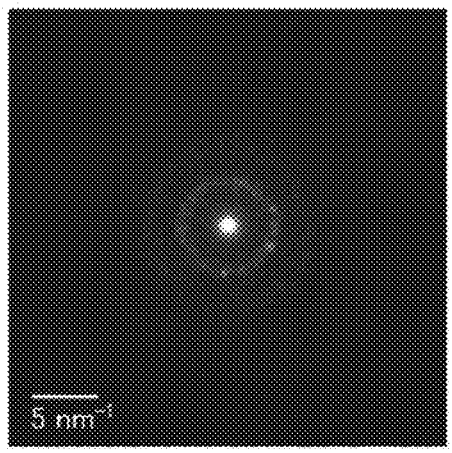

Furthermore, an electron diffraction pattern in which spots are arranged in an approximately regular hexagonal shape is observed in some cases as shown in FIG. 36C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 36D:
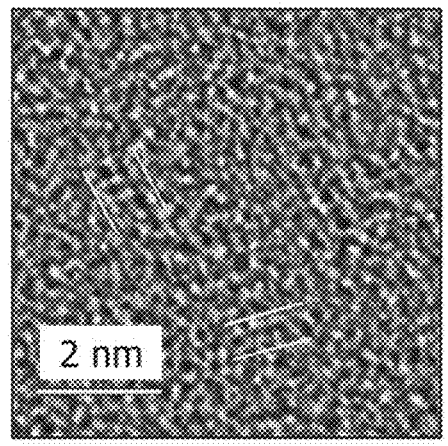

FIG. 36D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 36D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

Figure 37A:
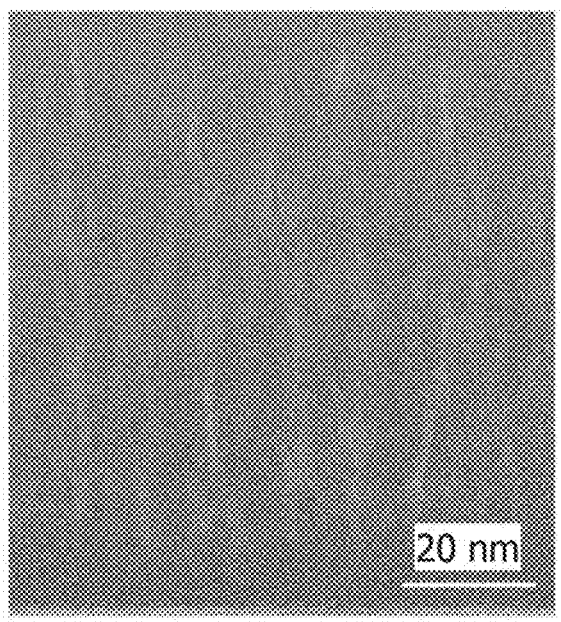
FIGS. 37A and 37B show cross-sectional TEM images of an a-like OS.
Figure 37B:
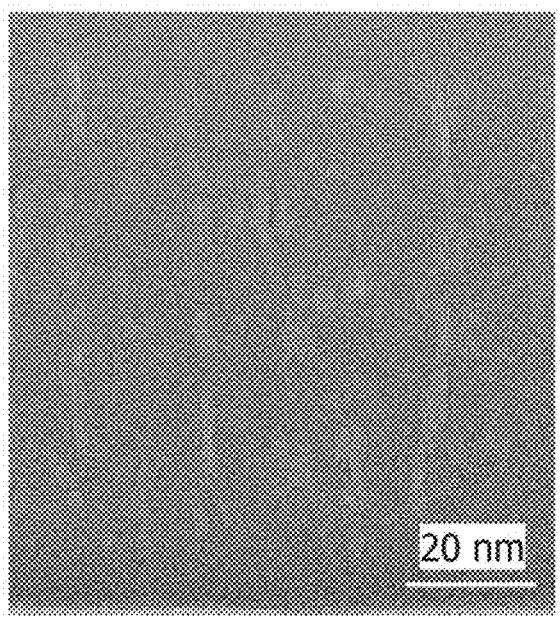

FIGS. 37A and 37B are high-resolution cross-sectional TEM images of an a-like OS. FIG. 37A is the high-resolution cross-sectional TEM image of the a-like OS at the start of the electron irradiation. FIG. 37B is the high-resolution cross-sectional TEM image of a-like OS after the electron ($e^-$) irradiation at $4.3 \times 10^8$ $e^-/nm^2$. FIGS. 37A and 37B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared to a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 38:
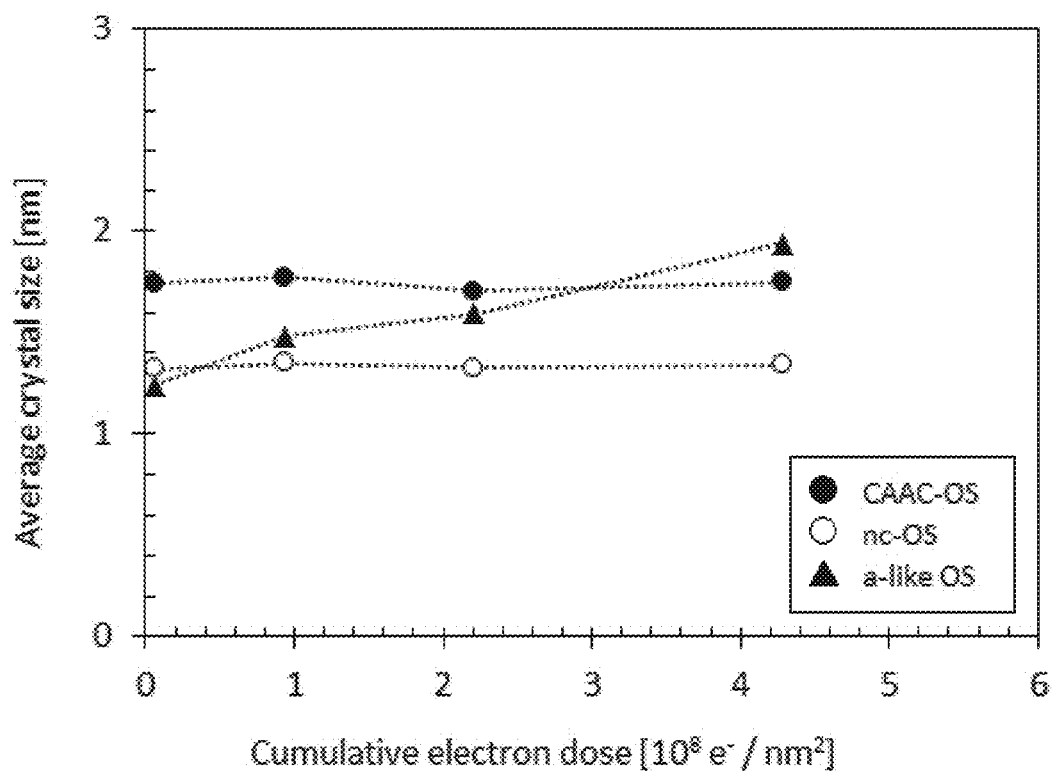
FIG. 38 shows a change in crystal part of an In—Ga—Zn oxide induced by electron irradiation.

FIG. 38 shows change in the average size of crystal parts (at 22 points to 30 points) in each sample. Note that the crystal part size corresponds to the length of a lattice fringe. FIG. 38 indicates that the crystal part size in the a-like OS increases with an increase in the cumulative electron dose in obtaining TEM images, for example. As shown in FIG. 38, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 38, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope is used. The conditions of electron beam irradiation are as follows: the accelerating voltage is 300 kV; the current density is $6.7 \times 10^5$ $e^-/(nm^2 \cdot s)$; and the diameter of irradiation region is 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared to the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga: Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer film including two or more films of an amorphous oxide semiconductor, an a-like OS, an nc-OS, and a CAAC-OS, for example.

<Carrier Density of Oxide Semiconductor>

The carrier density of an oxide semiconductor is described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region is described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^{-3}$, and further preferably lower than $1 \times 10^{10}$ cm$^{-3}$, and higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

Figure 39:
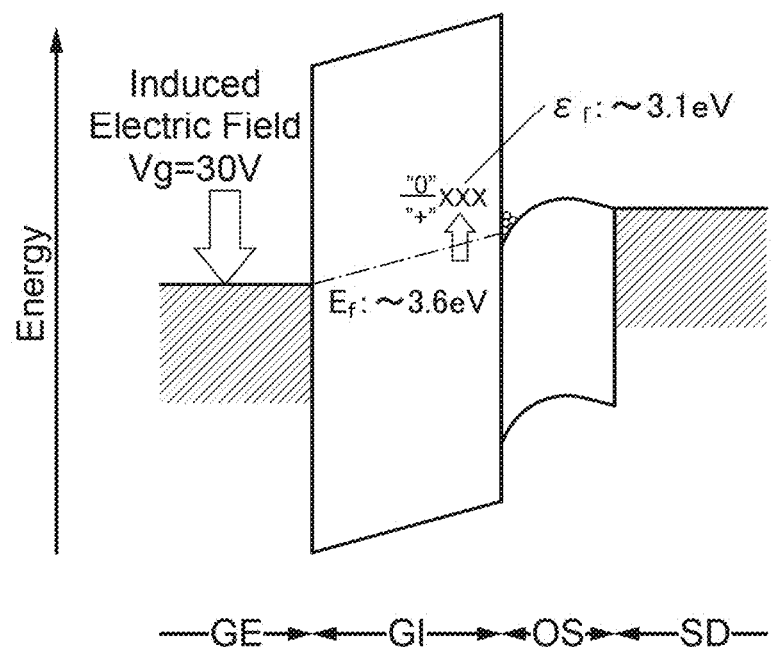
FIG. 39 shows an energy band of a transistor in which an oxide semiconductor film is used as a channel region.

The use of the substantially intrinsic oxide semiconductor film described above may improve the reliability of the transistor. Here, the reason why the transistor including the oxide semiconductor film in a channel region has high reliability is described with reference to FIG. 39. FIG. 39 is an energy band diagram of the transistor including the oxide semiconductor film in the channel region.

In FIG. 39, GE stands for a gate electrode, GI stands for a gate insulating film, OS stands for an oxide semiconductor film, and SD stands for a source electrode or a drain electrode. That is to say, FIG. 39 is an example of the energy band of the gate electrode, the gate insulating film, the oxide semiconductor film, and the source electrode or the drain electrode in contact with the oxide semiconductor film.

In FIG. 39, a silicon oxide film is used as the gate insulating film, and an In—Ga—Zn oxide is used for the oxide semiconductor film. In addition, it is assumed that the transition level $\in f$ of a defect that can be formed in the silicon oxide film is located approximately 3.1 eV apart from the conduction band of the gate insulating film, and the Fermi level Ef of the silicon oxide film at the interface between the oxide semiconductor film and the silicon oxide film when the gate voltage Vg is 30 V is located approximately 3.6 eV apart from the conduction band of the gate insulating film. Note that the Fermi level Ef of the silicon oxide film varies depending on the gate voltage. For example, as the gate voltage is increased, the Fermi level Ef of the silicon oxide film at the interface between the oxide semiconductor film and the silicon oxide film becomes low. In FIG. 39, hollow circles indicate electrons (carriers), and crosses indicate defect states in the silicon oxide film.

As illustrated in FIG. 39, for example, when the carriers are thermally excited under application of the gate voltage, the carriers are trapped in the defect states (crosses in the diagram), and the charge state of the defect states is changed from positive ("+") to neutral ("0"). Specifically, in the case where the value obtained by adding the thermal excitation energy to the Fermi level Ef of the silicon oxide film becomes greater than the transition level $\in f$ of the defect, the charge state of the defect states in the silicon oxide film is changed from positive to neutral, and the threshold voltage of the transistor is positively shifted.

When an oxide semiconductor film with a different electron affinity is used, the depth of the interface between the gate insulating film and the oxide semiconductor film at which the Fermi level is formed is also different in some cases. When an oxide semiconductor film with a greater electron affinity is used, the conduction band minimum of the gate insulating film becomes relatively high at the interface between the gate insulating film and the oxide semiconductor film or in the vicinity of the interface. In that case, the defect states (crosses in FIG. 39) which might be formed in the gate insulating film also becomes relatively high, so that the energy difference between the Fermi level of the gate insulating film and the Fermi level of the oxide semiconductor film is increased. This results in less charge trapped in the gate insulating film. For example, a change in the charge states of the defect states that can be formed in the silicon oxide film is smaller; thus, a change in the threshold voltage of the transistor due to gate bias temperature (GBT) stress can be smaller.

The structure described in this embodiment can be used in appropriate combination with the structure described in any of the other embodiments.

Embodiment 5

In this embodiment, an example of a circuit of a semiconductor device including the transistor or the like of one embodiment of the present invention will be described.
<Circuit>
An example of a circuit of a semiconductor device including a transistor or the like of one embodiment of the present invention is described below with reference to FIG. 40 and FIG. 41.

Figure 40:
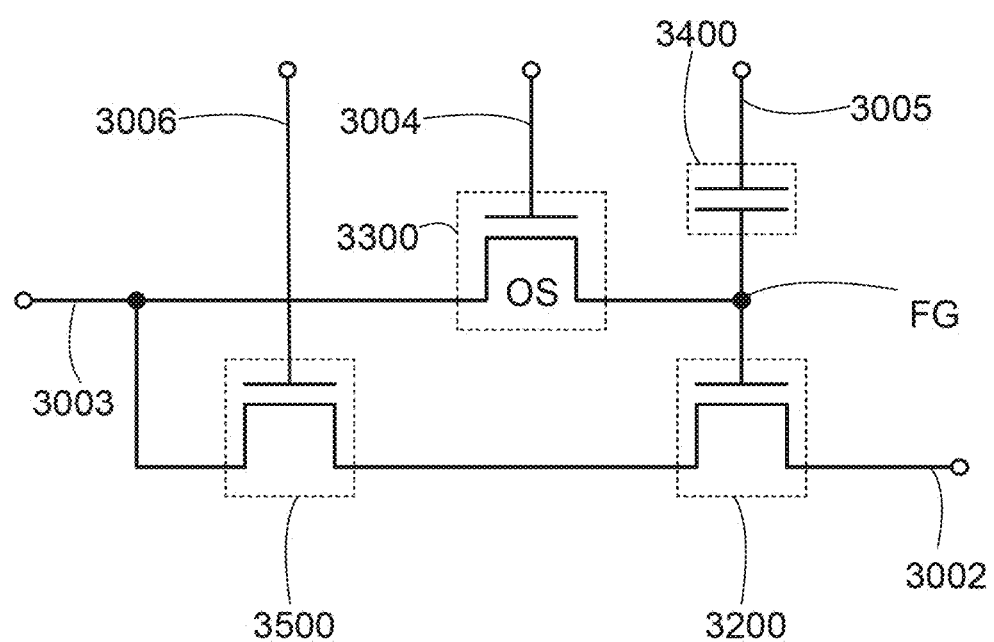
FIG. 40 is a circuit diagram illustrating a memory device of one embodiment of the present invention.

<Memory Device 1>
The semiconductor device in FIG. 40 is different from the semiconductor device described in the above embodiment in that a transistor 3500 and a wiring 3006 are provided. Also in this case, data can be written and retained in a manner similar to that of the semiconductor device described in the above embodiment. A transistor similar to the above-described transistor 200 can be used as the transistor 3500.

The wiring 3006 is electrically connected to a gate of the transistor 3500, one of a source and a drain of the transistor 3500 is electrically connected to a drain of the transistor 3200, and the other of the source and the drain of the transistor 3500 is electrically connected to the wiring 3003.
<Memory Device 2>
A modification example of the semiconductor device (memory device) is described with reference to a circuit diagram in FIG. 41.

Figure 41:
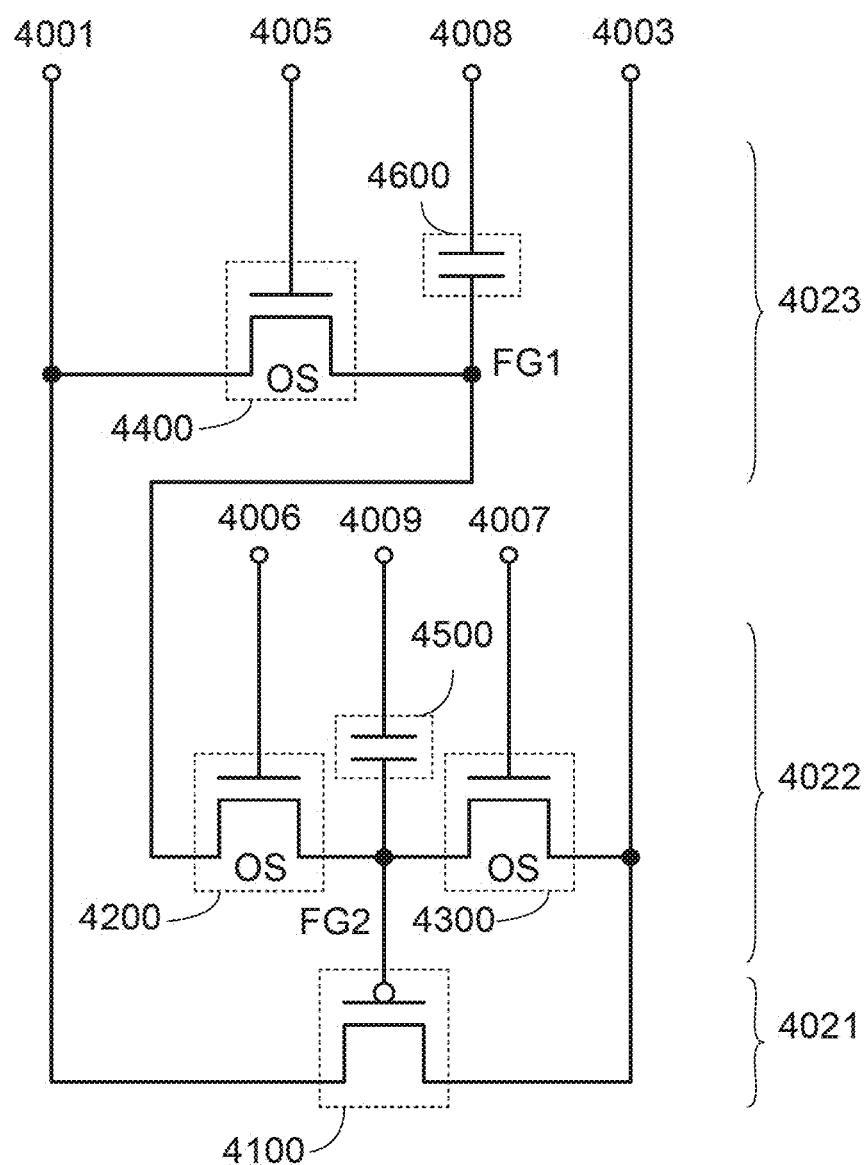
FIG. 41 is a circuit diagram illustrating a memory device of one embodiment of the present invention.

The semiconductor device illustrated in FIG. 41 includes a transistor 4100, a transistor 4200, a transistor 4300, a transistor 4400, a capacitor 4500, and a capacitor 4600. Here, a transistor similar to the above-described transistor 300 can be used as the transistor 4100, and transistors similar to the above-described transistor 200 can be used as the transistors 4200 to 4400. In addition, capacitors similar to the capacitor 100 can be used as the capacitor 4500 and the capacitor 4600. Although not illustrated in FIG. 41, a plurality of semiconductor devices in FIG. 41 are provided in a matrix. The semiconductor devices in FIG. 41 can control writing and reading of a data voltage in accordance with a signal or a potential supplied to a wiring 4001, a wiring 4003, a wiring 4005, a wiring 4006, a wiring 4007, a wiring 4008, and a wiring 4009.

One of a source and a drain of the transistor 4100 is connected to the wiring 4003. The other of the source and the drain of the transistor 4100 is connected to the wiring 4001. Although the transistor 4100 is a p-channel transistor in FIG. 41, the transistor 4100 may be an n-channel transistor.

The semiconductor device in FIG. 41 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200 to 4400 each function as a switch for control of writing a data voltage and retaining an electric charge. Note that, as each of the transistors 4200 to 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200 to 4400 are n-channel transistors in FIG. 41, the transistor 4200, the transistor 4300, and the transistor 4400 may be p-channel transistors.

The transistor 4200 and the transistor 4300 are preferably provided in a layer different from the layer where the transistor 4400 is provided even when the transistor 4200, the transistor 4300, and the transistor 4400 are transistors including oxide semiconductors. In other words, in the semiconductor device in FIG. 41, the transistor 4100, the transistor 4200 and the transistor 4300, and the transistor 4400 are preferably stacked. That is, by integrating the transistors, the circuit area can be reduced, so that the size of the semiconductor device can be reduced.

Next, operation of writing data to the semiconductor device in FIG. 41 is described.

First, operation of writing a data voltage to the data retention portion connected to the node FG1 (hereinafter referred to as writing operation 1) is described. In the following description, a data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wiring 4005 and the wiring 4006 are set at a high level. The wiring 4007 to 4009 are set at a low level. Then, the potential of the node FG2 in the electrically floating state is increased, so that current flows through the transistor 4100. By the current flow, the potential of the wiring 4001 is increased. The transistor 4400 and the transistor 4200 are turned on. Thus, as the potential of the wiring 4001 is increased, the potentials of the node FG1 and the node FG2 are increased. When the potential of the node FG2 is increased and a voltage ($V_{gs}$) between a gate and a source of the transistor 4100 reaches the threshold voltage $V_{th}$ of the transistor 4100, the current flowing through the transistor 4100 is decreased. Accordingly, the potentials of the wiring 4001, the node FG1, and the node FG2 stop increasing, so that the potentials of the nodes FG1 and FG2 are fixed at "$V_{D1}-V_{th}$" in which $V_{D1}$ is decreased by $V_{th}$.

When current flows through the transistor 4100, $V_{D1}$ supplied to the wiring 4003 is supplied to the wiring 4001, so that the potentials of the node FG1 and the node FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing a data voltage to the data retention portion connected to the node FG2 (hereinafter referred to as writing operation 2) is described. In the following description, a data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wiring 4005, the wiring 4006, the wiring 4008, and the wiring 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistor 4200 and the transistor 4400 are off and the potential of the node FG1 remains at "$V_{D1}-V_{th}$" written in the writing operation 1.

In the semiconductor device in FIG. 41, after data voltages are written to the plurality of data retention portions, the wiring 4009 is set at the high level, so that the potentials of the node FG1 and the node FG2 are increased. Then, the transistors are turned off to stop the movement of electric charge; thus, the written data voltages are retained.

By the above-described writing operation of the data voltages to the node FG1 and the node FG2, the data voltages can be retained in the plurality of data retention portions. Although examples where "$V_{D1}-V_{th}$" and "$V_{D2}-V_{th}$" are used as the written potentials are described, they are data voltages corresponding to multi-level data. Therefore, in the case where the data retention portions each retain 4-bit data, 16-level "$V_{D1}-V_{th}$" and 16-level "$V_{D2}-V_{th}$" can be obtained.

Next, operation of reading data from the semiconductor device in FIG. 41 is described.

First, operation of reading a data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, a data voltage in the data retention portion connected to the node FG1 is transferred to the data retention portion connected to the node FG2. The wiring 4001 and the wiring 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$". Thus, the capacitance of the capacitor 4600 is preferably larger than the capacitance of the capacitor 4500. Alternatively, the potential written to the node FG1, "$V_{D1}-V_{th}$", is preferably larger than the potential corresponding to the same data, "$V_{D2}-V_{th}$". By changing the ratio of the capacitances and setting the written potential larger in advance as described above, a decrease in potential after the electric charge distribution can be suppressed. The change in potential due to the electric charge distribution is described later.

Next, operation of reading a data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$". The potential of the node FG2 is decreased, so that current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$", by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the node FG1 and the node FG2, the data voltages can be read from the plurality of data retention portions. For example, 4-bit (16-level) data is retained in each of the node FG1 and the node FG2, whereby 8-bit (256-level) data can be retained in total. Although a first layer 4021, a second layer 4033, and a third layer 4023 are provided in the structure illustrated in FIG. 41, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled out in reading. As a result, the storage capacity per memory cell can be improved and read data can be close to accurate data; thus, the data reliability becomes excellent.

The structure described in this embodiment can be used in appropriate combination with the structure described in any of the other embodiments.

Embodiment 6

In this embodiment, circuit configuration examples to which the OS transistors described in the above embodiment can be used will be described with reference to FIGS. 42A to 42C, FIGS. 43A to 43C, FIGS. 44A and 44B, and FIGS. 45A and 45B.

Figure 42A:
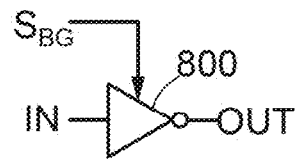
FIGS. 42A to 42C are circuit diagrams and a timing chart illustrating one embodiment of the present invention.

FIG. 42A is a circuit diagram of an inverter. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 42B:
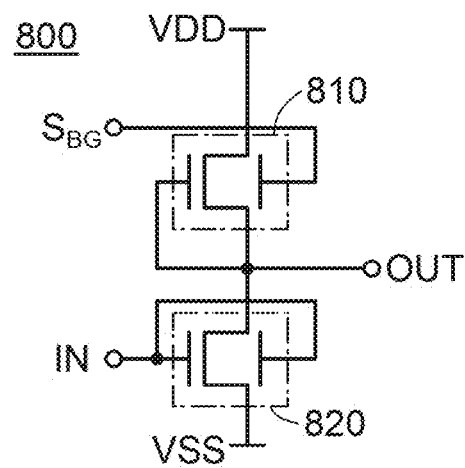

FIG. 42B illustrates an example of the inverter 800. The inverter 800 includes an OS transistor 810 and an OS transistor 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistor 810 and the OS transistor 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage $V_{SS}$.

Figure 42C:
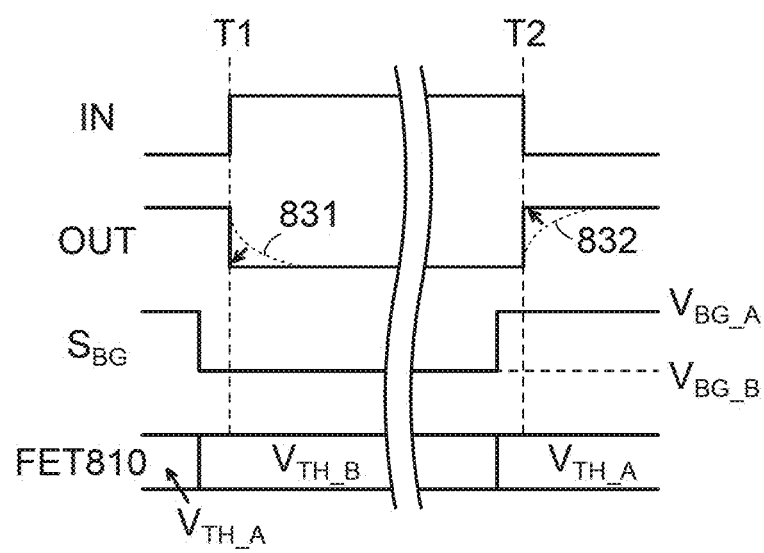

FIG. 42C is a timing chart illustrating the operation of the inverter 800. The timing chart in FIG. 42C illustrates changes of a signal waveform of the input terminal IN, a signal waveform of the output terminal OUT, a signal waveform of the signal $S_{BG}$, and the threshold voltage of the OS transistor 810 (FET 810).

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 43A:
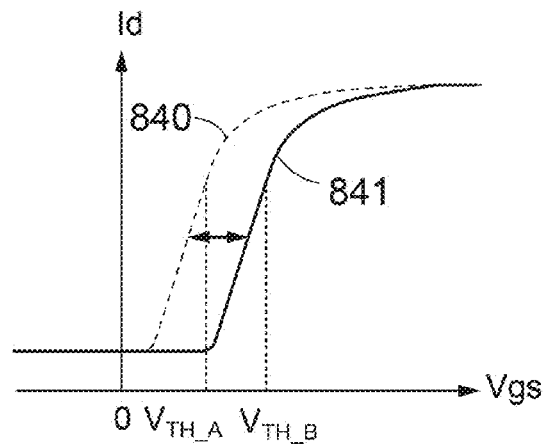
FIGS. 43A to 43C are a graph and circuit diagrams illustrating one embodiment of the present invention.

To visualize the above description, FIG. 43A shows a $V_g$-$I_d$ curve, which is one of indicators of the transistor's electrical characteristics.

When a high voltage such as the voltage $V_{BG\_A}$ is applied to the second gate, the electrical characteristics of the OS transistor 810 can be shifted to match a curve shown by a dashed line 840 in FIG. 43A. When a low voltage such as the voltage $V_{BG\_B}$ is applied to the second gate, the electrical characteristics of the OS transistor 810 can be shifted to match a curve shown by a solid line 841 in FIG. 43A. As shown in FIG. 43A, switching the signal $S_{BG}$ between the voltage $V_{BG\_A}$ and the voltage $V_{BG\_B}$ enables the threshold voltage of the OS transistor 810 to be shifted in the negative direction or the positive direction.

Figure 43B:
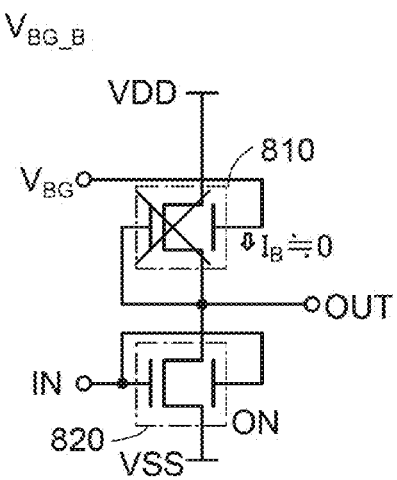

The shift of the threshold voltage in the positive direction toward the threshold voltage $V_{TH\_B}$ can make current less likely to flow in the OS transistor 810. FIG. 43B visualizes the state. As illustrated in FIG. 43B, a current $I_B$ that flows in the OS transistor 810 can be extremely low. Thus, when a signal supplied to the input terminal IN is at a high level and the OS transistor 820 is on (ON), the voltage of the output terminal OUT can drop sharply.

Since a state in which current is less likely to flow in the OS transistor 810 as illustrated in FIG. 43B can be obtained, a signal waveform 831 of the output terminal in the timing chart in FIG. 42C can be made steep. Shoot-through current between the wiring that supplies the voltage VDD and the wiring that supplies the voltage $V_{SS}$ can be low, leading to low-power operation.

Figure 43C:
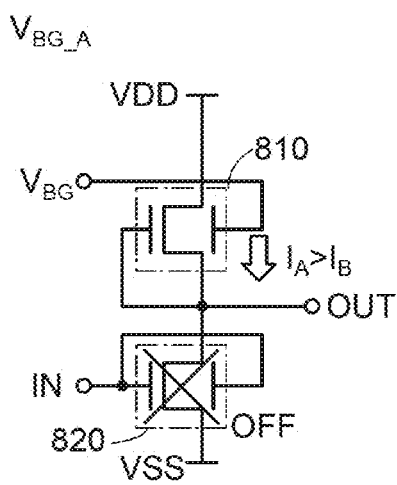

The shift of the threshold voltage in the negative direction toward the threshold voltage $V_{TH\_A}$ can make current flow easily in the OS transistor 810. FIG. 43C visualizes the state. As illustrated in FIG. 43C, a current $I_A$ flowing at this time can be higher than at least the current $I_B$. Thus, when a signal supplied to the input terminal IN is at a low level and the OS transistor 820 is off (OFF), the voltage of the output terminal OUT can be increased sharply.

Since a state in which current is likely to flow in the OS transistor 810 as illustrated in FIG. 43C can be obtained, a signal waveform 832 of the output terminal in the timing chart in FIG. 42C can be made steep.

Note that the threshold voltage of the OS transistor 810 is preferably controlled by the signal $S_{BG}$ before the state of the OS transistor 820 is switched, i.e., before time T1 or time T2. For example, as in FIG. 42C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 42C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 44A:
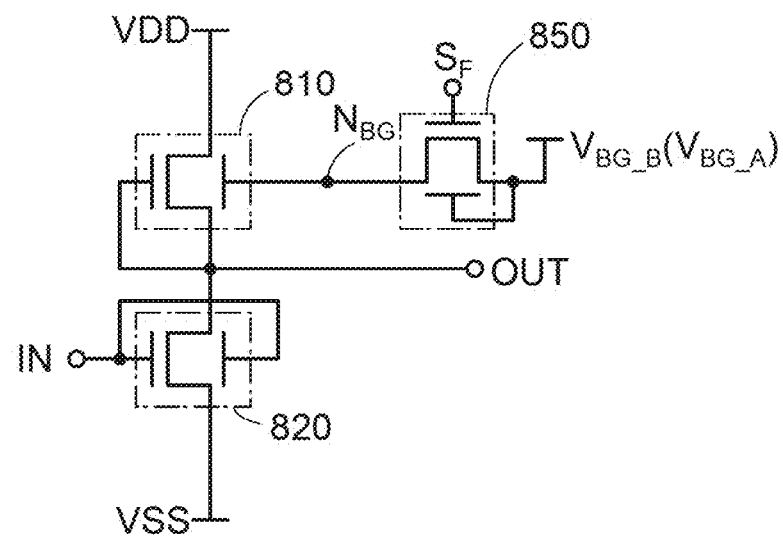
FIGS. 44A and 44B are a circuit diagram and a timing chart illustrating one embodiment of the present invention.

Although the timing chart in FIG. 42C illustrates the structure in which the level of the signal $S_{BG}$ is switched in accordance with the signal supplied to the input terminal IN, a different structure may be employed in which voltage for controlling the threshold voltage is retained by the second gate of the OS transistor 810 in a floating state, for example. FIG. 44A illustrates an example of such a circuit configuration.

The circuit configuration in FIG. 44A is the same as that in FIG. 42B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 44B:
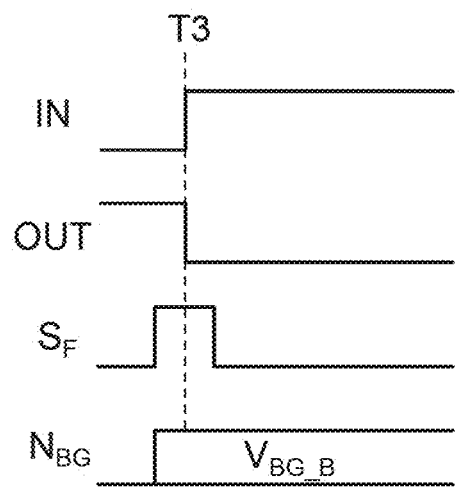

The operation with the circuit configuration in FIG. 44A is described with reference to a timing chart in FIG. 44B.

The voltage for controlling the threshold voltage of the OS transistor 810 is supplied to the second gate of the OS transistor 810 before time T3 at which the level of the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off and the node $N_{BG}$ is in a state that is very close to a floating state. Therefore, the number of times the voltage $V_{BG\_B}$ is supplied to the second gate of the OS transistor 850 can be reduced and accordingly, the power consumption for rewriting the voltage $V_{BG\_B}$ can be reduced.

Figure 45A:
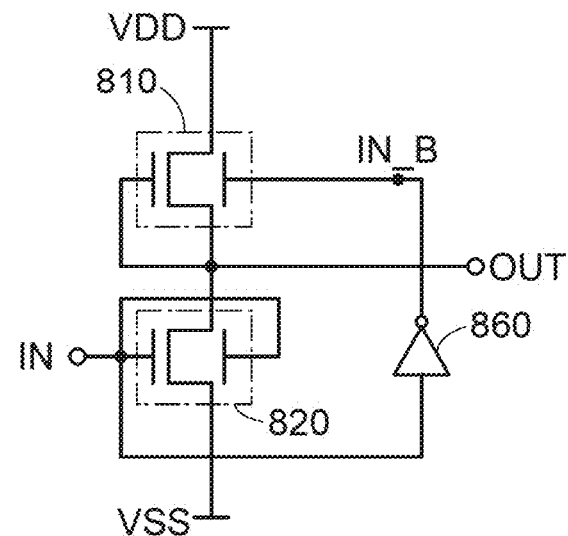
FIGS. 45A and 45B are a circuit diagram and a timing chart illustrating one embodiment of the present invention.

Although FIG. 42B and FIG. 44A each illustrate the case where the voltage is supplied to the second gate of the OS transistor 810 by control from the outside, a different structure may be employed in which voltage for controlling the threshold voltage is generated on the basis of the signal supplied to the input terminal IN and supplied to the second gate of the OS transistor 810, for example. FIG. 45A illustrates an example of such a circuit configuration.

The circuit configuration in FIG. 45A is the same as that in FIG. 42B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 45A is described with reference to a timing chart in FIG. 45B. The timing chart in FIG. 45B illustrates changes of a signal waveform of the input terminal IN, a signal waveform of the output terminal OUT, an output waveform IN_B of the CMOS inverter 860, and a threshold voltage of the OS transistor 810 (FET 810).

The output waveform IN_B which corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIGS. 42A to 42C. For example, the signal supplied to the input terminal IN is at a high level and the OS transistor 820 is turned on at time T4 in FIG. 45B. At this time, the output waveform IN_B is at a low level. Accordingly, current can be made less likely to flow in the OS transistor 810; thus, the voltage of the output terminal OUT can be decreased sharply.

Figure 45B:
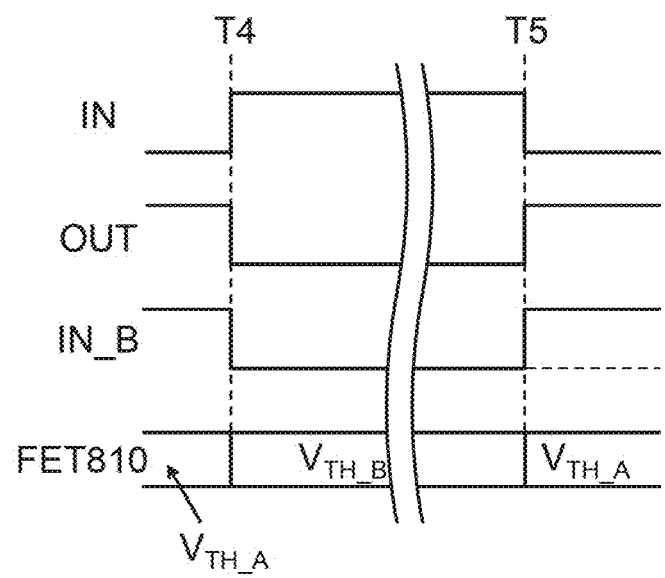

Moreover, the signal supplied to the input terminal IN is at a low level and the OS transistor 820 is turned off at time T5 in FIG. 45B. At this time, the output waveform IN_B is at a high level. Accordingly, current can easily flow in the OS transistor 810; thus, the voltage of the output terminal OUT can be increased sharply.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

The structure described in this embodiment can be used in appropriate combination with the structure described in any of the other embodiments.

Embodiment 7

In this embodiment, examples of a semiconductor device which includes a plurality of circuits including OS transistors described in the above embodiment will be described with reference to FIGS. 46A to 46E, FIGS. 47A and 47B, FIGS. 48A and 48B, FIGS. 49A to 49C, FIGS. 50A and 50B, FIGS. 51A to 51C, and FIGS. 52A and 52B.

Figure 46A:
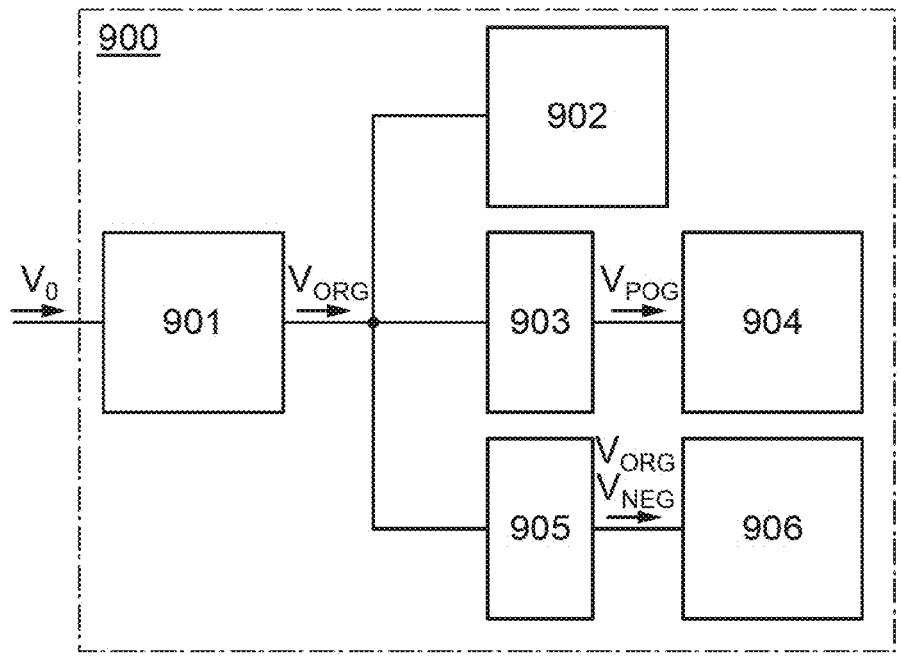
FIGS. 46A to 46E are a block diagram, circuit diagrams, and waveform diagrams for illustrating one embodiment of the present invention.

FIG. 46A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without the supply of a plurality of power supply voltages from the outside.

The circuit 902, the circuit 904, and the circuit 906 operate with different power supply voltages. For example, the power supply voltage of the circuit 902 is a voltage applied on the basis of the voltage $V_{ORG}$ and the voltage $V_{SS}$ ($V_{ORG}>V_{SS}$). For example, the power supply voltage of the circuit 904 is a voltage applied on the basis of a voltage $V_{POG}$ and the voltage $V_{SS}$ ($V_{POG}>V_{ORG}$). For example, the power supply voltages of the circuit 906 are voltages applied on the basis of the voltage $V_{ORG}$, the voltage $V_{SS}$, and a voltage $V_{NEG}$ ($V_{ORG}>V_{SS}>V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 46B:
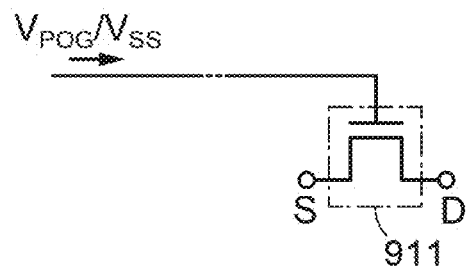
Figure 46C:
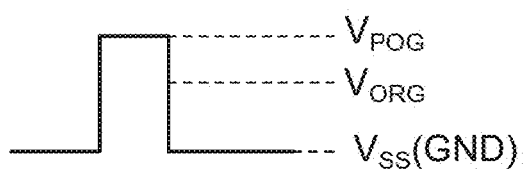

FIG. 46B illustrates an example of the circuit 904 that operates with the voltage $V_{POG}$ and FIG. 46C illustrates an example of a waveform of a signal for operating the circuit 904.

FIG. 46B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ at the time when the transistor 911 is turned on and on the basis of the voltage $V_{SS}$ at the time when the transistor 911 is turned off. As shown in FIG. 46C, the voltage $V_{POG}$ is higher than the voltage $V_{ORG}$. Therefore, an operation for bringing a source (S) and a drain (D) of the transistor 911 into a conduction state can be performed more surely. As a result, the frequency of malfunction of the circuit 904 can be reduced.

Figure 46D:
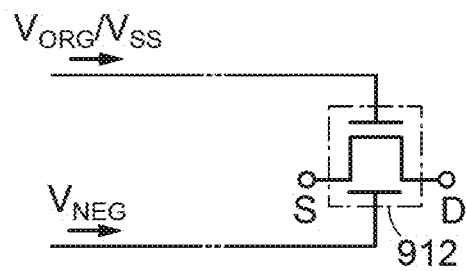
Figure 46E:
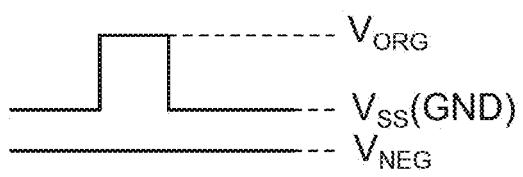

FIG. 46D illustrates an example of the circuit 906 that operates with the voltage $V_{NEG}$ and FIG. 46E illustrates an example of a waveform of a signal for operating the circuit 906.

FIG. 46D illustrates a transistor 912 having a back gate. A signal supplied to a gate of the transistor 912 is generated on the basis of, for example, the voltage $V_{ORG}$ and the voltage $V_{SS}$. The signal has generated on the basis of the voltage $V_{ORG}$ at the time when the transistor 912 is turned on and on the basis of the voltage $V_{SS}$ at the time when the transistor 912 is turned off. A signal supplied to the back gate of the transistor 912 is generated on the basis of the voltage $V_{NEG}$. As shown in FIG. 46E, the voltage $V_{NEG}$ is lower than the voltage $V_{SS}$ (GND). Therefore, the threshold voltage of the transistor 912 can be controlled so as to be shifted in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may be supplied to the back gate of the transistor 912.

Figure 47A:
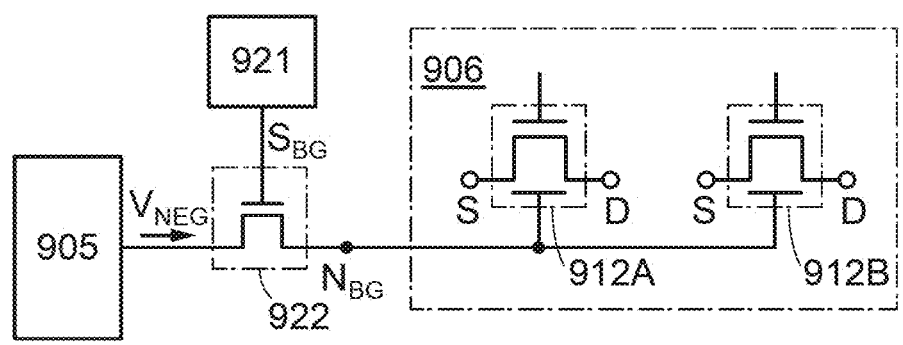
FIGS. 47A and 47B are a circuit diagram and a timing chart illustrating one embodiment of the present invention.
Figure 47B:
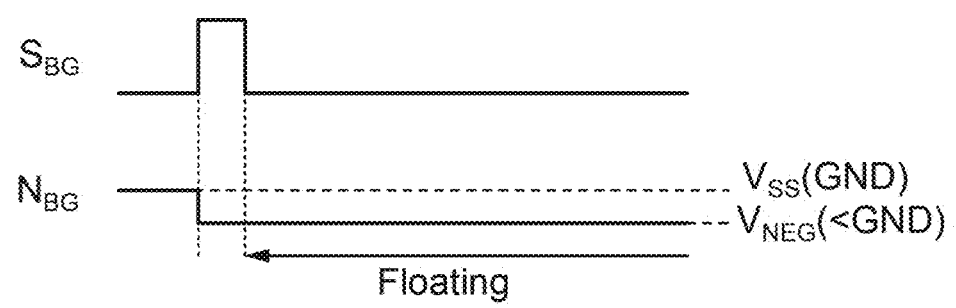

FIGS. 47A and 47B illustrate a modification example of FIGS. 46D and 46E.

In a circuit diagram illustrated in FIG. 47A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the conduction state of the transistor 922. A transistor 912A and a transistor 912B included in the circuit 906 are the same OS transistors as the transistor 922.

A timing chart in FIG. 47B shows changes in a potential of the control signal $S_{BG}$ and a potential of the node $N_{BG}$. The potential of the node $N_{BG}$ indicates the states of potentials of back gates of the transistor 912A and the transistor 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be retained.

Figure 48A:
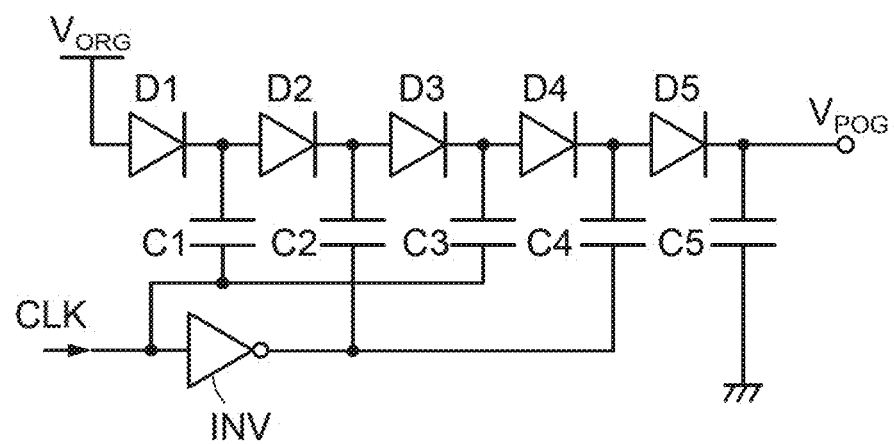
FIGS. 48A and 48B are circuit diagrams each illustrating one embodiment of the present invention.

FIG. 48A illustrates an example of a circuit configuration applicable to the above-described voltage generation circuit 903. The voltage generation circuit 903 illustrated in FIG. 48A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that a forward voltage of the diodes D1 to D5 is 0 V. A desired voltage $V_{POG}$ can be obtained when the number of stages of the charge pump is changed.

Figure 48B:
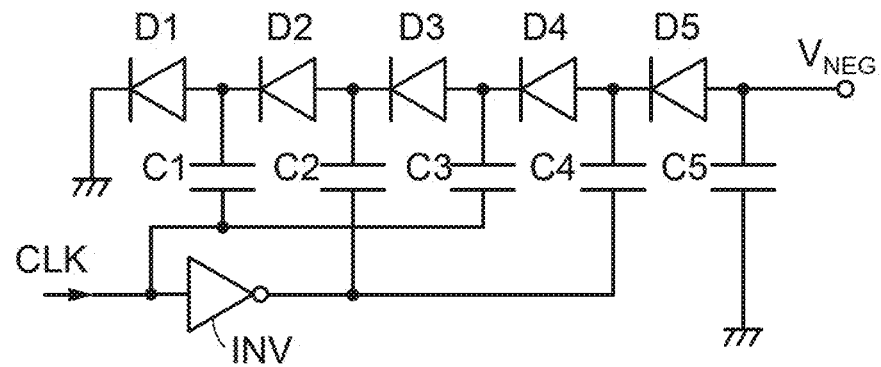

FIG. 48B illustrates an example of a circuit configuration applicable to the above-described voltage generation circuit 905. The voltage generation circuit 905 illustrated in FIG. 48B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that a forward voltage of the diodes D1 to D5 is 0 V. A desired voltage $V_{NEG}$ can be obtained when the number of stages of the charge pump is changed.

The circuit configuration of the voltage generation circuit 903 is not limited to the configuration of the circuit diagram illustrated in FIG. 48A. Modification examples of the voltage generation circuit 903 are illustrated in FIGS. 49A to 49C and FIGS. 50A and 50B.

Figure 49A:
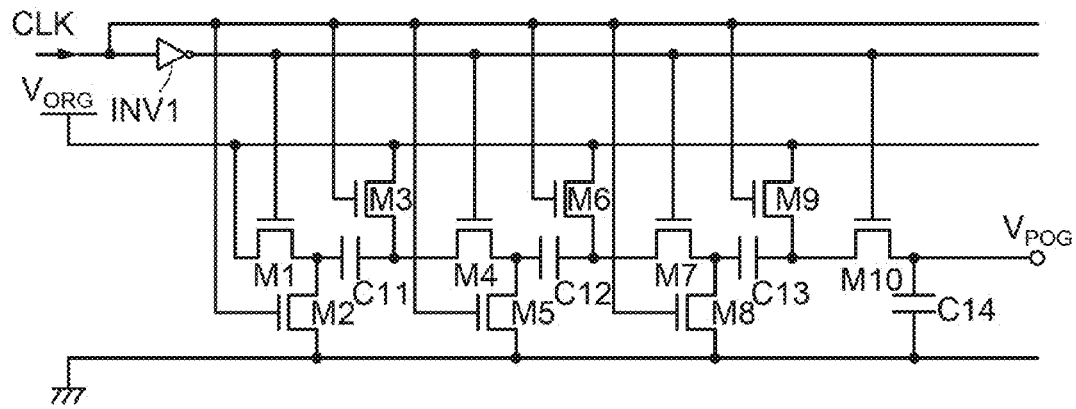
FIGS. 49A to 49C are circuit diagrams each illustrating one embodiment of the present invention.

A voltage generation circuit 903A illustrated in FIG. 49A includes transistors M1 to M10, capacitors C11 to C14, and an inverter INV1. The clock signal CLK is supplied to gates of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. A desired voltage $V_{POG}$ can be obtained when the number of stages is changed. In the voltage generation circuit 903A in FIG. 49A, an off-state current of each of the transistors M1 to M10 can be low when the transistors M1 to M10 are OS transistors, and leakage of charge retained in the capacitors C11 to C14 can be suppressed. Thus, efficient voltage increase from the voltage $V_{ORG}$ to the voltage $V_{POG}$ is possible.

Figure 49B:
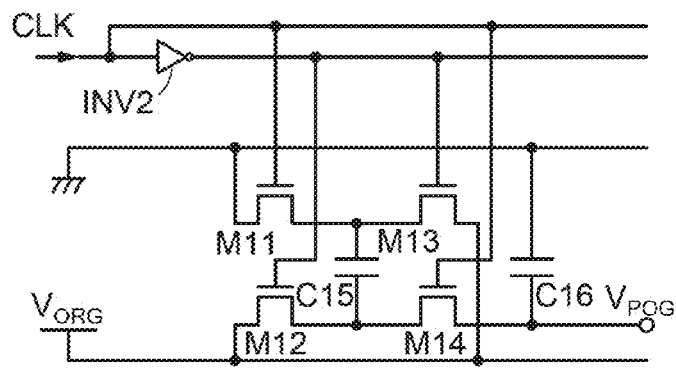

A voltage generation circuit 903B illustrated in FIG. 49B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 903B in FIG. 49B, an off-state current of each of the transistors M11 to M14 can be low when the transistors M11 to M14 are OS transistors, and leakage of charge retained in the capacitors C15 and C16 can be suppressed. Thus, efficient voltage increase from the voltage $V_{ORG}$ to the voltage $V_{POG}$ is possible.

Figure 49C:
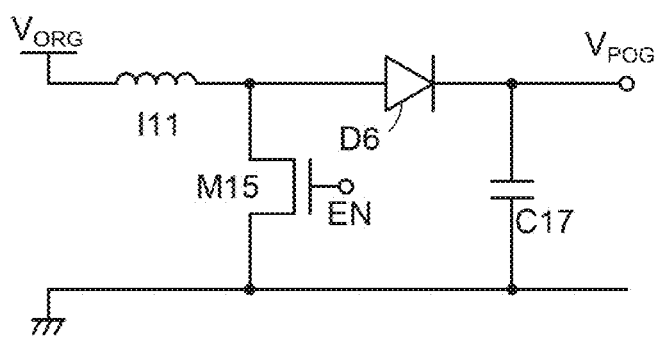

A voltage generation circuit 903C illustrated in FIG. 49C includes an inductor I10 μl, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 49C increases the voltage using the inductor I11, the voltage can be increased efficiently.

Figure 50A:
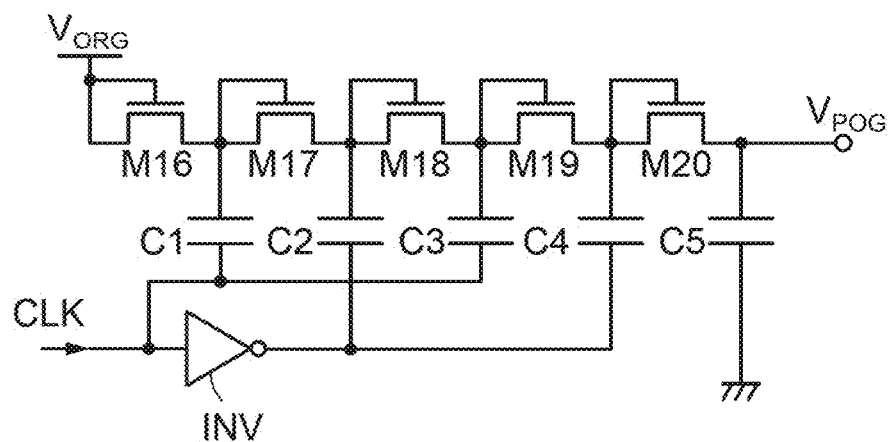
FIGS. 50A and 50B are circuit diagrams each illustrating one embodiment of the present invention.

A voltage generation circuit 903D illustrated in FIG. 50A has a configuration in which the diodes D1 to D5 of the voltage generation circuit 903 in FIG. 48A are replaced with diode-connected transistors M16 to M20. In the voltage generation circuit 903D in FIG. 50A, when the OS transistors are used as the transistors M16 to M20, the off-state current can be reduced, so that leakage of charge retained in the capacitors C1 to C5 can be inhibited. Thus, efficient voltage increase from the voltage $V_{ORG}$ to the voltage $V_{POG}$ is possible.

Figure 50B:
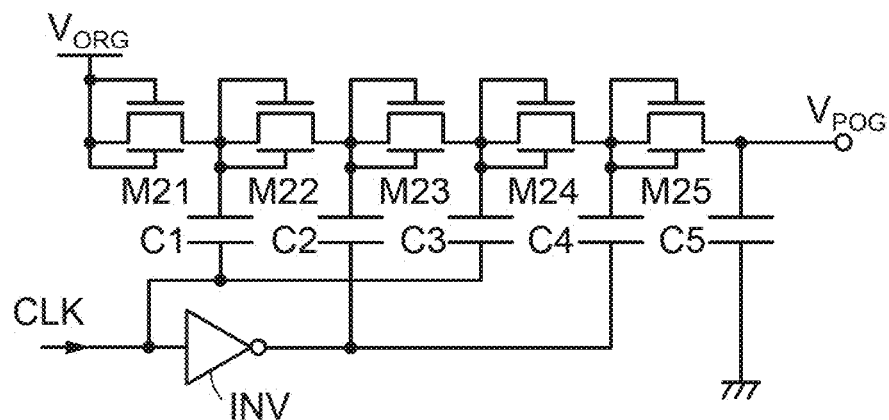
Figure 51A:
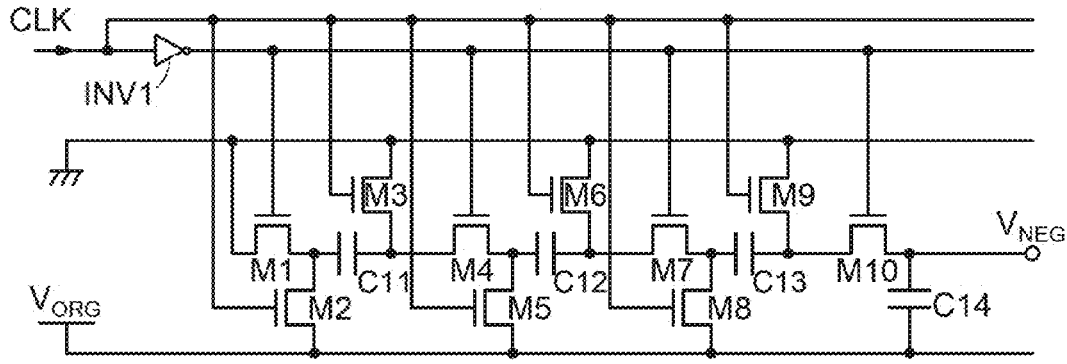
FIGS. 51A to 51C are circuit diagrams each illustrating one embodiment of the present invention.
Figure 51B:
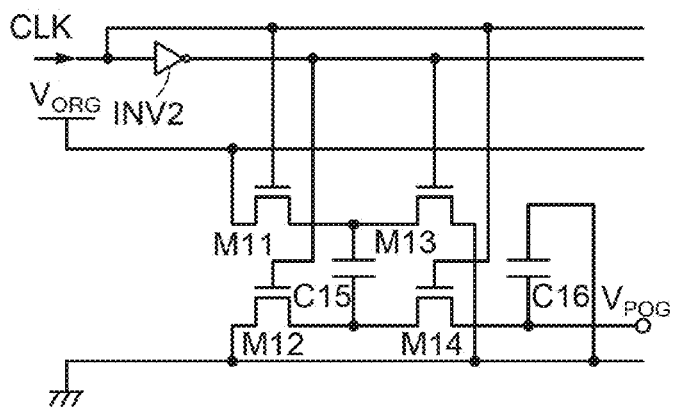
Figure 51C:
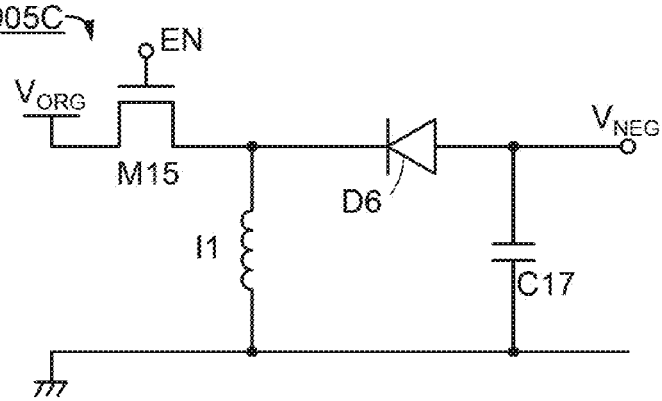
Figure 52A:
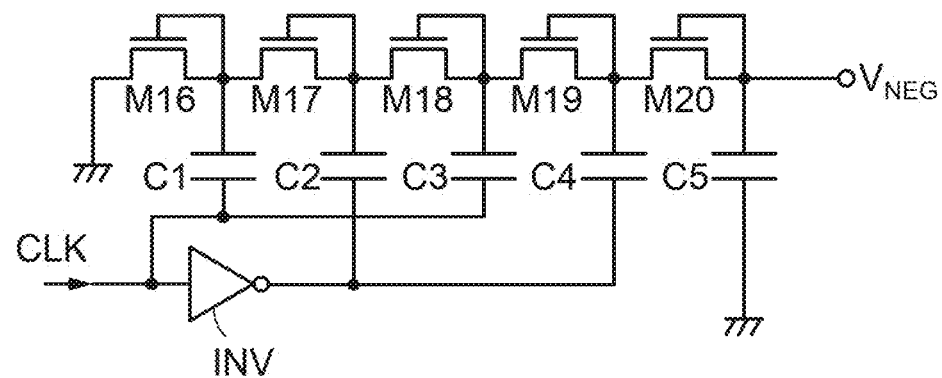
FIGS. 52A and 52B are circuit diagrams each illustrating one embodiment of the present invention.
Figure 52B:
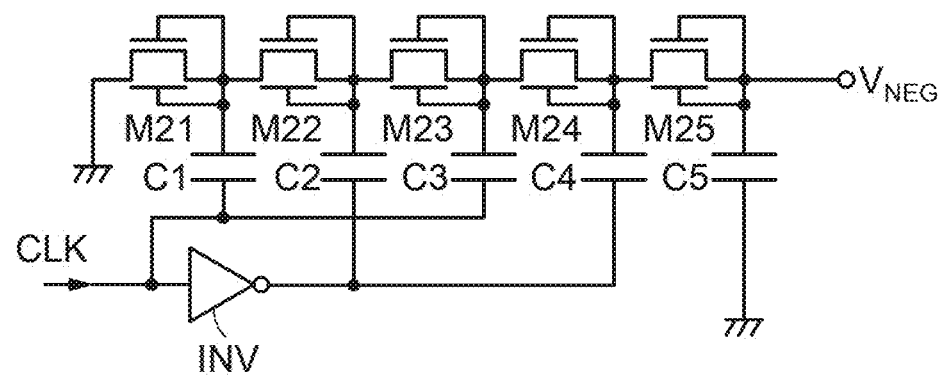

A voltage generation circuit 903E illustrated in FIG. 50B has a configuration in which the transistors M16 to M20 of the voltage generation circuit 903D in FIG. 50A are replaced with transistor M21 to M25 having back gates. In the voltage generation circuit 903E in FIG. 50B, the back gates can be supplied with voltages that are the same as those of the gates, so that the current flowing through the transistors can be increased. Thus, efficient voltage increase from the voltage $V_{ORG}$ to the voltage $V_{POG}$ is possible.

Note that the modification examples of the voltage generation circuit 903 can also be applied to the voltage generation circuit 905 in FIG. 48B. The configurations of a circuit diagram in this case are illustrated in FIGS. 51A to 51C and FIGS. 52A and 52B. In a voltage generation circuit 905A illustrated in FIG. 51A, the voltage $V_{NEG}$ which has been reduced from the voltage $V_{SS}$ to a negative voltage having a negatively tripled value of the voltage $V_{ORG}$ by application of the clock signal CLK, can be obtained. In a voltage generation circuit 905B illustrated in FIG. 51B, the voltage $V_{NEG}$ which has been reduced from the voltage $V_{SS}$ to a negative voltage having a negatively doubled value of the voltage $V_{ORG}$ by application of the clock signal CLK, can be obtained.

The voltage generation circuits 905A to 905E illustrated in FIGS. 51A to 51C and FIGS. 52A and 52B have configurations formed by changing the voltages applied to the wirings or the arrangement of the elements of the voltage generation circuits 903A to 903E illustrated in FIGS. 49A to 49C and FIGS. 50A and 50B. In the voltage generation circuits 905A to 905E illustrated in FIGS. 51A to 51C and FIGS. 52A and 52B, an efficient voltage decrease from the voltage $V_{SS}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

The structure described in this embodiment can be used in appropriate combination with the structure described in any of the other embodiments.

Embodiment 8

In this embodiment, an example of CPU including semiconductor devices such as the transistor of one embodiment of the present invention and the above-described memory device will be described.

<Configuration of CPU>

Figure 53:
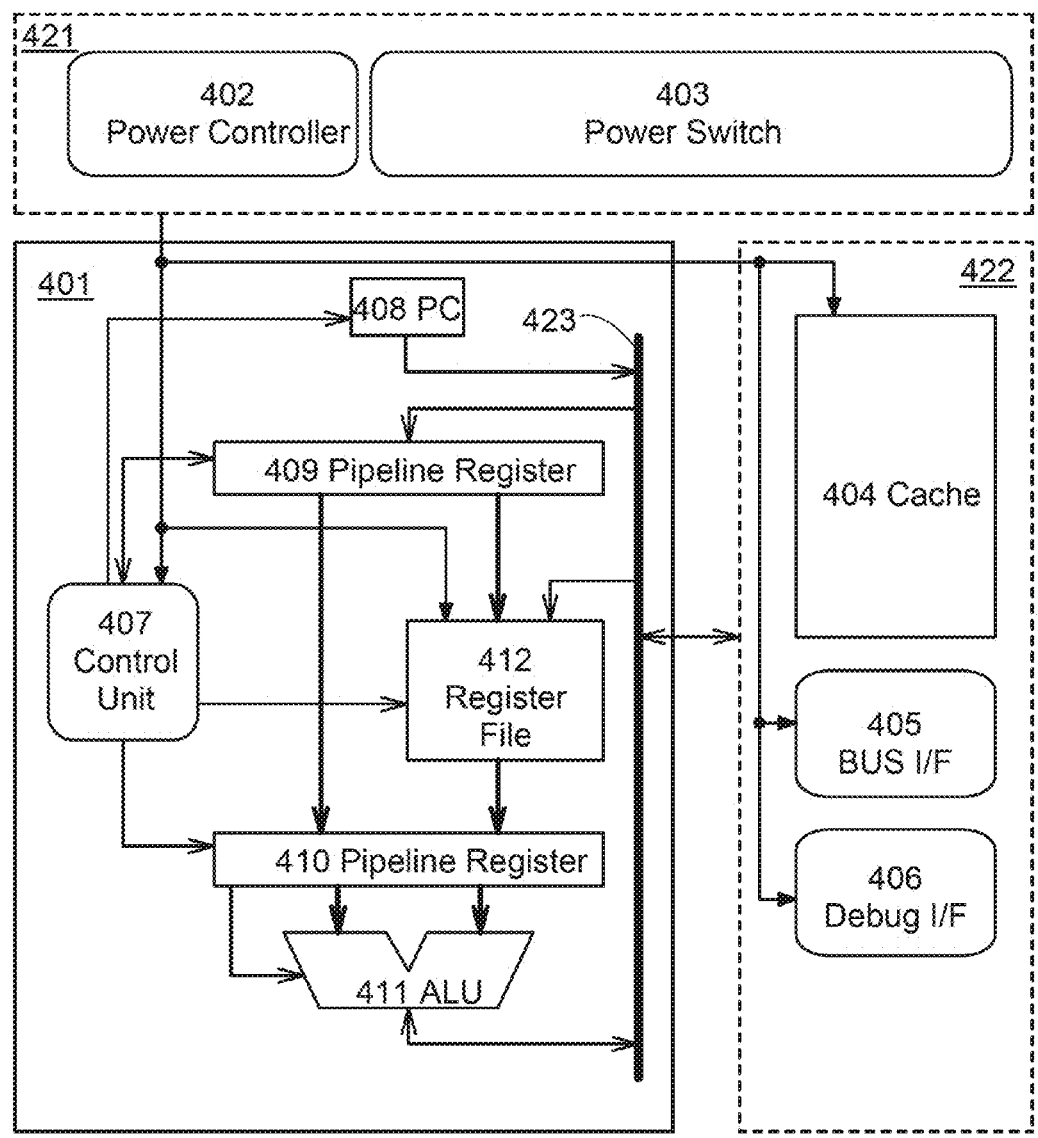
FIG. 53 is a block diagram illustrating a semiconductor device of one embodiment of the present invention.

A semiconductor device 400 illustrated in FIG. 53 includes a CPU core 401, a power management unit 421, and a peripheral circuit 422. The power management unit 421 includes a power controller 402 and a power switch 403. The peripheral circuit 422 includes a cache 404 including cache memory, a bus interface (BUS I/F) 405, and a debug interface (Debug I/F) 406. The CPU core 401 includes a data bus 423, a control unit 407, a program counter (PC) 408, a pipeline register 409, a pipeline register 410, an arithmetic logic unit (ALU) 411, and a register file 412. Data is transmitted between the CPU core 401 and the peripheral circuit 422 such as the cache 404 via the data bus 423.

The semiconductor device (cell) can be used for many logic circuits typified by the power controller 402 and the control unit 407, particularly to all logic circuits that can be constituted using standard cells. Accordingly, the semiconductor device 400 can be small. The semiconductor device 400 can have reduced power consumption. The semiconductor device 400 can have a higher operating speed. Furthermore, it is possible to provide the semiconductor device 400 which can have a smaller change in power supply voltage.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 400, the semiconductor device 400 can be small. The semiconductor device 400 can have reduced power consumption. The semiconductor device 400 can have a higher operating speed. Particularly when the Si transistors are only p-channel ones, the manufacturing cost can be reduced.

The control unit 407 has functions of totally controlling operations of the PC 408, the pipeline register 409, the pipeline register 410, the ALU 411, the register file 412, the cache 404, the bus interface 405, the debug interface 406, and the power controller 402 to decode and execute instructions contained in a program such as input applications.

The ALU 411 has a function of performing a variety of arithmetic operations such as four arithmetic operations and logic operations.

The cache 404 has a function of temporarily storing frequently-used data. The PC 408 is a register having a function of storing an address of an instruction to be executed next. Note that although not shown in FIG. 53, the cache 404 is provided with a cache controller for controlling the operation of the cache memory.

The pipeline register 409 has a function of temporarily storing instruction data.

The register file 412 includes a plurality of registers including a general purpose register and can store data that is read from the main memory, data obtained as a result of arithmetic operations in the ALU 411, or the like.

The pipeline register 410 has a function of temporarily storing data used for arithmetic operations of the ALU 411, data obtained as a result of arithmetic operations of the ALU 411, or the like.

The bus interface 405 has a function as a path for data between the semiconductor device 400 and various devices outside the semiconductor device 400. The debug interface 406 has a function as a path of a signal for inputting an instruction to control debugging to the semiconductor device 400.

The power switch 403 has a function of controlling supply of a power supply voltage to various circuits included in the semiconductor device 400 other than the power controller 402. The above various circuits belong to several different power domains. The power switch 403 controls whether the power supply voltage is supplied to the various circuits in the same power domain. In addition, the power controller 402 has a function of controlling the operation of the power switch 403.

The semiconductor device 400 having the above structure is capable of performing power gating. A description will be given of an example of the power gating operation sequence.

First, by the CPU core 401, timing for stopping the supply of the power supply voltage is set in a register of the power controller 402. Then, an instruction of starting power gating is sent from the CPU core 401 to the power controller 402. Then, various registers and the cache 404 included in the semiconductor device 400 start data storing. Then, the power switch 403 stops the supply of a power supply voltage to the various circuits other than the power controller 402 included in the semiconductor device 400. Then, an interrupt signal is input to the power controller 402, whereby the supply of the power supply voltage to the various circuits included in the semiconductor device 400 is started. Note that a counter may be provided in the power controller 402 to be used to determine the timing of starting the supply of the power supply voltage regardless of input of an interrupt signal. Next, the various registers and the cache 404 start data recovery. Then, the instruction is resumed in the control unit 407.

Such power gating can be performed in the whole processor or one or a plurality of logic circuits forming the processor. Furthermore, power supply can be stopped even for a short time. Consequently, power consumption can be reduced finely in terms of a space or time.

In performing power gating, data held by the CPU core 401 or the peripheral circuit 422 is preferably restored in a short time. In that case, the power can be turned on or off in a short time, and an effect of saving power becomes significant.

In order that the data held by the CPU core 401 or the peripheral circuit 422 be restored in a short time, the data is preferably restored to a flip-flop circuit itself (referred to as a flip-flop circuit capable of backup operation). Furthermore, the data is preferably restored to an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation can restore and return data in a short time in some cases.

An example of the flip-flop circuit capable of backup operation is described with reference to FIG. 54.

Figure 54:
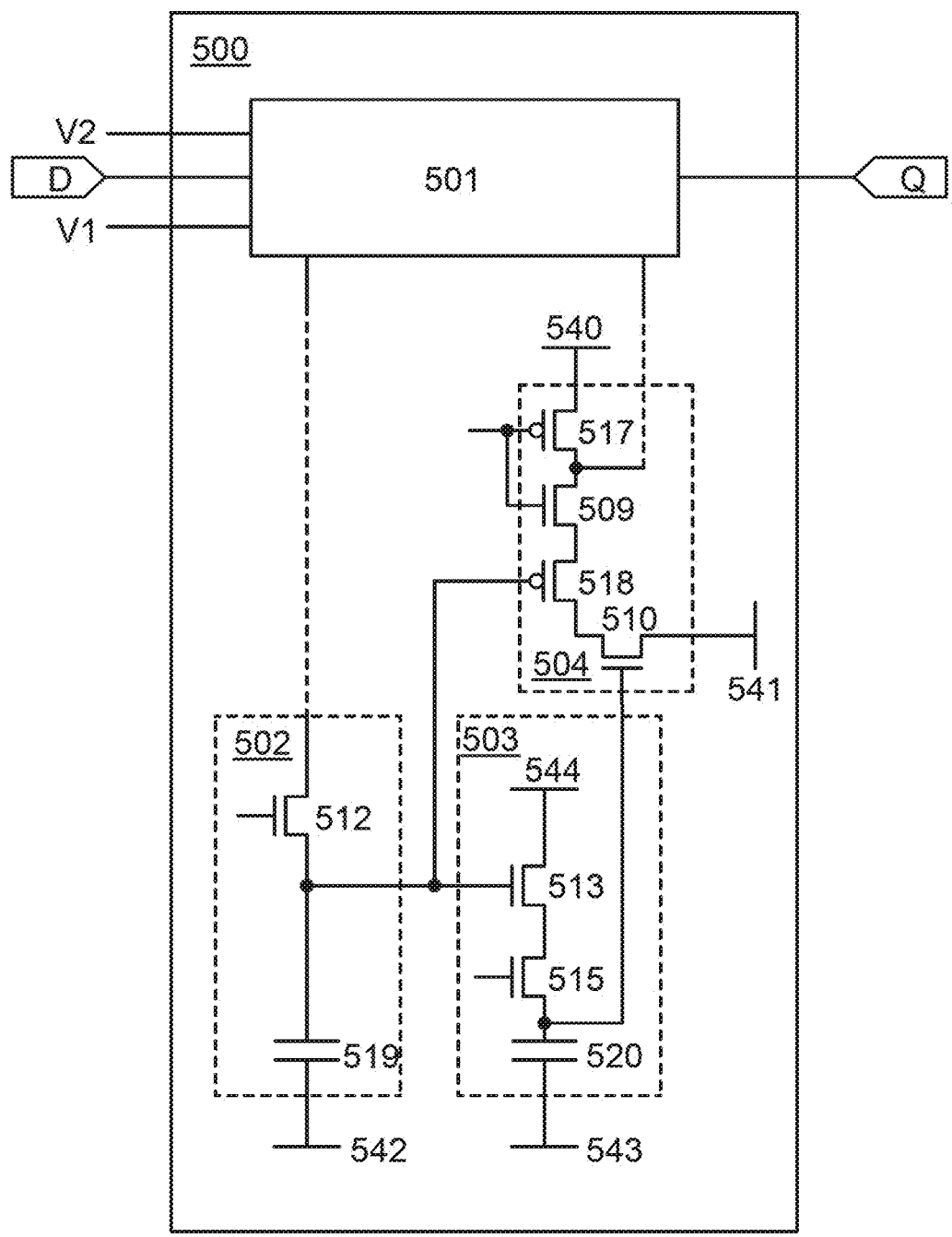
FIG. 54 is a circuit diagram illustrating a semiconductor device of one embodiment of the present invention.

A semiconductor device 500 illustrated in FIG. 54 is an example of the flip-flop circuit capable of backup operation. The semiconductor device 500 includes a first memory circuit 501, a second memory circuit 502, a third memory circuit 503, and a read circuit 504. As a power supply voltage, a potential difference between a potential V1 and a potential V2 is supplied to the semiconductor device 500. One of the potential V1 and the potential V2 is at a high level, and the other is at a low level. An example of the structure of the semiconductor device 500 when the potential V1 is at a low level and the potential V2 is at a high level will be described below.

The first memory circuit 501 has a function of retaining data when a signal D including the data is input in a period during which the power supply voltage is supplied to the semiconductor device 500. Furthermore, the first memory circuit 501 outputs a signal Q including the retained data in the period during which the power supply voltage is supplied to the semiconductor device 500. On the other hand, the first memory circuit 501 cannot retain data in a period during which the power supply voltage is not supplied to the semiconductor device 500. That is, the first memory circuit 501 can be referred to as a volatile memory circuit.

The second memory circuit 502 has a function of reading the data retained in the first memory circuit 501 to store (or restore) it. The third memory circuit 503 has a function of reading the data retained in the second memory circuit 502 to store (or restore) it. The read circuit 504 has a function of reading the data retained in the second memory circuit 502 or the third memory circuit 503 to store (or return) it in (to) the first memory circuit 501.

In particular, the third memory circuit 503 has a function of reading the data retained in the second memory circuit 502 to store (or restore) it even in the period during which the power supply voltage is not supplied to the semiconductor device 500.

As illustrated in FIG. 54, the second memory circuit 502 includes a transistor 512 and a capacitor 519. The third memory circuit 503 includes a transistor 513, a transistor 515, and a capacitor 520. The read circuit 504 includes a transistor 510, a transistor 518, a transistor 509, and a transistor 517.

The transistor 512 has a function of charging and discharging the capacitor 519 in accordance with data retained in the first memory circuit 501. The transistor 512 is desirably capable of charging and discharging the capacitor 519 at a high speed in accordance with data retained in the first memory circuit 501. Specifically, the transistor 512 desirably contains crystalline silicon (preferably polycrystalline silicon, further preferably single crystal silicon) in a channel formation region.

The conduction state or the non-conduction state of the transistor 513 is determined in accordance with the charge retained in the capacitor 519. The transistor 515 has a function of charging and discharging the capacitor 520 in accordance with the potential of a wiring 544 when the transistor 513 is in a conduction state. It is desirable that the off-state current of the transistor 515 be extremely low. Specifically, the transistor 515 desirably contains an oxide semiconductor (preferably an oxide containing In, Ga, and Zn) in a channel formation region.

Specific connection relations between the elements are described. One of a source and a drain of the transistor 512 is connected to the first memory circuit 501. The other of the source and the drain of the transistor 512 is connected to one electrode of the capacitor 519, a gate of the transistor 513, and a gate of the transistor 518. The other electrode of the capacitor 519 is connected to a wiring 542. One of a source and a drain of the transistor 513 is connected to the wiring 544. The other of the source and the drain of the transistor 513 is connected to one of a source and a drain of the transistor 515. The other of the source and the drain of the transistor 515 is connected to one electrode of the capacitor 520 and a gate of the transistor 510. The other electrode of the capacitor 520 is connected to a wiring 543. One of a source and a drain of the transistor 510 is connected to a wiring 541. The other of the source and the drain of the transistor 510 is connected to one of a source and a drain of the transistor 518. The other of the source and the drain of the transistor 518 is connected to one of a source and a drain of the transistor 509. The other of the source and the drain of the transistor 509 is connected to one of a source and a drain of the transistor 517 and the first memory circuit 501. The other of the source and the drain of the transistor 517 is connected to a wiring 540. Furthermore, although a gate of the transistor 509 is connected to a gate of the transistor 517 in FIG. 54, the gate of the transistor 509 is not necessarily connected to the gate of the transistor 517.

The transistor described in the above embodiment as an example can be applied to the transistor 515. Because of the low off-state current of the transistor 515, the semiconductor device 500 can retain data for a long time without power supply. The favorable switching characteristics of the transistor 515 allow the semiconductor device 500 to perform high-speed backup and recovery.

The structure described in this embodiment can be used in appropriate combination with the structure described in any of the other embodiments.

Embodiment 9

In this embodiment, an example of an imaging device including the transistor or the like of one embodiment of the present invention will be described.
<Imaging Device>

An imaging device of one embodiment of the present invention is described below.

Figure 55A:
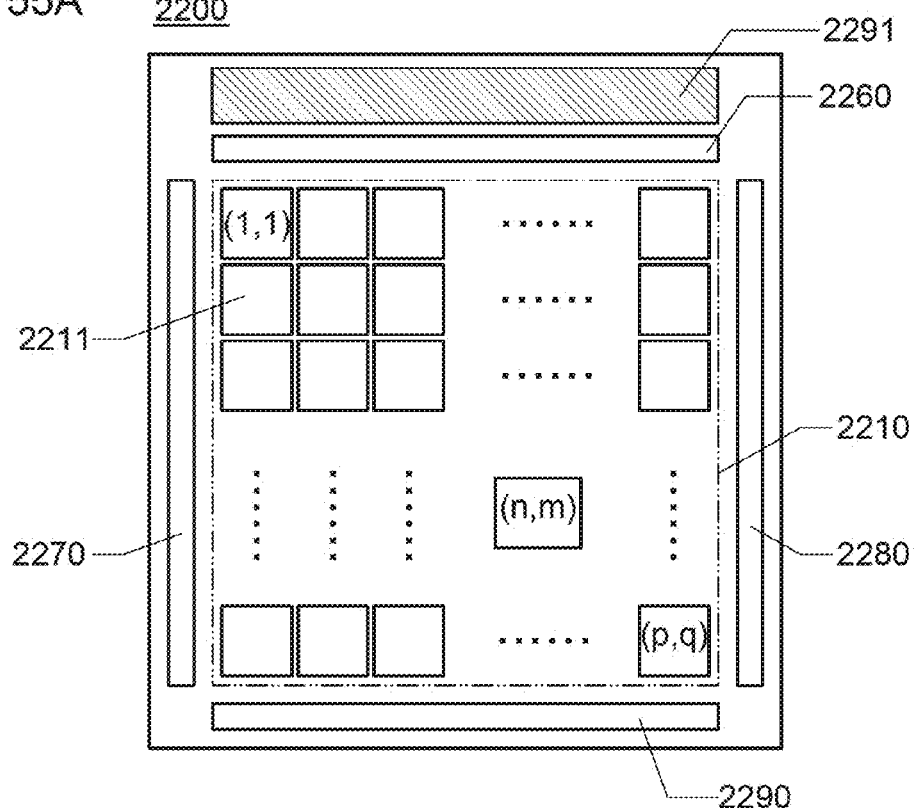
FIGS. 55A and 55B are top views each illustrating a semiconductor device of one embodiment of the present invention.

FIG. 55A is a plan view illustrating an example of an imaging device 2200 of one embodiment of the present invention. The imaging device 2200 includes a pixel portion 2210 and peripheral circuits for driving the pixel portion 2210 (a peripheral circuit 2260, a peripheral circuit 2270, a peripheral circuit 2280, and a peripheral circuit 2290). The pixel portion 2210 includes a plurality of pixels 2211 arranged in a matrix with p rows and q columns (p and q are each an integer of 2 or more). The peripheral circuit 2260, the peripheral circuit 2270, the peripheral circuit 2280, and the peripheral circuit 2290 are each connected to the plurality of pixels 2211, and a signal for driving the plurality of pixels 2211 is supplied. In this specification and the like, in some cases, a "peripheral circuit" or a "driver circuit" indicate all of the peripheral circuit 2260, the peripheral circuit 2270, the peripheral circuit 2280, and the peripheral circuit 2290. For example, the peripheral circuit 2260 can be regarded as part of the peripheral circuit.

The imaging device 2200 preferably includes a light source 2291. The light source 2291 can emit detection light P1.

The peripheral circuit includes at least one of a logic circuit, a switch, a buffer, an amplifier circuit, and a converter circuit. The peripheral circuit may be formed over a substrate where the pixel portion 2210 is formed. A semiconductor device such as an IC chip may be used as part or the whole of the peripheral circuit. Note that as the peripheral circuit, one or more of the peripheral circuit 2260, the peripheral circuit 2270, the peripheral circuit 2280, and the peripheral circuit 2290 may be omitted.

Figure 55B:
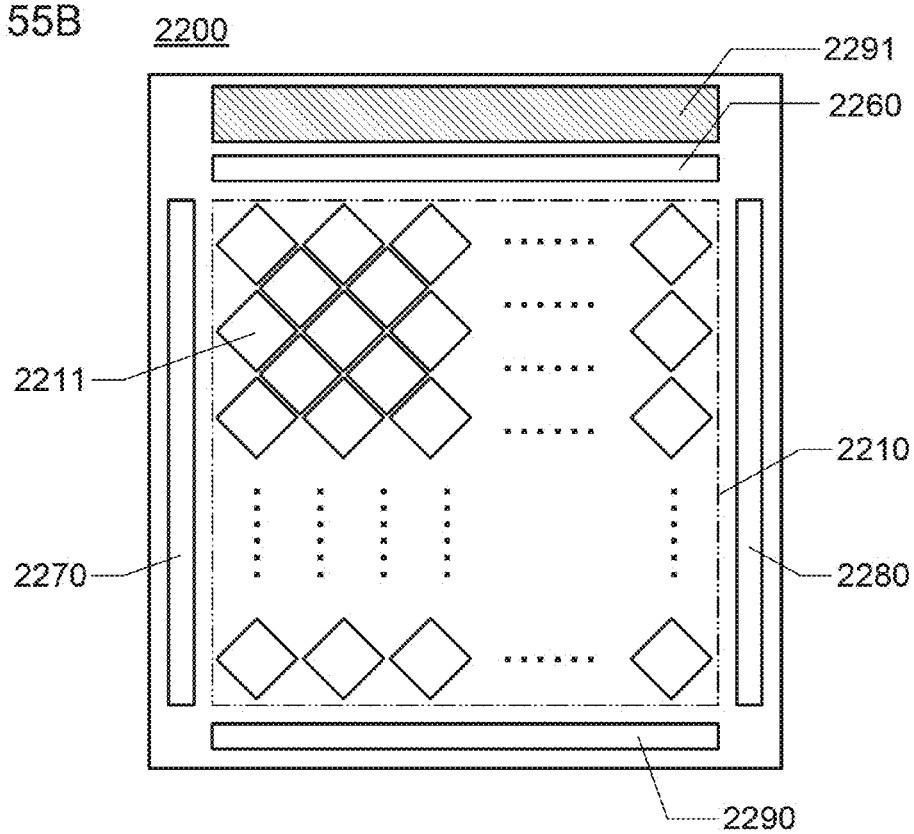

As illustrated in FIG. 55B, the pixels 2211 may be provided to be inclined in the pixel portion 2210 included in the imaging device 2200. When the pixels 2211 are obliquely arranged, the distance between pixels (pitch) can be shortened in the row direction and the column direction. Accordingly, the quality of an image taken with the imaging device 2200 can be improved.

Configuration Example 1 of Pixel

The pixel 2211 included in the imaging device 2200 is formed with a plurality of subpixels 2212, and each subpixel 2212 is combined with a filter (color filter) which transmits light in a specific wavelength band, whereby data for achieving color image display can be obtained.

Figure 56A:
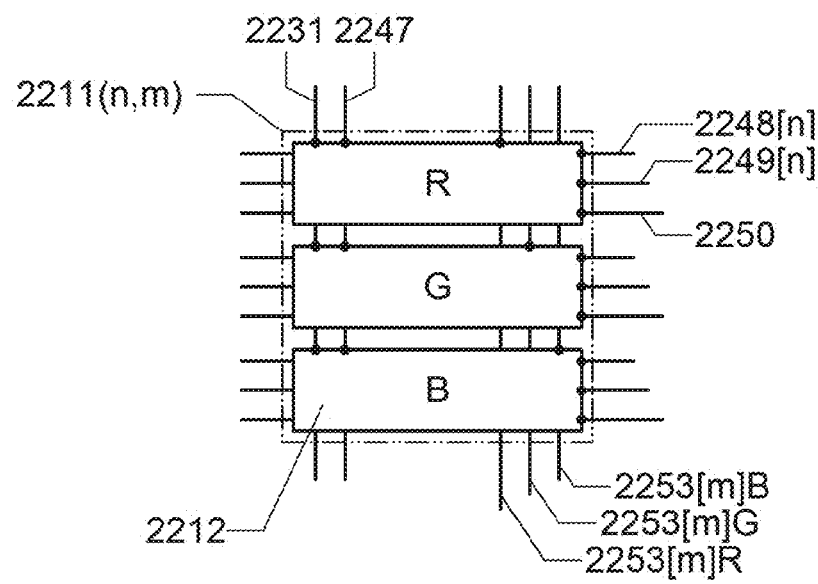
FIGS. 56A and 56B are block diagrams illustrating a semiconductor device of one embodiment of the present invention.

FIG. 56A is a plan view illustrating an example of the pixel 2211 with which a color image is obtained. The pixel 2211 illustrated in FIG. 56A includes a subpixel 2212 provided with a color filter that transmits light in a red (R) wavelength band (also referred to as a subpixel 2212R), a subpixel 2212 provided with a color filter that transmits light in a green (G) wavelength band (also referred to as a subpixel 2212G), and a subpixel 2212 provided with a color filter that transmits light in a blue (B) wavelength band (also referred to as a subpixel 2212B). The subpixel 2212 can function as a photosensor.

The subpixel 2212 (the subpixel 2212R, the subpixel 2212G, and the subpixel 2212B) is electrically connected to a wiring 2231, a wiring 2247, a wiring 2248, a wiring 2249, and a wiring 2250. In addition, the subpixel 2212R, the subpixel 2212G, and the subpixel 2212B are connected to respective wirings 2253 which are independently provided. In this specification and the like, for example, the wiring 2248 and the wiring 2249 that are connected to the pixel 2211 in the n-th row are referred to as a wiring 2248[n] and a wiring 2249[n]. For example, the wiring 2253 connected to the pixel 2211 in the m-th column is referred to as a wiring 2253[m]. Note that in FIG. 56A, the wirings 2253 connected to the subpixel 2212R, the subpixel 2212G, and the subpixel 2212B in the pixel 2211 in the m-th column are referred to as a wiring 2253[m]R, a wiring 2253[m]G, and a wiring 2253[m]B. The subpixels 2212 are electrically connected to the peripheral circuit through the above wirings.

Figure 56B:
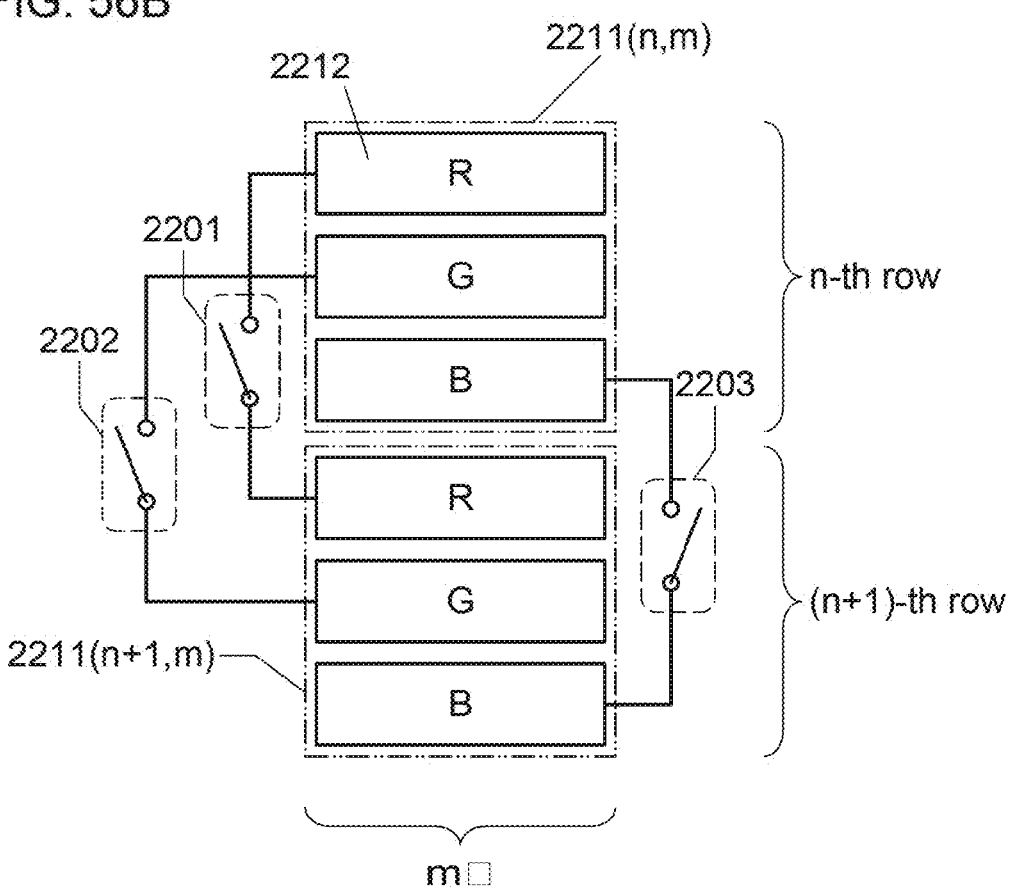

The imaging device 2200 has a structure in which the subpixel 2212 is electrically connected to the subpixel 2212 in an adjacent pixel 2211 which is provided with a color filter transmitting light in the same wavelength band as the subpixel 2212, via a switch. FIG. 56B illustrates a connection example of the subpixels 2212: the subpixel 2212 in the pixel 2211 arranged in the n-th (n is an integer greater than or equal to 1 and less than or equal to p) row and the m-th (m is an integer greater than or equal to 1 and less than or equal to q) column and the subpixel 2212 in the adjacent pixel 2211 arranged in an (n+1)-th row and the m-th column. In FIG. 56B, the subpixel 2212R arranged in the n-th row and the m-th column and the subpixel 2212R arranged in the (n+1)-th row and the m-th column are connected to each other via a switch 2201. The subpixel 2212G arranged in the n-th row and the m-th column and the subpixel 2212G arranged in the (n+1)-th row and the m-th column are connected to each other via a switch 2202. The subpixel 2212B arranged in the n-th row and the m-th column and the subpixel 2212B arranged in the (n+1)-th row and the m-th column are connected to each other via a switch 2203.

The color filter used in the subpixel 2212 is not limited to red (R), green (G), and blue (B) color filters, and color filters that transmit light of cyan (C), yellow (Y), and magenta (M) may be used. By provision of the subpixels 2212 that sense light in three different wavelength bands in one pixel 2211, a full-color image can be obtained.

The pixel 2211 including the subpixel 2212 provided with a color filter transmitting yellow (Y) light may be provided, in addition to the subpixels 2212 provided with the color filters transmitting red (R), green (G), and blue (B) light. The pixel 2211 including the subpixel 2212 provided with a color filter transmitting blue (B) light may be provided, in addition to the subpixels 2212 provided with the color filters transmitting cyan (C), yellow (Y), and magenta (M) light. When the subpixels 2212 sensing light in four different wavelength bands are provided in one pixel 2211, the reproducibility of colors of an obtained image can be increased.

For example, in FIG. 56A, in regard to the subpixel 2212 sensing light in a red wavelength band, the subpixel 2212 sensing light in a green wavelength band, and the subpixel 2212 sensing light in a blue wavelength band, the pixel number ratio (or the light receiving area ratio) thereof is not necessarily 1:1:1. For example, the Bayer arrangement in which the pixel number ratio (the light receiving area ratio) of red to green and blue is 1:2:1 may be employed. Alternatively, the pixel number ratio (the light receiving area ratio) of red and green to blue may be 1:6:1.

Although the number of subpixels 2212 provided in the pixel 2211 may be one, two or more subpixels are preferably provided. For example, when two or more subpixels 2212 sensing light in the same wavelength band are provided, the redundancy is increased, and the reliability of the imaging device 2200 can be increased.

When an infrared (IR) filter that transmits infrared light and absorbs or reflects visible light is used as the filter, the imaging device 2200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 2211 may be provided with a lens. An arrangement example of the pixel 2211, a filter 2254, and a lens 2255 is described with cross-sectional views in FIGS. 57A and 57B. With the lens 2255, the photoelectric conversion element can receive incident light efficiently. Specifically, as illustrated in FIG. 57A, light 2256 enters a photoelectric conversion element 2220 through the lens 2255, the filter 2254 (a filter 2254R, a filter 2254G, and a filter 2254B), a pixel circuit 2230, and the like which are provided in the pixel 2211.

As indicated by a region surrounded with dashed dotted lines, however, part of the light 2256 indicated by arrows might be blocked by some wirings 2257. Thus, a preferable structure is such that the lens 2255 and the filter 2254 are provided on the photoelectric conversion element 2220 side as illustrated in FIG. 57B, whereby the photoelectric conversion element 2220 can efficiently receive the light 2256. When the light 2256 enters the photoelectric conversion element 2220 from the photoelectric conversion element 2220 side, the imaging device 2200 with high sensitivity can be provided.

Figure 57A:
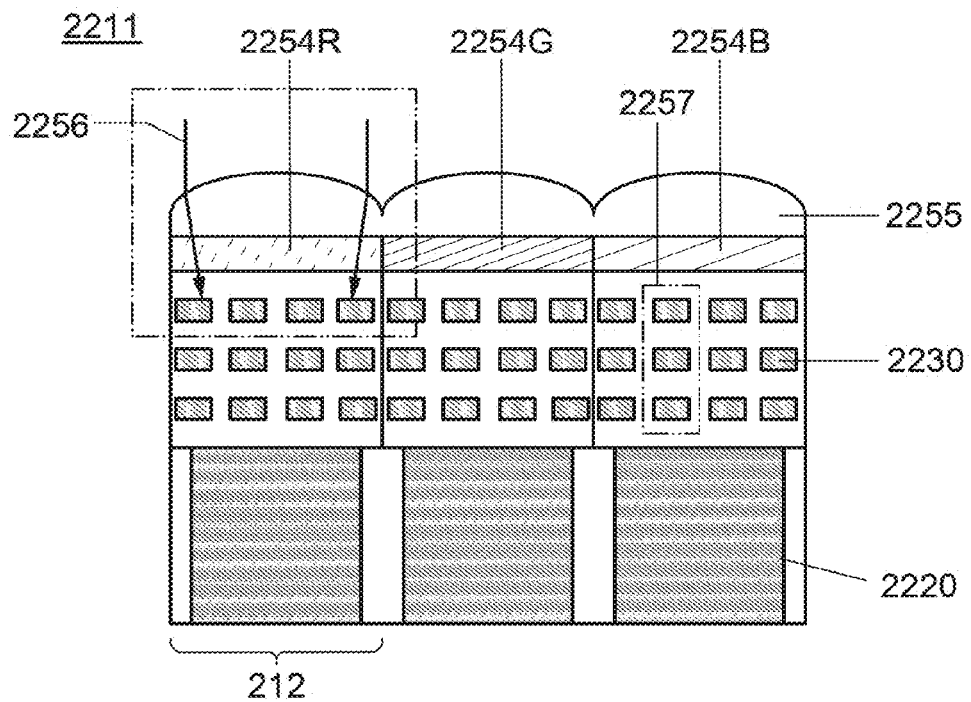
FIGS. 57A and 57B are cross-sectional views each illustrating a semiconductor device of one embodiment of the present invention.
Figure 57B:
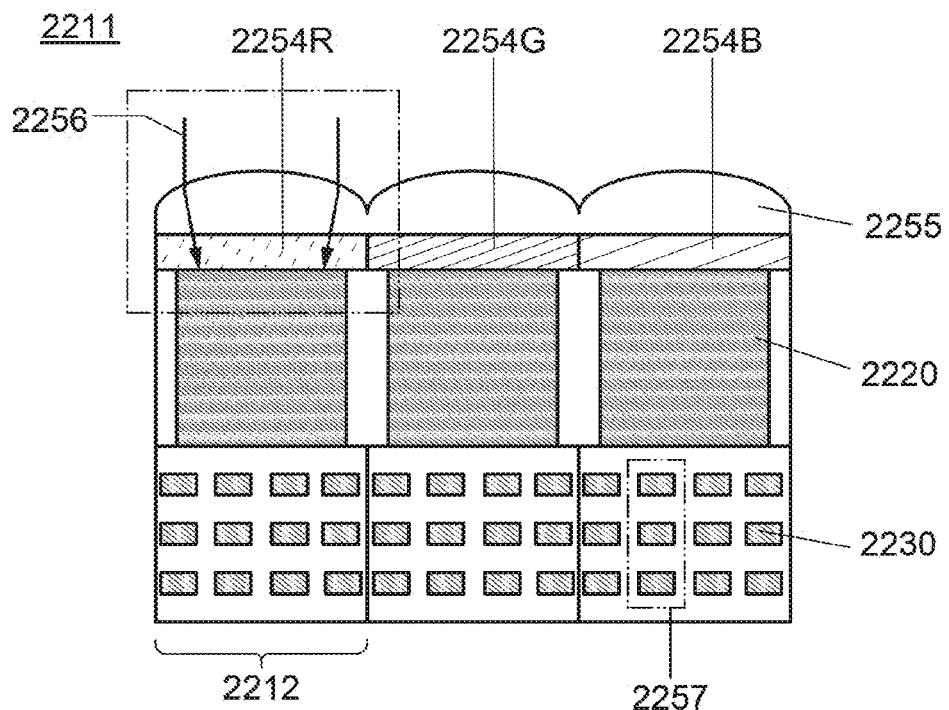

As the photoelectric conversion element 2220 illustrated in FIGS. 57A and 57B, a photoelectric conversion element in which a p-n junction or a p-i-n junction is formed may be used.

The photoelectric conversion element 2220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and a cadmium zinc alloy.

For example, when selenium is used for the photoelectric conversion element 2220, the photoelectric conversion element 2220 can have a light absorption coefficient in a wide wavelength band, such as visible light, ultraviolet light, infrared light, X-rays, and gamma rays.

One pixel 2211 included in the imaging device 2200 may include the subpixel 2212 with a first filter in addition to the subpixel 2212 illustrated in FIGS. 56A and 56B.

Configuration Example 2 of Pixel

An example of a pixel including a transistor including silicon and a transistor including an oxide semiconductor is described below. A transistor similar to any of the transistors described in the above embodiment can be used as each of the transistors.

Figure 58:
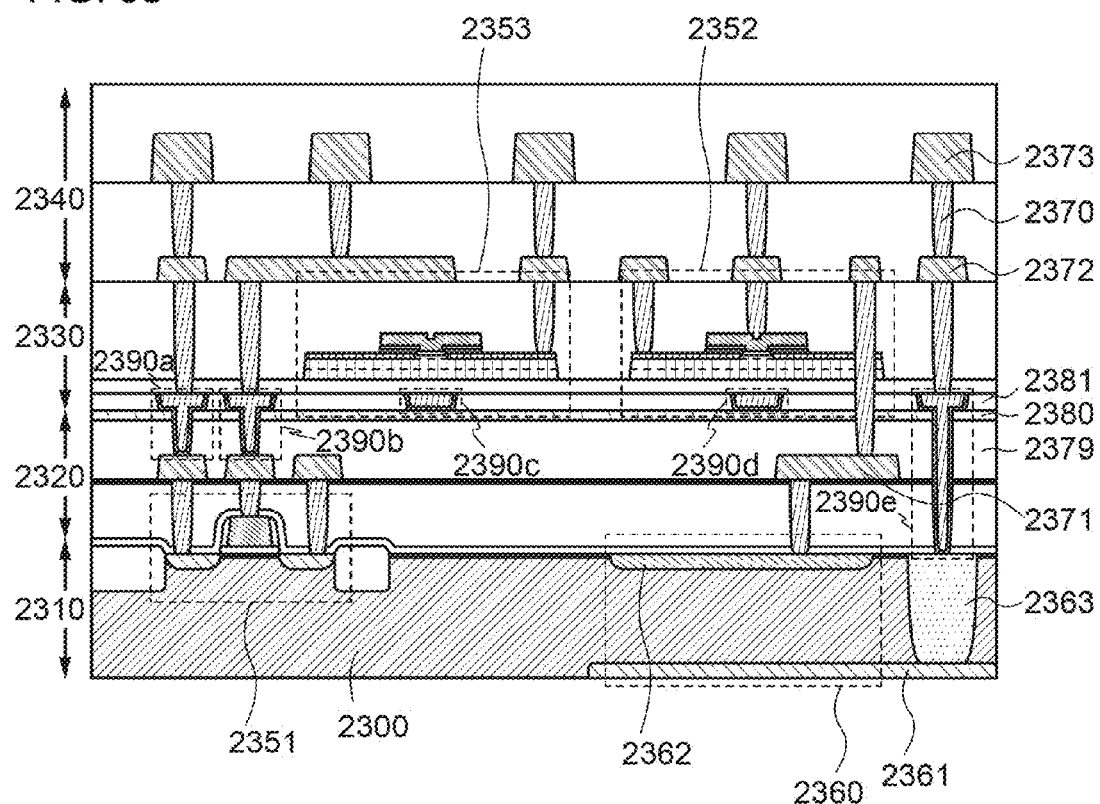
FIG. 58 is a cross-sectional view illustrating a semiconductor device of one embodiment of the present invention.

FIG. 58 is a cross-sectional view of an element included in an imaging device. The imaging device illustrated in FIG. 58 includes a transistor 2351 including silicon over a silicon substrate 2300, a transistor 2352 and a transistor 2353 which include an oxide semiconductor and are stacked over the transistor 2351, and a photodiode 2360 provided in the silicon substrate 2300. The transistors and the photodiode 2360 are electrically connected to various plugs 2370 and wirings 2371. In addition, an anode 2361 of the photodiode 2360 is electrically connected to the plug 2370 through a low-resistance region 2363.

The imaging device includes a layer 2310 including the transistor 2351 provided on the silicon substrate 2300 and the photodiode 2360 provided in the silicon substrate 2300, a layer 2320 which is in contact with the layer 2310 and includes the wirings 2371, a layer 2330 which is in contact with the layer 2320 and includes the transistor 2352 and the transistor 2353, and a layer 2340 which is in contact with the layer 2330 and includes wirings 2372 and wirings 2373.

In the example of the cross-sectional view in FIG. 58, a light-receiving surface of the photodiode 2360 is provided on the side opposite to a surface of the silicon substrate 2300 where the transistor 2351 is formed. With this structure, a light path can be secured without an influence of the transistors and the wirings. Thus, a pixel with a high aperture ratio can be formed. Note that the light-receiving surface of the photodiode 2360 can be the same as the surface where the transistor 2351 is formed.

In the case where a pixel is formed with use of only transistors including an oxide semiconductor, the layer 2310 may include the transistor including an oxide semiconductor. Alternatively, the layer 2310 may be omitted, and the pixel may include only transistors including an oxide semiconductor.

Note that the silicon substrate 2300 may be an SOI substrate. Furthermore, the silicon substrate 2300 can be replaced with a substrate made of germanium, silicon germanium, silicon carbide, gallium arsenide, aluminum gallium arsenide, indium phosphide, gallium nitride, or an organic semiconductor.

Here, an insulator 2380 is provided between the layer 2310 including the transistor 2351 and the photodiode 2360 and the layer 2330 including the transistor 2352 and the transistor 2353. However, there is no limitation on the position of the insulator 2380. An insulator 2379 is provided under the insulator 2380, and an insulator 2381 is provided over the insulator 2380.

A conductor 2390a, a conductor 2390b, a conductor 2390c, a conductor 2390d, and a conductor 2390e are provided in openings formed in the insulators 2379 to 2381. The conductor 2390a, the conductor 2390b, and the conductor 2390e function as plugs and wirings. The conductor 390c functions as a back gate of the transistor 2353. The conductor 2390d functions as a back gate of the transistor 2352.

Hydrogen in an insulator provided in the vicinity of a channel formation region of the transistor 2351 terminates dangling bonds of silicon; accordingly, the reliability of the transistor 2351 can be improved. In contrast, hydrogen in the insulator provided in the vicinity of the transistor 2352, the transistor 2353, and the like becomes one of factors generating a carrier in the oxide semiconductor. Thus, the hydrogen may cause a reduction of the reliability of the transistor 2352, the transistor 2353, and the like. For this reason, in the case where the transistor including an oxide semiconductor is provided over the transistor including a silicon-based semiconductor, it is preferable that the insulator 2380 having a function of blocking hydrogen be provided between the transistors. When the hydrogen is confined in layers below the insulator 2380, the reliability of the transistor 2351 can be improved. In addition, the hydrogen can be prevented from diffusing from the layers below the insulator 2380 to layers above the insulator 2380; thus, the reliability of the transistor 2352, the transistor 2353, and the like can be increased. The conductor 2390a, the conductor 2390b, and the conductor 2390e can prevent hydrogen from diffusing to the layers provided thereover through the via holes formed in the insulator 2380, resulting in improvement in the reliability of the transistor 2352, the transistor 2353, and the like.

In the cross-sectional view in FIG. 58, the photodiode 2360 in the layer 2310 and the transistor in the layer 2330 can be formed so as to overlap with each other. Thus, the degree of integration of pixels can be increased. In other words, the resolution of the imaging device can be increased.

Part or the whole of the imaging device may be bent. The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction in size or weight of electronic devices using the imaging device, and the like, can be achieved. In addition, the quality of a captured image can be improved.

The structure described in this embodiment can be used in appropriate combination with the structure described in any of the other embodiments.

Embodiment 10

In this embodiment, a semiconductor wafer, a chip, and an electronic component of one embodiment of the present invention will be described.

<Semiconductor Wafer and Chip>

Figure 59A:
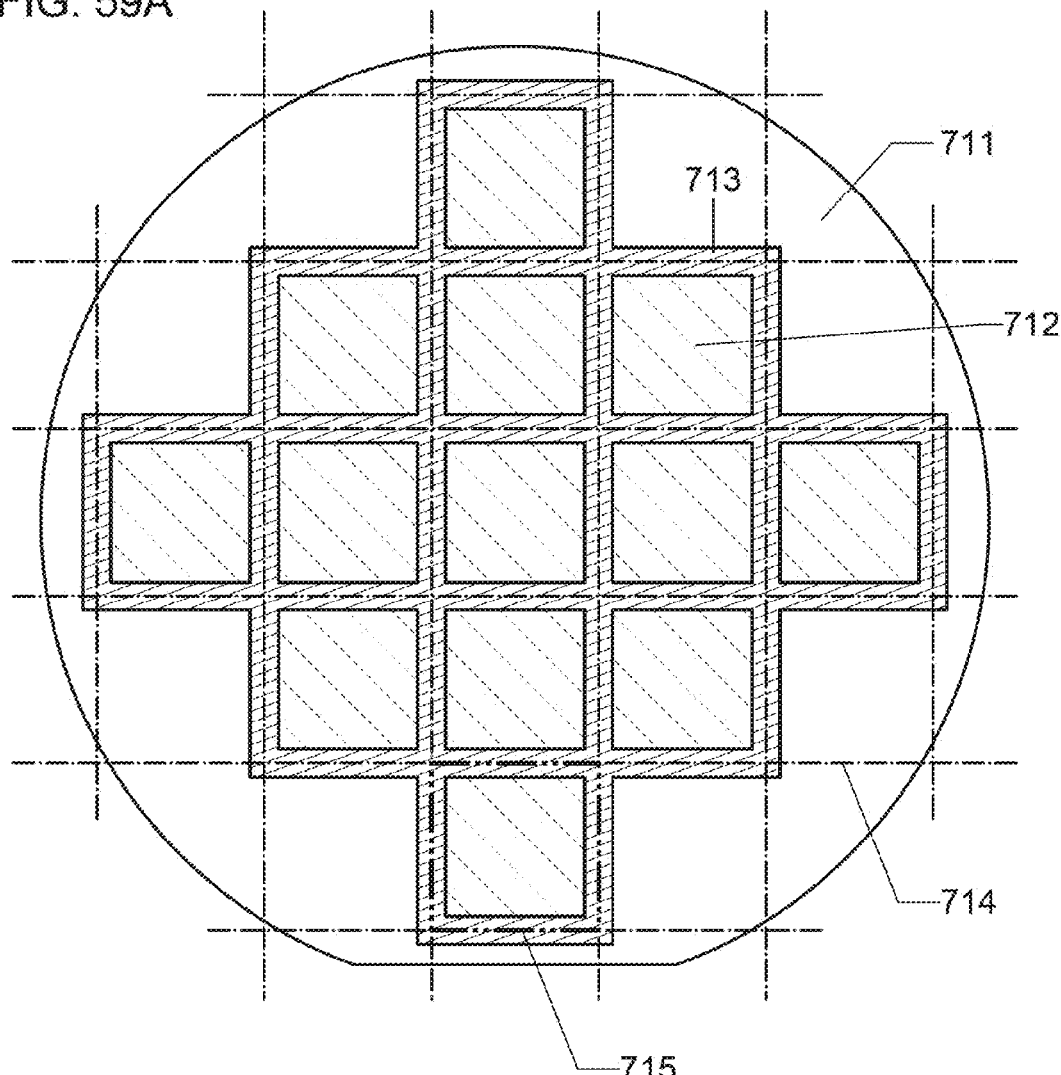
FIGS. 59A and 59B are top views illustrating a semiconductor device of one embodiment of the present invention.

FIG. 59A is a top view illustrating a substrate 711 before dicing treatment. As the substrate 711, a semiconductor substrate (also referred to as a "also referred to as a can be used, for example. A plurality of circuit regions 712 are provided over the substrate 711. A semiconductor device, a CPU, an RF tag, an image sensor, or the like of one embodiment of the present invention can be provided in the circuit region 712.

Figure 59B:
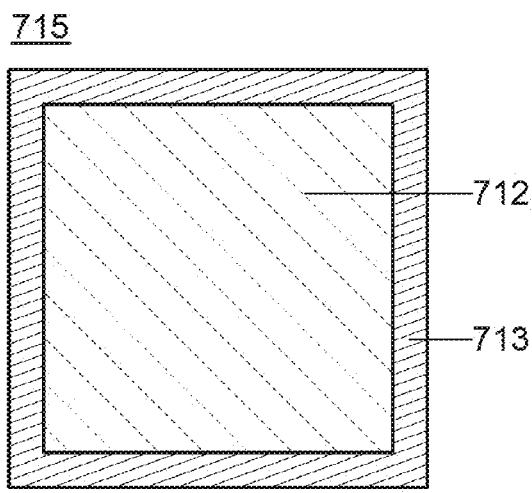

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 59B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing semiconductor devices can be reduced. Thus, semiconductor devices can be manufactured with improved productivity.

For a semiconductor layer provided in the separation regions 713, a material having a band gap greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

<Electronic Component>

Figure 60A:
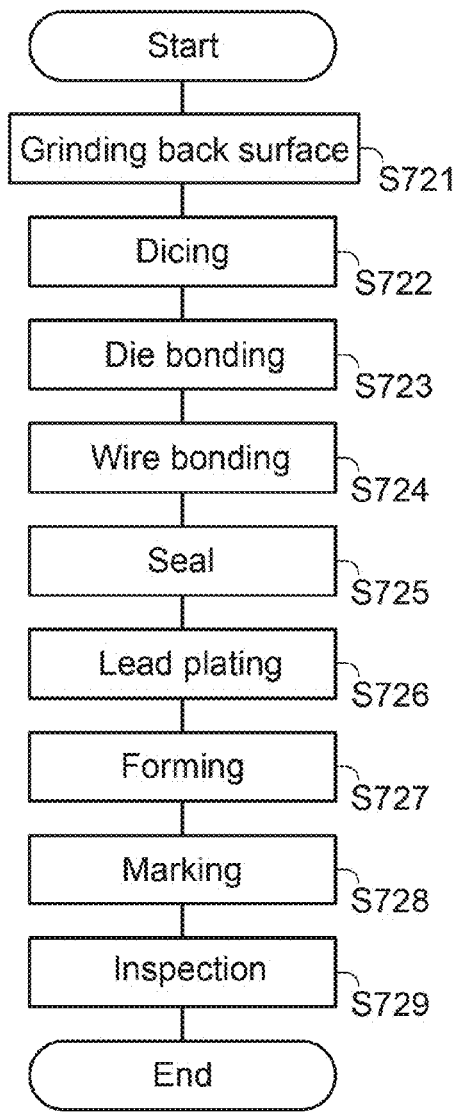
FIGS. 60A and 60B are a flowchart and a perspective view of a semiconductor device illustrating one embodiment of the present invention.
Figure 60B:
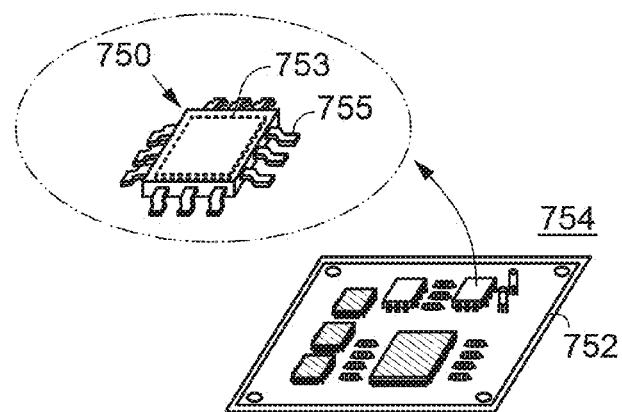

FIGS. 60A and 60B illustrate an example where the chip 715 is used to make an electronic component. Note that the electronic component is also referred to as a semiconductor package or an IC package. This electronic component has a plurality of standards and names depending on a terminal extraction direction and a terminal shape.

The electronic component is completed when the semiconductor device described in any of the above embodiments is combined with components other than the semiconductor device in an assembly process (post-process).

The post-process will be described with reference to a flow chart in FIG. 60A. After an element substrate including the semiconductor device described in any of the above embodiments is completed in a pre-process, a back surface grinding step in which a back surface (a surface where a semiconductor device and the like are not formed) of the element substrate is ground is performed (Step S721). When the element substrate is thinned by grinding, warpage or the like of the element substrate is reduced, so that the size of the electronic component can be reduced.

Next, the element substrate is divided into a plurality of chips (chips 715) in a dicing step (Step S722). Then, the separated chips are individually picked up to be bonded to a lead frame in a die bonding step (Step S723). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S724). As the metal wire, a silver wire or a gold wire can be used. Ball bonding or wedge bonding can be used as the wire bonding.

The wire-bonded chip is subjected to a molding step of sealing the chip with an epoxy resin or the like (Step S725). Through the molding step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed circuit board in a later step. Then, the lead is cut and processed in a formation step (Step S727).

Next, a printing (marking) step is performed on a surface of the package (Step S728). After a testing step (Step S729) for checking whether an external shape is good and whether there is a malfunction, for example, the electronic component is completed (Step S729).

FIG. 60B is a perspective schematic diagram of a completed electronic component. FIG. 60B is a perspective schematic diagram illustrating a quad flat package (QFP) as an example of the electronic component. An electronic component 750 in FIG. 60B includes a lead 755 and a semiconductor device 753. As the semiconductor device 753, the semiconductor device described in any of the above embodiments can be used.

The electronic component 750 in FIG. 60B is mounted on a printed circuit board 752, for example. A plurality of electronic components 750 that are combined and electrically connected to each other over the printed circuit board 752; thus, a substrate on which the electronic components are mounted (a circuit board 754) is completed. The completed circuit board 754 is provided in an electronic device or the like.

The structure described in this embodiment can be used in appropriate combination with the structure described in any of the other embodiments.

Embodiment 11

In this embodiment, electronic devices including the transistor or the like of one embodiment of the present invention will be described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 61A to 61F illustrate specific examples of these electronic devices.

Figure 61A:
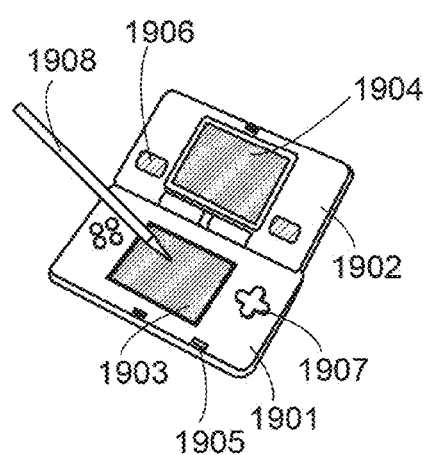
FIGS. 61A to 61F are perspective views each illustrating an electronic device of one embodiment of the present invention.

FIG. 61A illustrates a portable game console including a housing 1901, a housing 1902, a display portion 1903, a display portion 1904, a microphone 1905, a speaker 1906, an operation key 1907, a stylus 1908, and the like. Although the portable game console in FIG. 61A has the two display portions 1903 and 1904, the number of display portions included in the portable game console is not limited to this.

Figure 61B:
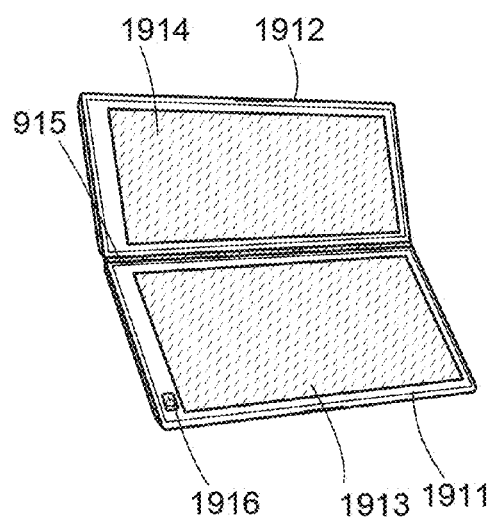

FIG. 61B illustrates a portable data terminal including a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. An image on the first display portion 1913 may be switched in accordance with the angle at the joint 1915 between the first housing 1911 and the second housing 1912. A display device with a position input function may be used as at least one of the first display portion 1913 and the second display portion 1914. Note that the position input function can be added by providing a touch panel in a display device. Alternatively, the position input function can be added by providing a photoelectric conversion element called a photosensor in a pixel portion of a display device.

Figure 61C:
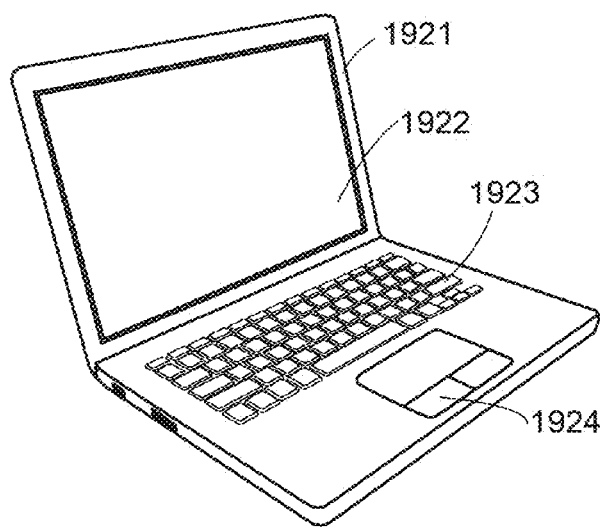

FIG. 61C illustrates a notebook personal computer including a housing 1921, a display portion 1922, a keyboard 1923, a pointing device 1924, and the like.

Figure 61D:
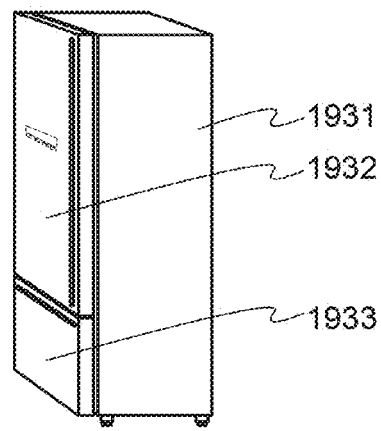

FIG. 61D illustrates an electric refrigerator-freezer including a housing 1931, a door for a refrigerator 1932, a door for a freezer 1933, and the like.

Figure 61E:
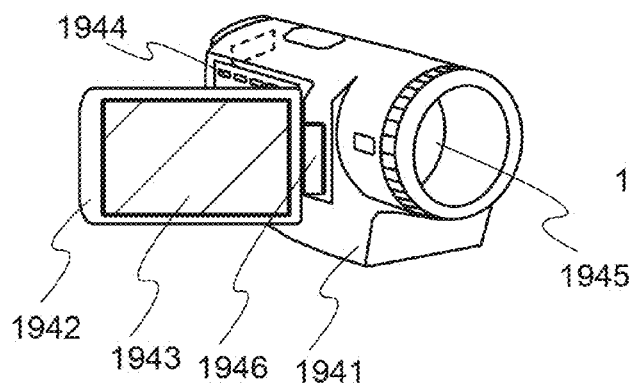

FIG. 61E illustrates a video camera including a first housing 1941, a second housing 1942, a display portion 1943, operation keys 1944, a lens 1945, a joint 1946, and the like. The operation keys 1944 and the lens 1945 are provided for the first housing 1941, and the display portion 1943 is provided for the second housing 1942. The first housing 1941 and the second housing 1942 are connected to each other with the joint 1946, and the angle between the first housing 1941 and the second housing 1942 can be changed with the joint 1946. An image on the display portion 1943 may be switched in accordance with the angle at the joint 1946 between the first housing 1941 and the second housing 1942.

Figure 61F:
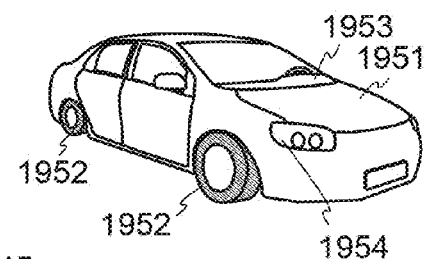

FIG. 61F illustrates a car including a car body 1951, wheels 1952, a dashboard 1953, lights 1954, and the like.

In this embodiment, embodiments of the present invention have been described. However, embodiments of the present invention are not limited to the above-described embodiments. That is, various embodiments of the invention are described in this embodiment and the like, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited to this example. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

The structure described in this embodiment can be used in appropriate combination with the structure described in any of the other embodiments.

This application is based on Japanese Patent Application serial No. 2016-005965 filed with Japan Patent Office on Jan. 15, 2016, the entire contents of which are hereby incorporated by reference.

What is claimed is:

1. A semiconductor device comprising:
a first transistor;
a first insulator over the first transistor;
a second transistor over the first insulator;
a second insulator over the second transistor; and
a capacitor over the second insulator,
wherein the first insulator has a barrier property against oxygen and hydrogen,
wherein the second transistor comprises an oxide semiconductor,
wherein the second insulator comprises an oxygen-excess region,
wherein the capacitor comprises a first electrode, a second electrode, and a dielectric between the first electrode and the second electrode,
wherein the dielectric comprises a third insulator having a barrier property against oxygen and hydrogen, and
wherein the first insulator and the third insulator are in contact with each other in an edge of a region where the second transistor is located so that the second transistor and the second insulator are enclosed by the first insulator and the third insulator.

2. The semiconductor device according to claim 1, wherein the first insulator and the third insulator are each aluminum oxide.

3. A semiconductor wafer comprising a plurality of semiconductor devices according to claim 1 and a region for dicing.

4. A method for manufacturing a semiconductor device comprising the steps of:
forming a first transistor over a substrate;
forming a first insulator having a barrier property against oxygen and hydrogen over the first transistor;
forming a first conductor over the first insulator;
forming a second insulator over the first conductor;
forming a third insulator over the second insulator using a high-k material;
forming a fourth insulator over the third insulator;
forming a first oxide semiconductor over the fourth insulator;
forming a second conductor over the first oxide semiconductor;
processing the second conductor into an island shape;
processing the first oxide semiconductor into an island shape using the second conductor having the island-shape as a mask;
processing the second conductor having the island-shape to form a third conductor and a fourth conductor;
forming a second oxide semiconductor over the first oxide semiconductor, the third conductor, and the fourth conductor and then performing heat treatment;
forming a fifth insulator over the second oxide semiconductor;
forming a fifth conductor having an island shape over the fifth insulator to form a second transistor;
forming a sixth insulator over the second transistor;
forming an opening reaching the second transistor in the sixth insulator;
forming a sixth conductor over the opening and the sixth insulator;
forming a barrier layer having a barrier property against oxygen and hydrogen over the sixth conductor;
performing oxygen plasma treatment on the barrier layer and the sixth insulator and then forming a seventh insulator having a barrier property against oxygen and hydrogen over the barrier layer and the sixth insulator; and
forming a seventh conductor in a region overlapping with the sixth conductor through the seventh insulator to form a capacitor.

5. The method for manufacturing the semiconductor device according to claim 4, wherein the barrier layer is tantalum nitride formed by an ALD method.

6. The method for manufacturing the semiconductor device according to claim 4, wherein the barrier layer is aluminum oxide formed by an ALD method.

7. The method for manufacturing the semiconductor device according to claim 4, wherein the seventh conductor is aluminum oxide formed by a sputtering method.

* * * * *